US011228158B2

(12) United States Patent
McLaurin et al.

(10) Patent No.: US 11,228,158 B2
(45) Date of Patent: Jan. 18, 2022

(54) MANUFACTURABLE LASER DIODES ON A LARGE AREA GALLIUM AND NITROGEN CONTAINING SUBSTRATE

(71) Applicant: KYOCERA SLD Laser, Inc., Goleta, CA (US)

(72) Inventors: Melvin McLaurin, Santa Barbara, CA (US); James W. Raring, Santa Barbara, CA (US)

(73) Assignee: KYOCERA SLD Laser, Inc., Goleta, CA (US)

( * ) Notice: Subject to any disclaimer, the term of this patent is extended or adjusted under 35 U.S.C. 154(b) by 100 days.

(21) Appl. No.: 16/411,955

(22) Filed: May 14, 2019

(65) Prior Publication Data

US 2020/0366050 A1    Nov. 19, 2020

(51) Int. Cl.
*H01S 5/02*         (2006.01)
*H01S 5/343*        (2006.01)

(52) U.S. Cl.
CPC .......... *H01S 5/0217* (2013.01); *H01S 5/0203* (2013.01); *H01S 5/34333* (2013.01); *H01S 2304/12* (2013.01)

(58) Field of Classification Search
CPC .. H01S 5/34333; H01S 5/0216; H01S 5/0203; H01S 5/0217; H01S 5/02345; H01S 5/04257; H01S 5/2201; H01S 5/2009; H01S 2304/12; H01S 2301/173; H01S 5/320275; H01S 5/0202; H01L 33/007; H01L 33/0075
See application file for complete search history.

(56) References Cited

U.S. PATENT DOCUMENTS

| 4,341,592 A | 7/1982 | Shortes et al. |
| 4,860,687 A | 8/1989 | Frijlink |
| 4,911,102 A | 3/1990 | Manabe et al. |

(Continued)

FOREIGN PATENT DOCUMENTS

| JP | 2007-173467 A | 7/2007 |
| JP | 2007-068398 | 4/2008 |
| WO | 2008-041521 A1 | 4/2008 |

OTHER PUBLICATIONS

Abare et al., Cleaved and Etched Facet Nitride Laser Diodes, IEEE Journal of Selected Topics in Quantum Electronics, vol. 4, No. 3, May-Jun. 1998, pp. 505-509.

(Continued)

*Primary Examiner* — Thanh T Nguyen
(74) *Attorney, Agent, or Firm* — Kilpatrick Townsend & Stockton LLP

(57) ABSTRACT

The present disclosure provides a method and structure for producing large area gallium and nitrogen engineered substrate members configured for the epitaxial growth of layer structures suitable for the fabrication of high performance semiconductor devices. In a specific embodiment the engineered substrates are used to manufacture gallium and nitrogen containing devices based on an epitaxial transfer process wherein as-grown epitaxial layers are transferred from the engineered substrate to a carrier wafer for processing. In a preferred embodiment, the gallium and nitrogen containing devices are laser diode devices operating in the 390 nm to 425 nm range, the 425 nm to 485 nm range, the 485 nm to 550 nm range, or greater than 550 nm.

23 Claims, 22 Drawing Sheets

Epitaxy preparation process flows for epi transfer to carrier

(56) References Cited

U.S. PATENT DOCUMENTS

| | | |
|---|---|---|
| 5,331,654 A | 7/1994 | Jewell et al. |
| 5,334,277 A | 8/1994 | Nakamura |
| 5,366,953 A | 11/1994 | Char et al. |
| 5,527,417 A | 6/1996 | Lida et al. |
| 5,607,899 A | 3/1997 | Yoshida et al. |
| 5,632,812 A | 5/1997 | Hirabayashi |
| 5,696,389 A | 12/1997 | Ishikawa et al. |
| 5,821,555 A | 10/1998 | Saito et al. |
| 5,888,907 A | 3/1999 | Tomoyasu et al. |
| 5,926,493 A | 7/1999 | O'Brien et al. |
| 5,951,923 A | 9/1999 | Rorie et al. |
| 5,985,687 A | 11/1999 | Bowers et al. |
| 6,069,394 A | 5/2000 | Hashimoto et al. |
| 6,147,953 A | 11/2000 | Duncan |
| 6,153,010 A | 11/2000 | Kiyoku et al. |
| 6,239,454 B1 | 5/2001 | Glew et al. |
| 6,379,985 B1 | 4/2002 | Cervantes et al. |
| 6,451,157 B1 | 9/2002 | Hubacek |
| 6,489,636 B1 | 12/2002 | Goetz et al. |
| 6,586,762 B2 | 7/2003 | Kozaki |
| 6,635,904 B2 | 10/2003 | Goetz et al. |
| 6,680,959 B2 | 1/2004 | Tanabe et al. |
| 6,734,461 B1 | 5/2004 | Shiomi et al. |
| 6,755,932 B2 | 6/2004 | Masuda et al. |
| 6,809,781 B2 | 10/2004 | Setlur et al. |
| 6,814,811 B2 | 11/2004 | Ose |
| 6,833,564 B2 | 12/2004 | Shen et al. |
| 6,858,081 B2 | 2/2005 | Biwa et al. |
| 6,920,166 B2 | 7/2005 | Akasaka et al. |
| 7,009,199 B2 | 3/2006 | Hall |
| 7,033,858 B2 | 4/2006 | Chai et al. |
| 7,053,413 B2 | 5/2006 | D'Evelyn et al. |
| 7,063,741 B2 | 6/2006 | D'Evelyn |
| 7,128,849 B2 | 10/2006 | Setlur et al. |
| 7,220,324 B2 | 5/2007 | Baker et al. |
| 7,303,630 B2 | 12/2007 | Motoki et al. |
| 7,312,156 B2 | 12/2007 | Granneman et al. |
| 7,323,723 B2 | 1/2008 | Ohtsuka et al. |
| 7,338,828 B2 | 3/2008 | Imer et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,470,555 B2 | 12/2008 | Matsumura |
| 7,483,466 B2 | 1/2009 | Uchida et al. |
| 7,489,441 B2 | 2/2009 | Scheible et al. |
| 7,555,025 B2 | 6/2009 | Yoshida |
| 7,691,658 B2 | 4/2010 | Kaeding et al. |
| 7,727,332 B2 | 6/2010 | Habel et al. |
| 7,733,571 B1 | 6/2010 | Li |
| 7,749,326 B2 | 7/2010 | Kim et al. |
| 7,806,078 B2 | 10/2010 | Yoshida |
| 7,858,408 B2 | 12/2010 | Mueller et al. |
| 7,862,761 B2 | 1/2011 | Okushima et al. |
| 7,923,741 B1 | 4/2011 | Zhai et al. |
| 7,939,354 B2 | 5/2011 | Kyono et al. |
| 7,968,864 B2 | 6/2011 | Akita et al. |
| 8,017,932 B2 | 10/2011 | Okamoto et al. |
| 8,044,412 B2 | 10/2011 | Murphy et al. |
| 8,124,996 B2 | 2/2012 | Raring et al. |
| 8,126,024 B1 | 2/2012 | Raring et al. |
| 8,143,148 B1 | 3/2012 | Raring et al. |
| 8,242,522 B1 | 8/2012 | Raring et al. |
| 8,247,887 B1 | 8/2012 | Raring et al. |
| 8,252,662 B1 | 8/2012 | Poblenz et al. |
| 8,254,425 B1 | 8/2012 | Raring et al. |
| 8,259,769 B1 | 9/2012 | Raring et al. |
| 8,294,179 B1 | 10/2012 | Raring et al. |
| 8,314,429 B1 | 11/2012 | Raring et al. |
| 8,351,478 B2 | 1/2013 | Raring et al. |
| 8,355,418 B2 | 1/2013 | Raring et al. |
| 8,422,525 B1 | 4/2013 | Raring et al. |
| 8,593,980 B2 | 11/2013 | Bae et al. |
| 8,634,442 B1 | 1/2014 | Raring et al. |
| 8,847,249 B2 | 9/2014 | Raring |
| 9,246,311 B1 | 1/2016 | Raring et al. |
| 9,362,715 B2 | 6/2016 | Sztein et al. |
| 9,368,939 B2 | 6/2016 | McLaurin et al. |
| 9,379,525 B2 | 6/2016 | McLaurin et al. |
| 9,520,695 B2 | 12/2016 | Hsu et al. |
| 9,520,697 B2 | 12/2016 | Steigerwald et al. |
| 9,531,164 B2 | 12/2016 | Raring |
| 9,543,738 B2 | 1/2017 | Raring et al. |
| 9,653,642 B1 | 5/2017 | Raring et al. |
| 9,666,677 B1 | 5/2017 | Raring et al. |
| 9,711,949 B1 | 7/2017 | Raring et al. |
| 9,755,398 B2 | 9/2017 | Sztein et al. |
| 9,774,170 B2 | 9/2017 | McLaurin et al. |
| 9,871,350 B2 | 1/2018 | McLaurin et al. |
| 9,882,353 B2 | 1/2018 | Hsu et al. |
| 10,002,928 B1 | 6/2018 | Raring et al. |
| 10,141,714 B2 | 11/2018 | Sztein et al. |
| 10,193,309 B1 | 1/2019 | Raring et al. |
| 10,367,334 B2 | 7/2019 | McLaurin et al. |
| 2002/0050488 A1 | 5/2002 | Nikitin et al. |
| 2002/0085603 A1 | 7/2002 | Okumura |
| 2002/0171092 A1 | 11/2002 | Goetz et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0140846 A1 | 7/2003 | Biwa et al. |
| 2003/0216011 A1 | 11/2003 | Nakamura et al. |
| 2004/0025787 A1 | 2/2004 | Selbrede et al. |
| 2004/0060518 A1 | 4/2004 | Nakamura et al. |
| 2004/0104391 A1 | 6/2004 | Maeda et al. |
| 2004/0112866 A1 | 6/2004 | Maleville et al. |
| 2004/0151222 A1 | 8/2004 | Sekine |
| 2004/0196877 A1 | 10/2004 | Kawakami et al. |
| 2004/0222357 A1 | 11/2004 | King et al. |
| 2004/0247275 A1 | 12/2004 | Vakhshoori et al. |
| 2004/0259331 A1 | 12/2004 | Ogihara et al. |
| 2004/0262624 A1 | 12/2004 | Akita et al. |
| 2005/0040384 A1 | 2/2005 | Tanaka et al. |
| 2005/0072986 A1 | 4/2005 | Sasaoka |
| 2005/0158896 A1 | 7/2005 | Hayashi et al. |
| 2005/0168564 A1 | 8/2005 | Kawaguchi et al. |
| 2005/0199893 A1 | 9/2005 | Lan et al. |
| 2005/0224826 A1 | 10/2005 | Keuper et al. |
| 2005/0229855 A1 | 10/2005 | Raaijmakers |
| 2005/0285128 A1 | 12/2005 | Scherer et al. |
| 2006/0030738 A1 | 2/2006 | Vanmaele et al. |
| 2006/0037529 A1 | 2/2006 | D'Evelyn |
| 2006/0038193 A1 | 2/2006 | Wu et al. |
| 2006/0060131 A1 | 3/2006 | Atanackovic |
| 2006/0066319 A1 | 3/2006 | Dallenbach et al. |
| 2006/0078022 A1 | 4/2006 | Kozaki et al. |
| 2006/0079082 A1 | 4/2006 | Bruhns et al. |
| 2006/0086319 A1 | 4/2006 | Kasai et al. |
| 2006/0110926 A1 | 5/2006 | Hu et al. |
| 2006/0118799 A1 | 6/2006 | D'Evelyn et al. |
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0216416 A1 | 9/2006 | Sumakeris et al. |
| 2006/0256482 A1 | 11/2006 | Araki et al. |
| 2006/0288928 A1 | 12/2006 | Eom et al. |
| 2007/0081857 A1 | 4/2007 | Yoon |
| 2007/0086916 A1 | 4/2007 | LeBoeuf et al. |
| 2007/0093073 A1 | 4/2007 | Farrell et al. |
| 2007/0109463 A1 | 5/2007 | Hutchins |
| 2007/0110112 A1 | 5/2007 | Sugiura |
| 2007/0120141 A1 | 5/2007 | Moustakas et al. |
| 2007/0163490 A1 | 7/2007 | Habel et al. |
| 2007/0166853 A1 | 7/2007 | Guenthe et al. |
| 2007/0217462 A1 | 9/2007 | Yamasaki |
| 2007/0242716 A1 | 10/2007 | Samal et al. |
| 2007/0252164 A1 | 11/2007 | Zhong et al. |
| 2007/0280320 A1 | 12/2007 | Feezell et al. |
| 2008/0087919 A1 | 4/2008 | Tysoe et al. |
| 2008/0092812 A1 | 4/2008 | McDiarmid et al. |
| 2008/0095492 A1 | 4/2008 | Son et al. |

(56) References Cited

U.S. PATENT DOCUMENTS

| | | |
|---|---|---|
| 2008/0121916 A1 | 5/2008 | Teng et al. |
| 2008/0124817 A1 | 5/2008 | Bour et al. |
| 2008/0138919 A1 | 6/2008 | Mueller et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191192 A1 | 8/2008 | Feezle et al. |
| 2008/0191223 A1 | 8/2008 | Nakamura et al. |
| 2008/0198881 A1 | 8/2008 | Farrell et al. |
| 2008/0210958 A1 | 9/2008 | Senda et al. |
| 2008/0217745 A1 | 9/2008 | Miyanaga et al. |
| 2008/0219309 A1* | 9/2008 | Hata .............. H01S 5/0201 372/44.01 |
| 2008/0232416 A1 | 9/2008 | Okamoto et al. |
| 2008/0285609 A1 | 11/2008 | Ohta et al. |
| 2008/0291961 A1 | 11/2008 | Kamikawa et al. |
| 2008/0303033 A1 | 12/2008 | Brandes |
| 2008/0308815 A1 | 12/2008 | Kasai et al. |
| 2008/0315179 A1 | 12/2008 | Kim et al. |
| 2009/0058532 A1 | 3/2009 | Kikkawa et al. |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0081867 A1 | 3/2009 | Taguchi et al. |
| 2009/0141765 A1 | 6/2009 | Kohda et al. |
| 2009/0159869 A1 | 6/2009 | Ponce et al. |
| 2009/0173957 A1 | 7/2009 | Brunner et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0320744 A1 | 12/2009 | D'Evelyn |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0006873 A1 | 1/2010 | Raring et al. |
| 2010/0025656 A1 | 2/2010 | Raring et al. |
| 2010/0031875 A1 | 2/2010 | D'Evelyn |
| 2010/0044718 A1 | 2/2010 | Hanser et al. |
| 2010/0096615 A1 | 4/2010 | Okamoto et al. |
| 2010/0104495 A1 | 4/2010 | Kawabata et al. |
| 2010/0140745 A1 | 6/2010 | Khan et al. |
| 2010/0151194 A1 | 6/2010 | D'Evelyn |
| 2010/0195687 A1 | 8/2010 | Okamoto et al. |
| 2010/0220262 A1 | 9/2010 | DeMille et al. |
| 2010/0295054 A1 | 11/2010 | Okamoto et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2011/0044022 A1 | 2/2011 | Ko et al. |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1* | 3/2011 | Raring .............. B82Y 20/00 372/44.011 |
| 2011/0075694 A1 | 3/2011 | Yoshizumi et al. |
| 2011/0103418 A1 | 5/2011 | Hardy et al. |
| 2011/0133489 A1 | 6/2011 | Philippe et al. |
| 2011/0164637 A1 | 7/2011 | Yoshizumi et al. |
| 2011/0164646 A1 | 7/2011 | Maeda et al. |
| 2011/0180781 A1 | 7/2011 | Raring et al. |
| 2011/0186874 A1 | 8/2011 | Shum |
| 2011/0186887 A1 | 8/2011 | Trottier et al. |
| 2011/0216795 A1 | 9/2011 | Hsu et al. |
| 2011/0247556 A1 | 10/2011 | Raring et al. |
| 2012/0178198 A1 | 7/2012 | Raring et al. |
| 2012/0314398 A1 | 12/2012 | Raring et al. |
| 2013/0214284 A1 | 8/2013 | Holder et al. |
| 2013/0234111 A1 | 9/2013 | Pfister et al. |
| 2015/0140710 A1 | 5/2015 | McLaurin et al. |
| 2015/0229100 A1 | 8/2015 | Sztein et al. |
| 2015/0229108 A1 | 8/2015 | Steigerwald et al. |
| 2017/0063047 A1 | 3/2017 | Steigerwald et al. |
| 2018/0138357 A1* | 5/2018 | Henley .............. H01L 33/0095 |
| 2018/0159302 A1 | 6/2018 | McLaurin et al. |

OTHER PUBLICATIONS

Amano, H. et al., "p-type conduction in Mg-doped GaN treated with low-energy electron beam irradiation (LEEBI)," Jpn. J. Appl. Phys. vol. 28, pp. L2112-L2114, 1989.

Aoki et al., InGaAs/InGaAsP MQW Electroabsorption Modulator Integrated with a DFB Laser Fabricated by Band-Gap Energy Control Selective Area MOCVD, IEEE Journal of Quantum Electronics, vol. 29, No. 6, Jun. 1993, pp. 2088-2096.

Asano et al., 100-mW Kink-Free Blue-Violet Laser Diodes with Low Aspect Ratio, IEEE Journal of Quantum Electronics, vol. 39, No. 1, Jan. 2003, pp. 135-140.

Bernardini et al., Spontaneous Polarization and Piezoelectric Constants of III-V Nitrides, Physical Review B, vol. 56, No. 16, Oct. 15, 1997, pp. 10024-10027.

Caneau et al., Studies on the Selective OMVPE of (Ga,In)/(As,P), Journal of Crystal Growth, vol. 124, Nov. 1, 1992, pp. 243-248.

Chen et al., Growth and Optical Properties of Highly Uniform and Periodic InGaN Nanostructures, Advanced Materials, vol. 19, 2007, pp. 1707-1710.

D'Evelyn et al., "Bulk GaN Crystal Growth by the High-Pressure Ammonothermal Method," Journal of Crystal Growth, 2007, vol. 300, pp. 11-16.

Fujii et al., "Increase in the Extraction Efficiency of GaN-based Light-Emitting Diodes via Surface Roughening," 2004, Applied Physics Letters, vol. 84, No. 6, pp. 855-857.

Funato et al., "Blue, Green, and Amber InGaN/GaN Light-Emitting Diodes on Semipolar (1122) GaN Substrates," 2006, Journal of Japanese Applied Physics, vol. 45, No. 26, pp. L659-L662.

Funato et al., "Monolithic Polychromatic Light-Emitting Diodes Based on InGaN Microfacet Quantum Wells toward Tailor-Made Solid-State Lighting," Applied Physics Express, vol. 1, No. 1, 2008, pp. 011106-1-011106-3.

Founta et al., 'Anisotropic Morphology of Nonpolar a-Plane GaN Quantum Dots and Quantum Wells,' Journal of Applied Physics, vol. 102, vol. 7, 2007, pp. 074304-1-074304-6.

Gallium nitride, retrieved from http://en.wikipedia.org/wiki/Gallium_nitride on Dec. 31, 2014, 6 pages.

Gardner et al., Blue-Emitting InGaN—GaN Double-Heterostructure Light-Emitting Diodes Reaching Maximum Quantum Efficiency Above 200A/cm2, Applied Physics Letters, vol. 91, 2007, pp. 243506-1-243506-3.

Hiramatsu et al., Selective Area Growth and Epitaxial Lateral Overgrowth of GaN by Metalorganic Vapor Phase Epitaxy and Hydride Vapor Phase Epitaxy, Materials Science and Engineering: B, vol. 59, Issue 1-3, May 6, 1999, pp. 104-111.

Hjort, K. "Sacrificial etching of III-V compounds for micromechanical devices," J. Micromech. Miroeng., 6 (1996), pp. 370-375.

Holder et al., "Demonstration of Nonpolar GaN-Based Vertical-Cavity Surface-Emitting Lasers," Appl. Phys. Express 5, 092104 (2012).

Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.

Kendall et al., "Energy Savings Potential of Solid State Lighting in General Lighting Applications," 2001, Report for the Department of Energy, pp. 1-35.

Kim et al, "Improved Electroluminescence on Nonpolar m-plane InGaN/GaN Qantum Well LEDs", 2007, Physica Status Solidi (RRL), vol. 1, No. 3, pp. 125-127.

Khan et al., Cleaved Cavity Optically Pumped InGaN—GaN Laser Grown on Spinel Substrates, Applied Physics Letters, vol. 69, No. 16, Oct. 14, 1996, pp. 2418-2420.

Kuramoto et al., "Novel Ridge-Type InGaN Multiple-Quantum-Well Laser Diodes Fabricated by Selective Area Re-Growth on

(56) References Cited

OTHER PUBLICATIONS n-GaN Substrates," 2001, Journal of Japanese Applied Physics, vol. 40, pp. 925-927.
Light-emitting diode, retrieved from http://en.wikipedia.org/wiki/Light-emitting diode on Dec. 31, 2014, 44 pages.
Lidow, Alex, Strydom, Johan; GaN Technology Overview, EPC White Paper. (2012) 6 pages.
Lin et al. "Influence of Separate Confinement Heterostructure Layer on Carrier Distribution in InGaAsP Laser Diodes with Nonidentical Multiple Quantum Wells," Japanese Journal of Applied Physics, vol. 43, No. 10, pp. 7032-7035 (2004).
Masui et al. "Electrical Characteristics of Nonpolar InGaN-Based Light-Emitting Diodes Evaluated at Low Temperature," Japanese Journal of Applied Physics, vol. 46, No. 11, 2007, pp. 7309-7310.
Michiue et al. "Recent development of Nitride LEDs and LDs," Proceedings of SPIE, vol. 7216, pp. 72161Z-1-72161Z-6, (2009).
Nakamura et al., "Candera-class high-brightness InGaN/AlgaN double-heterostructure blue-light-emitting diodes," Appl. Phys. Lett., vol. 64, pp. 1687-1689, 1994.
Nakamura et al., "InGaN/Gan/AlGaN-based Laser Diodes with Modulation-doped Strained-layer Superlattices Grown on an Epitaxially Laterally Grown GaN Substrate", 1998, Applied Physics Letters, vol. 72, No. 12, pp. 211-213.
Nakamura et al., "p-GaN/n-InGaN/n-GaN double-heterostructure blue-light-emitting diodes," Jpn. J. Appl. Phys., vol. 32, pp. L8-L11, 1993.
Nam et al., "Lateral Epitaxial Overgrowth of GaN Films on SiO2 Areas via Metalorganic Vapor Phase Epitaxy", Journal of Electronic Materials, vol. 27, No. 4, Apr. 1998, pp. 233-237.
Okamoto et al., "Pure Blue Laser Diodes Based on Nonpolar m-Plane Gallium Nitride with InGaN Waveguiding Layers," 2007, Journal of Japanese Applied Physics, vol. 46, No. 35, pp. 820-822.
Okamoto et. al "Continuous-Wave Operation of m-Plane InGaN Multiple Quantum Well Laser Diodes" The Japan Society of Applied Physics, JJAP Express Letter, vol. 46, No. 9, 2007 pp. L 187-L 189.
Okamoto et al., "High-Efficiency Continuous-Wave Operation of Blue-Green Laser Diodes Based on Nonpolar m-Plane Gallium Nitride," The Japan Society of Applied Physics, Applied Physics Express, vol. 1, Jun. 20, 2008, pp. 072201-1-072201-3.
Okubo, Nichia Develops Blue-green Semiconductor Laser w/ 488nm Wavelength, Tech-on, Retrieved from the internet: http://techon.nikkeibp.cojp/english/NEWS_EN/20080122/146009/?ST=english_PRINT, 2008, pp. 1-2.
Park, "Crystal Orientation Effects on Electronic Properties of Wurtzite InGaN/GaN Quantum Wells," Journal of Applied Physics, vol. 91, No. 12, pp. 9904-9908 (Jun. 15, 2002).
Power electronics, retrieved from http://en.wikipedia.org/wiki/Power_electronics on Dec. 31, 2014, 24 pages.
Purvis, "Changing the Crystal Face of Gallium Nitride," The Advance Semiconductor Magazine, vol. 18, No. 8, Nov. 2005, 3 pages.
Romanov "Strain-Induced Polarization in Wurtzite III-Nitride Semipolar Layers," Journal of Applied Physics, vol. 100, pp. 023522-1 through 023522-10 (Jul. 25, 2006).
Sato et al., "High Power and High Efficiency Green Light Emitting Diode on Free-Standing Semipolar (1122) Bulk GaN Substrate," Physica Status Solidi (RRL), vol. 1, No. 4, Jun. 15, 2007, pp. 162-164.
Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.
Schmidt et al., "Demonstration of Nonpolar m-plane InGaN/GaN Laser Diodes," 2007, Journal of Japanese Applied Physics, vol. 46, No. 9, pp. 190-191.
Schmidt et al., "High Power and High External Efficiency m-plane InGaN Light Emitting Diodes," Japanese Journal of Applied Physics, vol. 46, No. 7, Feb. 9, 2007, pp. L126-L128.
Schoedl et al., "Facet Degradation of GaN Heterostructure Laser Diodes", Journal of Applied Physics, vol. 97, No. 12, 2005, pp. 123102-1-123102-8.
Shchekin et al., "High Performance Thin-Film Flip-Chip InGaN—GaN Light-Emitting Diodes", Applied Physics Letters, vol. 89, Aug. 16, 2006, pp. 071109-1-071109-3.
Shen et al., "Auger Recombination in InGaN Measured by Photoluminescence", Applied Physics Letters, vol. 91, Oct. 1, 2007, pp. 141101-1-141101-3.
Sink, R., "Cleaved-Facet Group-III Nitride Lasers." University of California, Santa Barbara, Ph.D. Dissertation. Dec. 2000, 251 pages.
Sizov et al., "500-nm Optical Gain Anisotropy of Semipolar (1122) InGaN Quantum Wells," Applied Physics Express, Jun. 19, 2009, vol. 2, pp. 071001-1-071001-3.
Tamboli, A. "Photoelectrochemical etching of gallium nitride for high quality optical devices". (2009). at http://adsabs.harvard.edu/abs/2009PhDT...68T.
Tomiya et al., "Dislocation Related Issues in the Degradation of GaN-Based Laser Diodes", IEEE Journal of Selected Topics in Quantum Electronics, vol. 10, No. 6, Nov.-Dec. 2004, pp. 1277-1286.
Transistor, retrieved from http://en.wikipedia.org/wiki/Transistor on Dec. 31, 2014, 25 pages.
Tyagi et al., "High Brightness Violet InGaN/GaN Light Emitting Diodes on Semipolar (1011) Bulk GaN Substrates," Feb. 9, 2007, Japanese Journal of Applied Physics, vol. 46, No. 7, pp. L129-L131.
Uchida et al., "Recent Progress in High-Power Blue-Violet Lasers," 2003, IEEE Journal of Selected Topics in Quantum Electronics, vol. 9, No. 5, pp. 1252-1259.
Waltereit et al., "Nitride Semiconductors Free of Electrostatic Fields for Efficient White Light-Emitting Diodes," Aug. 24, 2000, Nature: International Weekly Journal of Science, vol. 406, pp. 865-868.
Wierer et al., "High-power AlGaInN Flip-Chip Light-Emitting Diodes," 2001, Applied Physics Letters, vol. 78, No. 22, pp. 3379-3381.
Yamaguchi, "Anisotropic Optical Matrix Elements in Strained GaN-Quantum Wells with Various Substrate Orientations," May 2008, Physica Status Solidi (PSS), vol. 5, No. 6, pp. 2329-2332.
Yang, B. "Micromachining of GaN Using Photoelectrochemical Etching", Graduate Program in Electronic Engineering, Notre Dame, Indiana (2005). 168 pages.
Yoshizumi et al. "Continuous-Wave Operation of 520 nm Green InGaN-Based Laser Diodes on Semi-Polar {20-21} GaN Substrates," Applied Physics Express, vol. 2, No. 9, Aug. 2009, pp. 1-3.
Yu et al., "Multiple Wavelength Emission from Semipolar InGaN/GaN Quantum Wells Selectively Grown by MOCVD," in Conference on Lasers and Electro-Optics/Quantum Electronics and Laser Science Conference and Photonic Applications Systems Technologies, OSA Technical Digest (CD) (Optical Society of America, 2007), 2 pages.
Zhong et al., "Demonstration of High Power Blue-Green Light Emitting Diode on Semipolar (1122) Bulk GaN Substrate," Jul. 19, 2007, Electronics Letters, vol. 43, No. 15, pp. 825-826.
Zhong et al., "High Power and High Efficiency Blue Light Emitting Diode on Freestanding Semipolar Bulk GaN Substrate," Nov. 23, 2007, Applied Physics Letter, vol. 90, No. 23, pp. 233504-1-233504-3.
International Search Report of PCT Application No. PCT/US2009/047107, dated Sep. 29, 2009, 4 pages.
International Search Report of PCT Application No. PCT/US2009/046786, dated May 13, 2010, 2 pages.
International Search Report of PCT Application No. PCT/US2009/52611, dated Sep. 29, 2009, 3 pages.
International Search Report & Written Opinion ofPCT Application No. PCT/US2010/030939, dated Jun. 16, 2010, 9 pages.
International Search Report & Written Opinion of PCT Application No. PCT/US2010/049172, dated Nov. 17, 2010, 7 pages.
International Search Report of PCT Application No. PCT/US2011/037792, dated Sep. 8, 2011, 2 pages.
International Search Report and Written Opinion of PCT Application No. PCT/US15/14567, dated Jul. 8, 2015, 23 pages.
U.S. Appl. No. 12/481,543, Non-Final Office Action dated Jun. 27, 2011, 10 pages.
U.S. Appl. No. 12/482,440, Final Office Action dated Aug. 12, 2011, 7 pages.

(56) References Cited

OTHER PUBLICATIONS

U.S. Appl. No. 12/482,440, Final Office Action dated Feb. 13, 2014, 8 pages.
U.S. Appl. No. 12/482,440, Final Office Action dated Jun. 8, 2015, 9 pages.
U.S. Appl. No. 12/482,440, Non-Final Office Action dated Feb. 23, 2011, 6 pages.
U.S. Appl. No. 12/482,440, Non-Final Office Action dated Aug. 15, 2013, 8 pages.
U.S. Appl. No. 12/482,440, Non-Final Office Action dated Sep. 11, 2014, 9 pages.
U.S. Appl. No. 12/484,924, Non-Final Office Action dated Apr. 14, 2011, 12 pages.
U.S. Appl. No. 12/484,924, Non-Final Office Action dated Dec. 18, 2013, 15 pages.
U.S. Appl. No. 12/484,924, Final Office Action dated Oct. 31, 2011, 11 pages.
U.S. Appl. No. 12/484,924, Notice of Allowance dated May 29, 2014, 9 pages.
U.S. Appl. No. 12/491,169, Final Office Action dated May 11, 2011, 10 pages.
U.S. Appl. No. 12/491,169, Non-Final Office Action dated Oct. 22, 2010, 10 pages.
U.S. Appl. No. 12/497,289, Non-Final Office Action dated Feb. 2, 2012, 7 pages.
U.S. Appl. No. 12/497,289, Notice of Allowance dated May 22, 2012, 7 pages.
U.S. Appl. No. 12/502,058, Non-Final Office Action dated Dec. 8, 2010, 15 pages.
U.S. Appl. No. 12/502,058, Final Office Action dated Aug. 19, 2011, 13 pages.
U.S. Appl. No. 12/502,058, Notice of Allowance dated Apr. 16, 2012, 10 pages.
U.S. Appl. No. 12/502,058, Notice of Allowance dated Jul. 19, 2012, 8 pages.
U.S. Appl. No. 12/573,820, Method and System for Thin Film Processing Using Shower Head Device filed Oct. 5, 2009, 32 pages.
U.S. Appl. No. 12/534,829, Non-Final Office Action dated Apr. 19, 2011, 9 pages.
U.S. Appl. No. 12/534,829, Notice of Allowability dated Dec. 21, 2011, 4 pages.
U.S. Appl. No. 12/534,829, Notice of Allowance dated Dec. 5, 2011, 7 pages.
U.S. Appl. No. 12/534,829, Notice of Allowance dated Oct. 28, 2011, 8 pages.
U.S. Appl. No. 12/573,820, Final Office Action dated Oct. 11, 2011, 23 pages.
U.S. Appl. No. 12/573,820, Non-Final Office Action dated Mar. 2, 2011, 19 pages.
U.S. Appl. No. 12/727,148, Strain Mitigation Using Selective Area Epitaxy Growth Method and Structure filed Mar. 18, 2010, 41 pages.
U.S. Appl. No. 12/749,466, Final Office Action dated Feb. 3, 2012, 16 pages.
U.S. Appl. No. 12/749,466, Non-Final Office Action dated Jul. 3, 2012, 18 pages.
U.S. Appl. No. 12/749,466, Non-Final Office Action dated Jun. 29, 2011, 20 pages.
U.S. Appl. No. 12/749,466, Notice of Allowance dated Jan. 2, 2013, 8 pages.
U.S. Appl. No. 12/749,476, Non-Final Office Action dated Apr. 11, 2011, 15 pages.
U.S. Appl. No. 12/749,476, Notice of Allowance dated Jun. 26, 2012, 8 pages.
U.S. Appl. No. 12/749,476, Notice of Allowance dated May 4, 2012, 8 pages.
U.S. Appl. No. 12/759,273, Final Office Action dated Jun. 26, 2012, 10 pages.
U.S. Appl. No. 12/759,273, Final Office Action dated Oct. 24, 2014, 16 pages.
U.S. Appl. No. 12/759,273, Final Office Action dated Jun. 8, 2015, 17 pages.
U.S. Appl. No. 12/759,273, Final Office Action dated Mar. 29, 2016, 12 pages.
U.S. Appl. No. 12/759,273, Non-Final Office Action dated Nov. 21, 2011, 10 pages.
U.S. Appl. No. 12/759,273, Non-Final Office Action dated Apr. 3, 2014, 16 pages.
U.S. Appl. No. 12/759,273, Non-Final Office Action dated Jan. 29, 2015, 16 pages.
U.S. Appl. No. 12/759,273, Non-Final Office Action dated Sep. 23, 2015, 18 pages.
U.S. Appl. No. 12/762,269, Non-Final Office Action dated Oct. 12, 2011, 12 pages.
U.S. Appl. No. 12/762,269, Notice of Allowance dated Apr. 23, 2012, 8 pages.
U.S. Appl. No. 12/762,278, Notice of Allowance dated Nov. 7, 2011, 11 pages.
U.S. Appl. No. 12/762,271, Final Office Action dated Jun. 6, 2012, 13 pages.
U.S. Appl. No. 12/762,271, Non-Final Office Action dated Dec. 23, 2011, 12 pages.
U.S. Appl. No. 12/762,271, Notice of Allowance dated Aug. 8, 2012, 9 pages.
U.S. Appl. No. 12/778,718, Non-Final Office Action dated Nov. 25, 2011, 12 pages.
U.S. Appl. No. 12/778,718, Notice of Allowance dated Apr. 3, 2012, 14 pages.
U.S. Appl. No. 12/778,718, Notice of Allowance dated Jun. 13, 2012, 7 pages.
U.S. Appl. No. 12/880,803, Non-Final Office Action dated Feb. 22, 2012, 9 pages.
U.S. Appl. No. 12/880,803, Notice of Allowance dated Jul. 18, 2012, 5 pages.
U.S. Appl. No. 12/868,441, Non-Final Office Action dated Apr. 30, 2012, 12 pages.
U.S. Appl. No. 12/868,441, Final Office Action dated Dec. 18, 2012, 34 pages.
U.S. Appl. No. 12/868,441, Notice of Allowance dated Sep. 18, 2013, 13 pages.
U.S. Appl. No. 12/873,820, Non-Final Office Action dated Oct. 4, 2012, 10 pages.
U.S. Appl. No. 12/873,820, Final Office Action dated Apr. 11, 2013, 7 pages.
U.S. Appl. No. 12/873,820, Notice of Allowance dated Jul. 26, 2013, 6 pages.
U.S. Appl. No. 12/880,889, Blue Green Active Region and Red Phosphor White LEDS filed Sep. 13, 2010, 18 pages.
U.S. Appl. No. 12/883,093, Final Office Action dated Aug. 3, 2012, 13 pages.
U.S. Appl. No. 12/883,093, Non-Final Office Action dated Mar. 13, 2012, 12 pages.
U.S. Appl. No. 12/883,093, Notice of Allowance dated Nov. 21, 2012, 12 pages.
U.S. Appl. No. 12/883,652, Non-Final Office Action dated Apr. 17, 2012, 9 pages.
U.S. Appl. No. 12/883,652, Non-Final Office Action dated May 14, 2014, 14 pages.
U.S. Appl. No. 12/883,652, Non-Final Office Action dated Jun. 3, 2015, 16 pages.
U.S. Appl. No. 12/883,652, Non-Final Office Action dated Apr. 5, 2016, 12 pages.
U.S. Appl. No. 12/883,652, Final Office Action dated Jan. 11, 2013, 12 pages.
U.S. Appl. No. 12/883,652, Final Office Action dated Dec. 19, 2014, 16 pages.
U.S. Appl. No. 12/883,652, Final Office Action dated Oct. 26, 2015, 11 pages.
U.S. Appl. No. 12/883,652, Notice of Allowance dated Aug. 30, 2016, 7 pages.
U.S. Appl. No. 12/884,993, Final Office Action dated Aug. 2, 2012, 15 pages.

(56) References Cited

OTHER PUBLICATIONS

U.S. Appl. No. 12/884,993, Non-Final Office Action dated Mar. 16, 2012, 15 pages.
U.S. Appl. No. 12/884,993, Notice of Allowance dated Nov. 26, 2012, 11 pages.
U.S. Appl. No. 13/014,622, Final Office Action dated Apr. 30, 2012, 14 pages.
U.S. Appl. No. 13/014,622, Final Office Action dated May 11, 2015, 14 pages.
U.S. Appl. No. 13/014,622, Non-Final Office Action dated Nov. 28, 2011, 14 pages.
U.S. Appl. No. 13/014,622, Non-Final Office Action dated Jun. 20, 2014, 15 pages.
U.S. Appl. No. 13/046,565, Final Office Action dated Feb. 2, 2012, 17 pages.
U.S. Appl. No. 13/046,565, Final Office Action dated Jul. 19, 2012, 24 pages.
U.S. Appl. No. 13/046,565, Non-Final Office Action dated Nov. 7, 2011, 17 pages.
U.S. Appl. No. 13/046,565, Non-Final Office Action dated Apr. 13, 2012, 40 pages.
U.S. Appl. No. 14/176,403, Non-Final Office Action dated Sep. 11, 2015, 27 pages.
U.S. Appl. No. 14/176,403, Notice of Allowance dated Feb. 12, 2016, 14 pages.
U.S. Appl. No. 14/312,427, Non-Final Office Action dated Aug. 21, 2015, 28 pages.
U.S. Appl. No. 14/312,427, Final Office Action dated Dec. 16, 2015, 18 pages.
U.S. Appl. No. 14/312,427, Notice of Allowance dated Mar. 4, 2016, 8 pages.
U.S. Appl. No. 14/559,149, Notice of Allowance dated Feb. 17, 2016, 35 pages.
U.S. Appl. No. 14/534,636, Non-Final Office Action dated Jun. 3, 2015, 24 pages.
U.S. Appl. No. 14/534,636, Notice of Allowance dated Sep. 15, 2015, 11 pages.
U.S. Appl. No. 14/580,693, filed Dec. 23, 2014, Raring et al., Unpublished.
U.S. Appl. No. 14/968,710, filed Dec. 14, 2015, Raring et al., Unpublished.
U.S. Appl. No. 61/249,568, Low Voltage Laser Diodes on {20-21} Gallium and Nitrogen Containing Substrates filed Oct. 7, 2009, 62 pages.
U.S. Appl. No. 61/182,105, Laser Display and Method filed May 29, 2009, 10 pages.
U.S. Appl. No. 61/164,409, Optical Device Structure Using Miscut GaN Substrates for Laser Applications filed Mar. 28, 2009, 23 pages.
U.S. Appl. No. 16/411,977 Notice of Allowance dated Sep. 21, 2020, 12 pages.

* cited by examiner

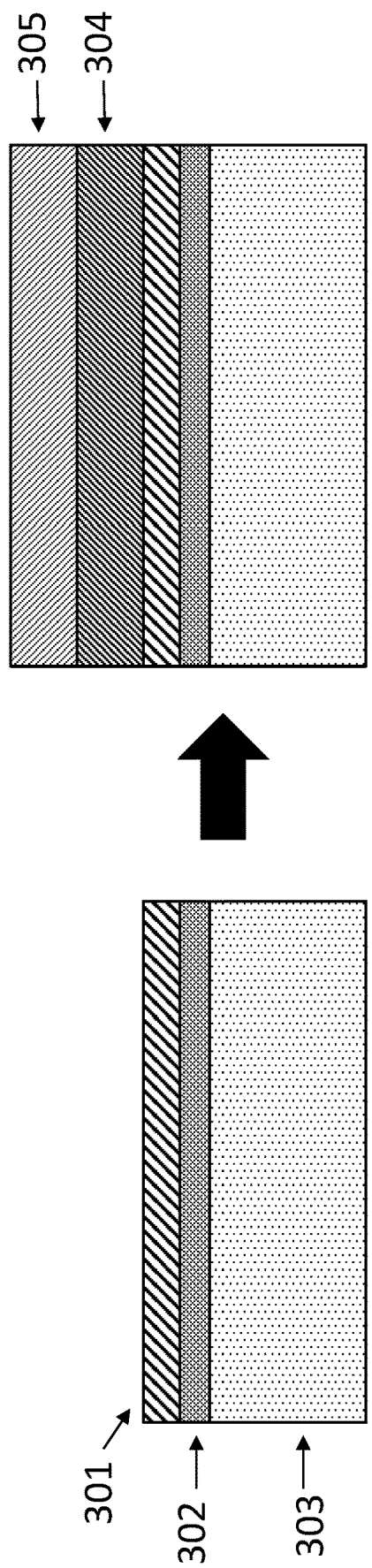
Figure 3: engineered substrate for growth of GaN devices

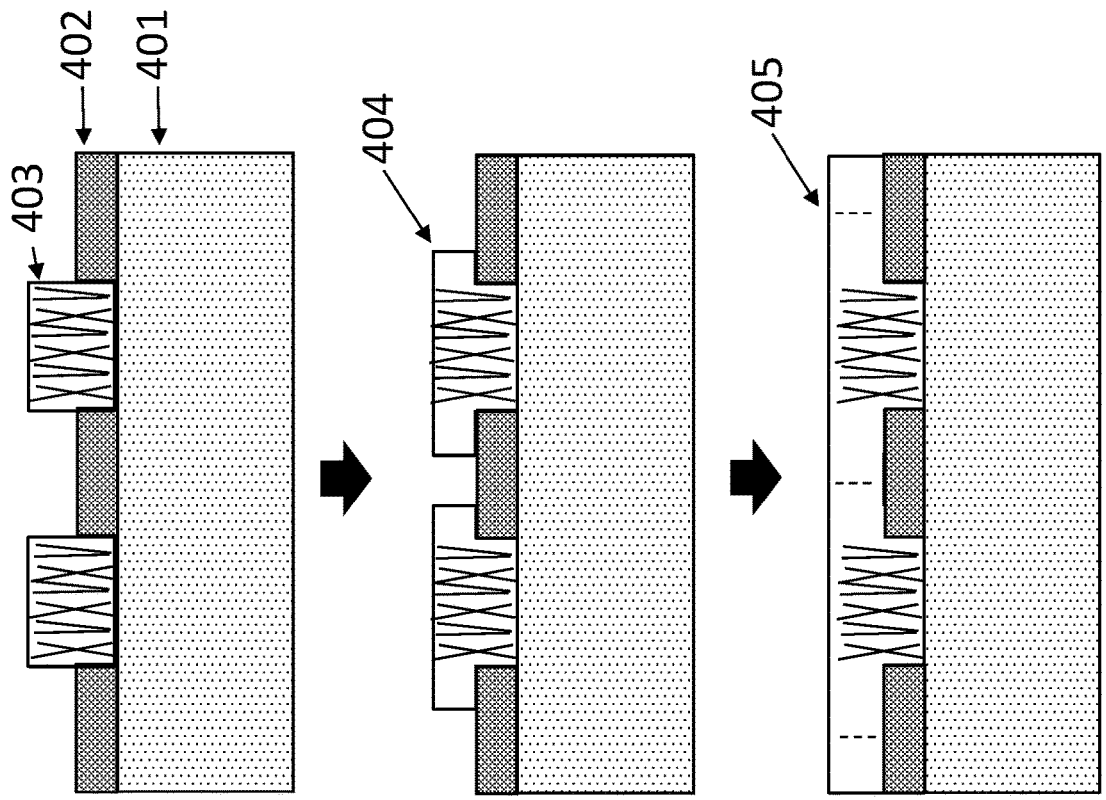
Figure 4: engineered substrate using lateral overgrowth

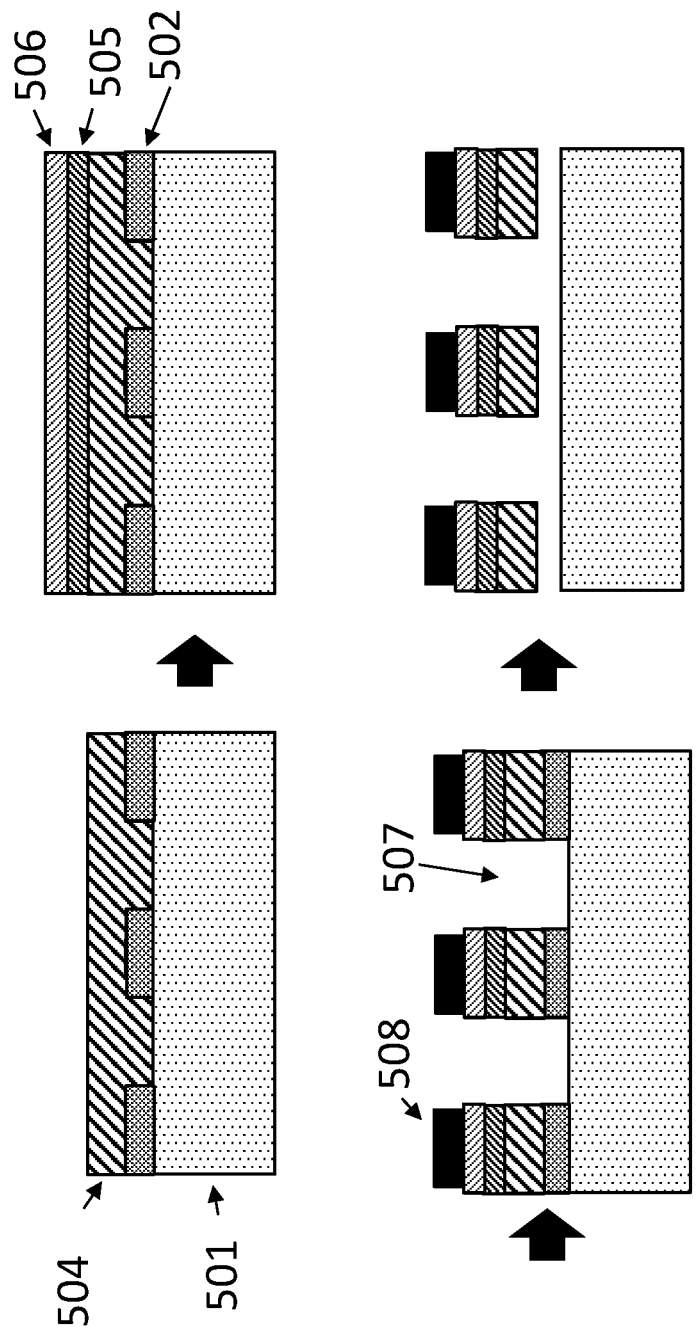
Figure 5: process flow for engineered substrate utilizing lateral overgrowth

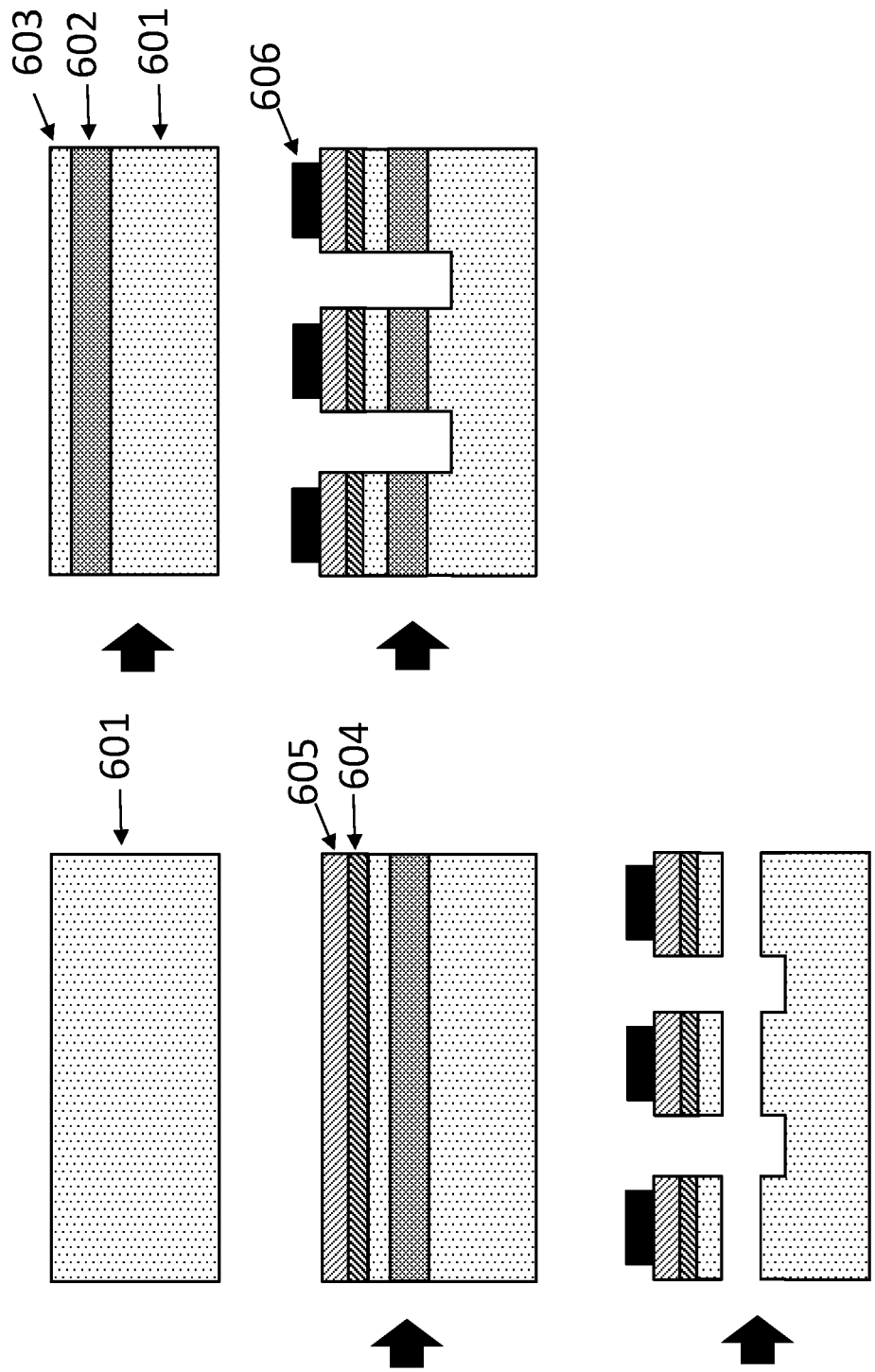

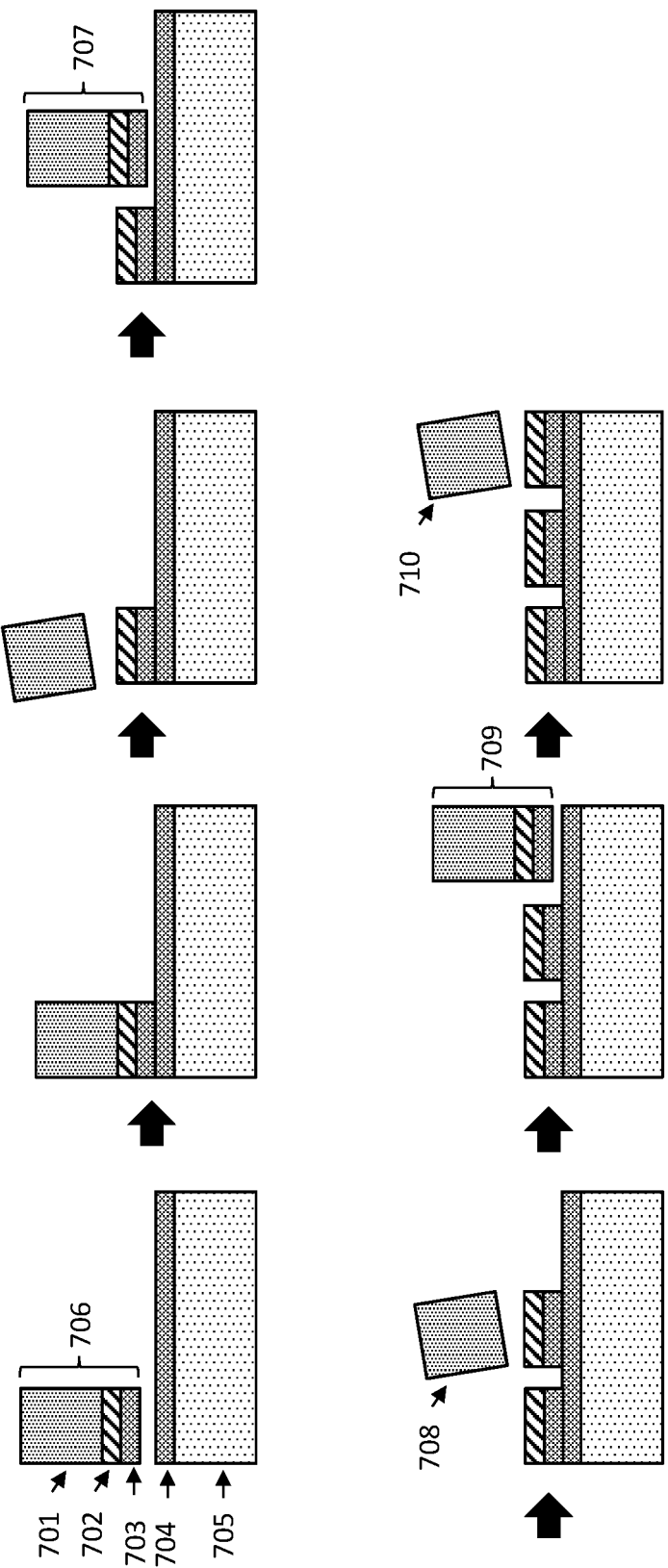

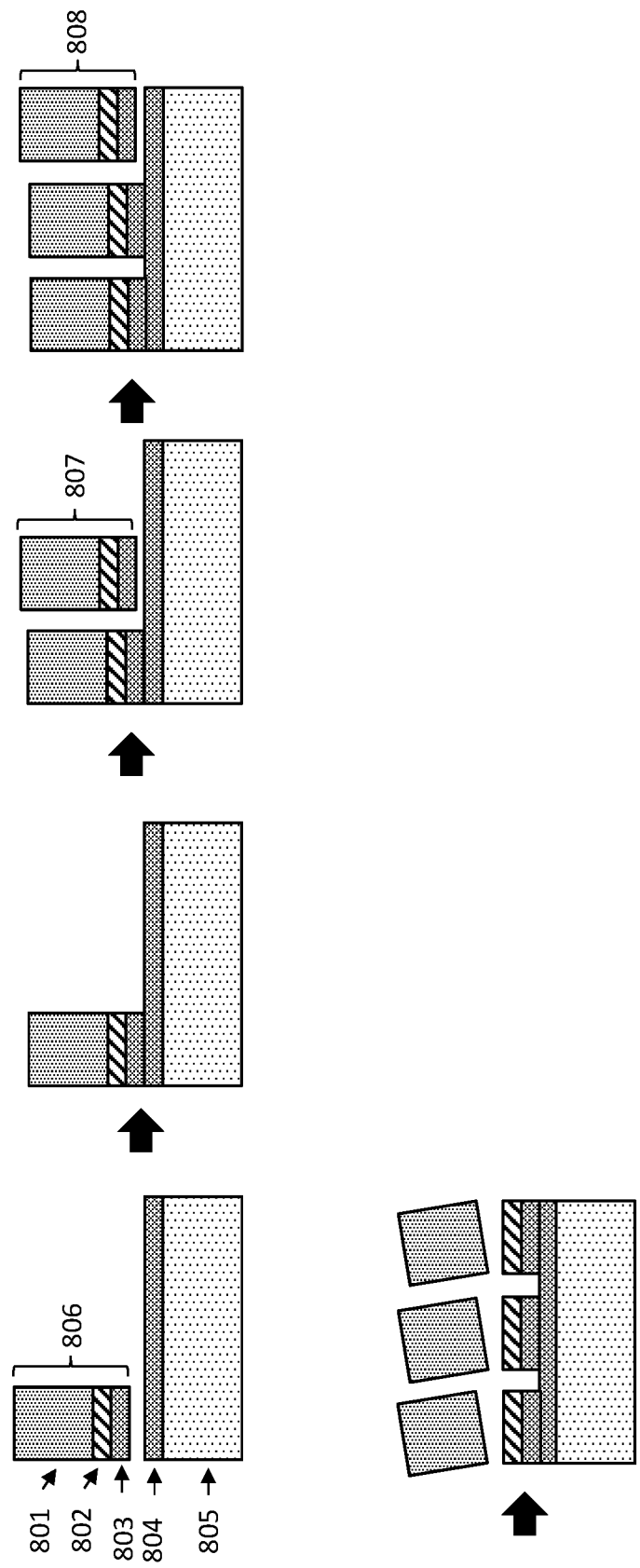

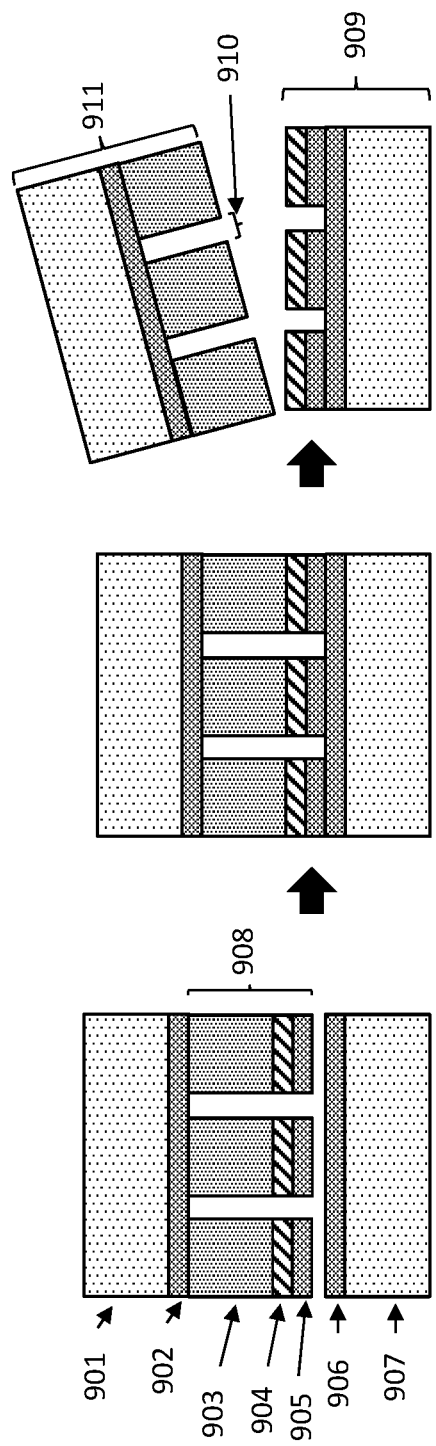
Figure 9: tiled engineered substrate via tiled mother wafer

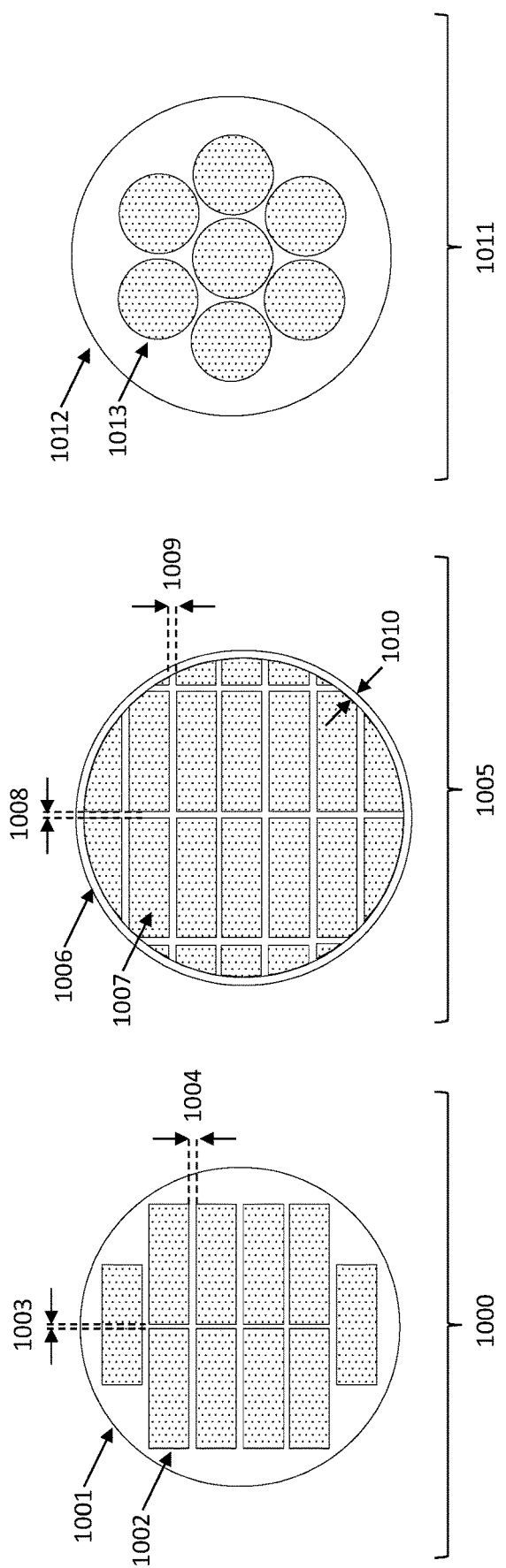
Figure 10A: Example configurations for tiled engineered substrates

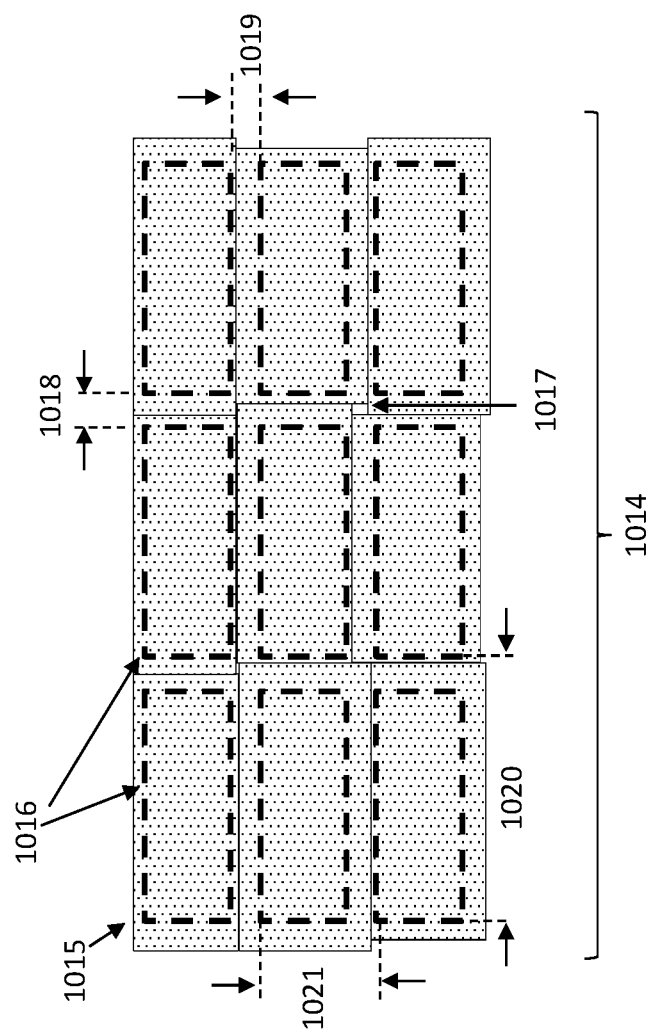
Figure 10B: Example configurations for tiled engineered substrates

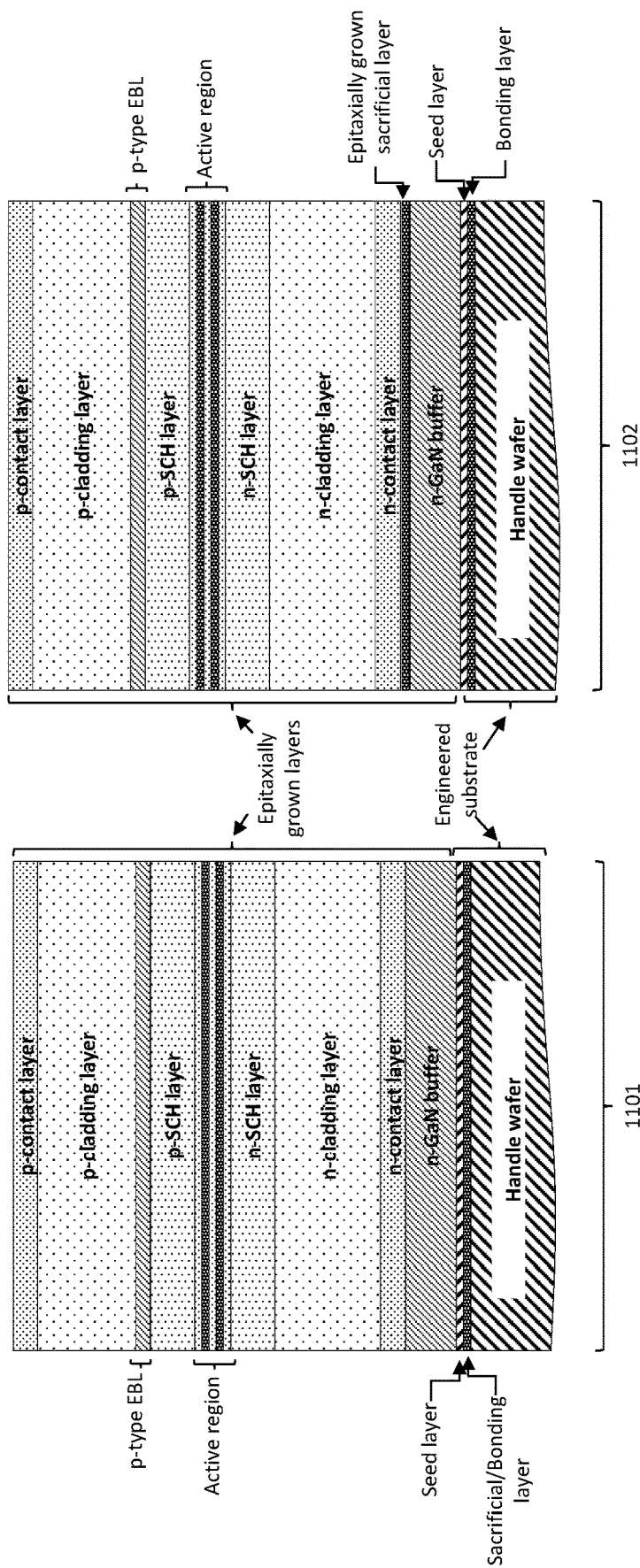
Figure 11: Example of LD epitaxial structure

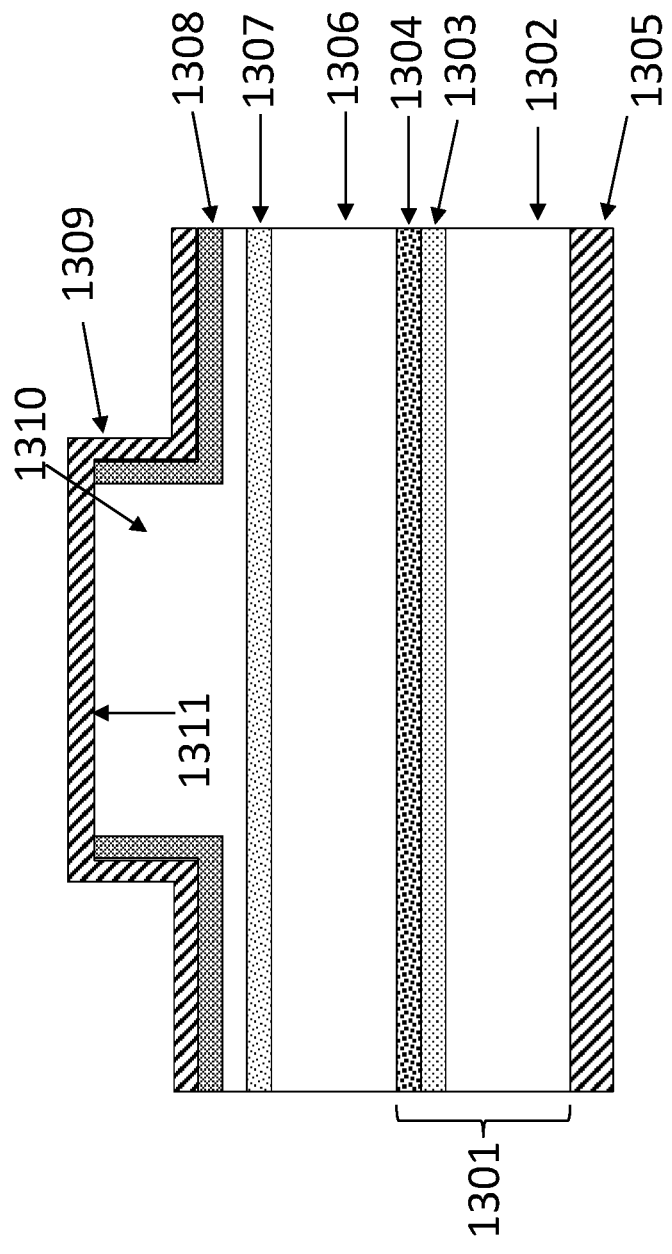
Figure 13a: Schematic cross-section of ridge laser diode on an engineered substrate with a backside electrical contact

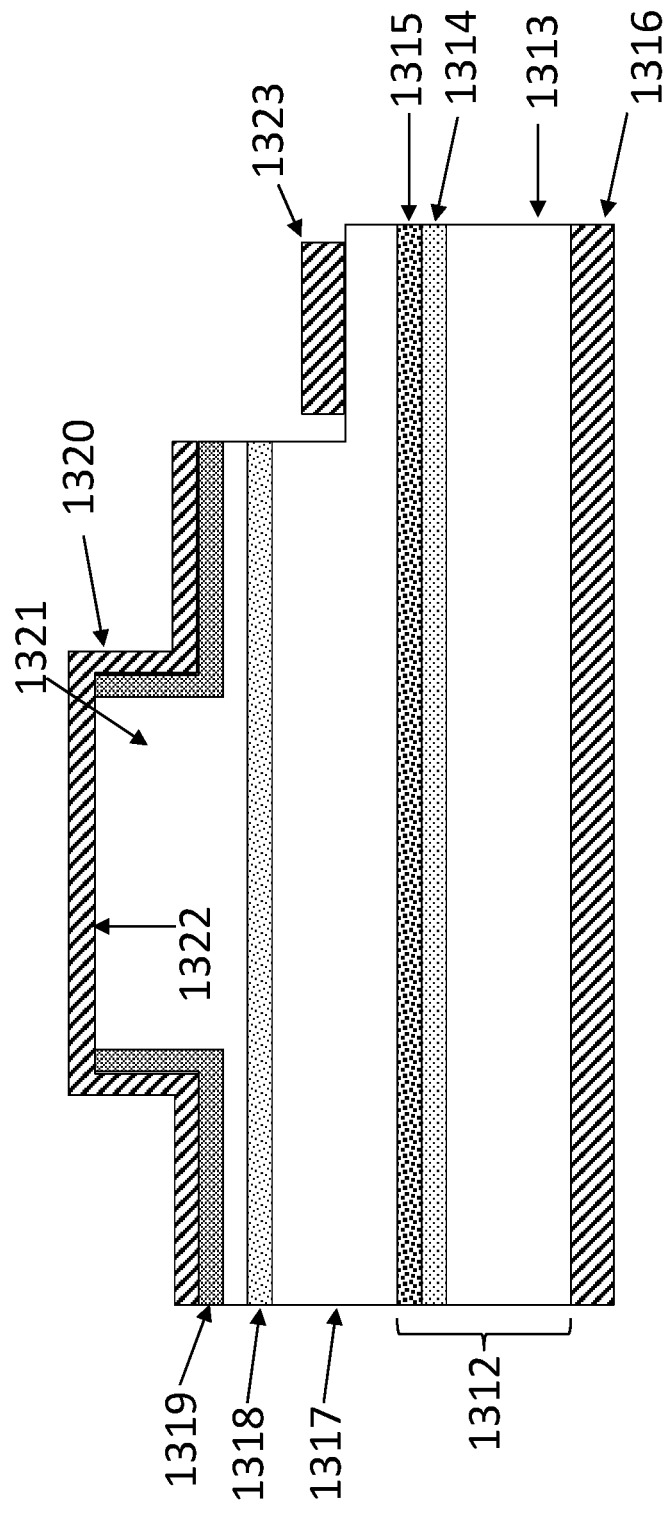
Figure 13b: Schematic cross-section of ridge laser diode on an engineered substrate

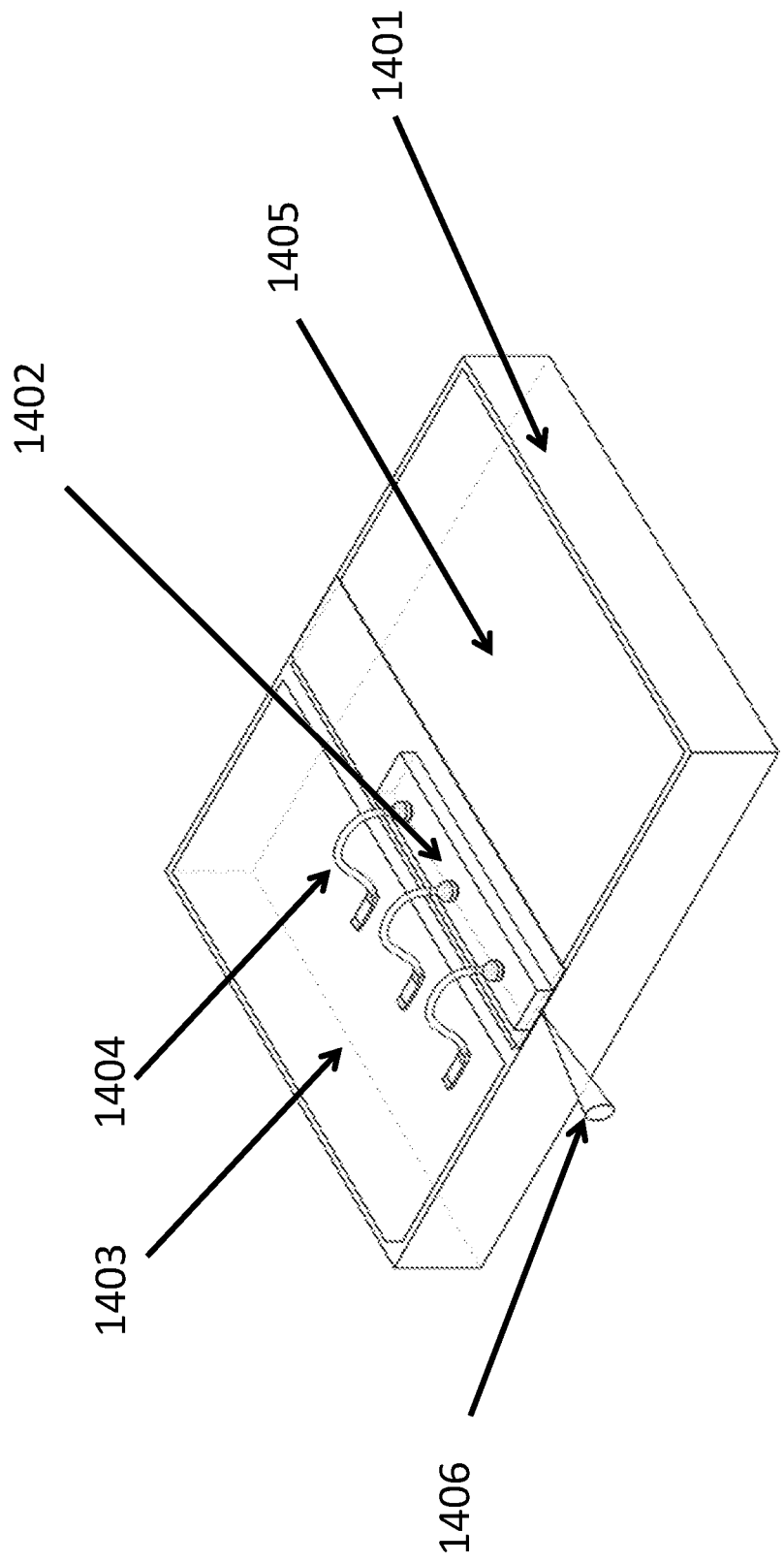
Figure 14: Laser diode chip on submount p-down configuration

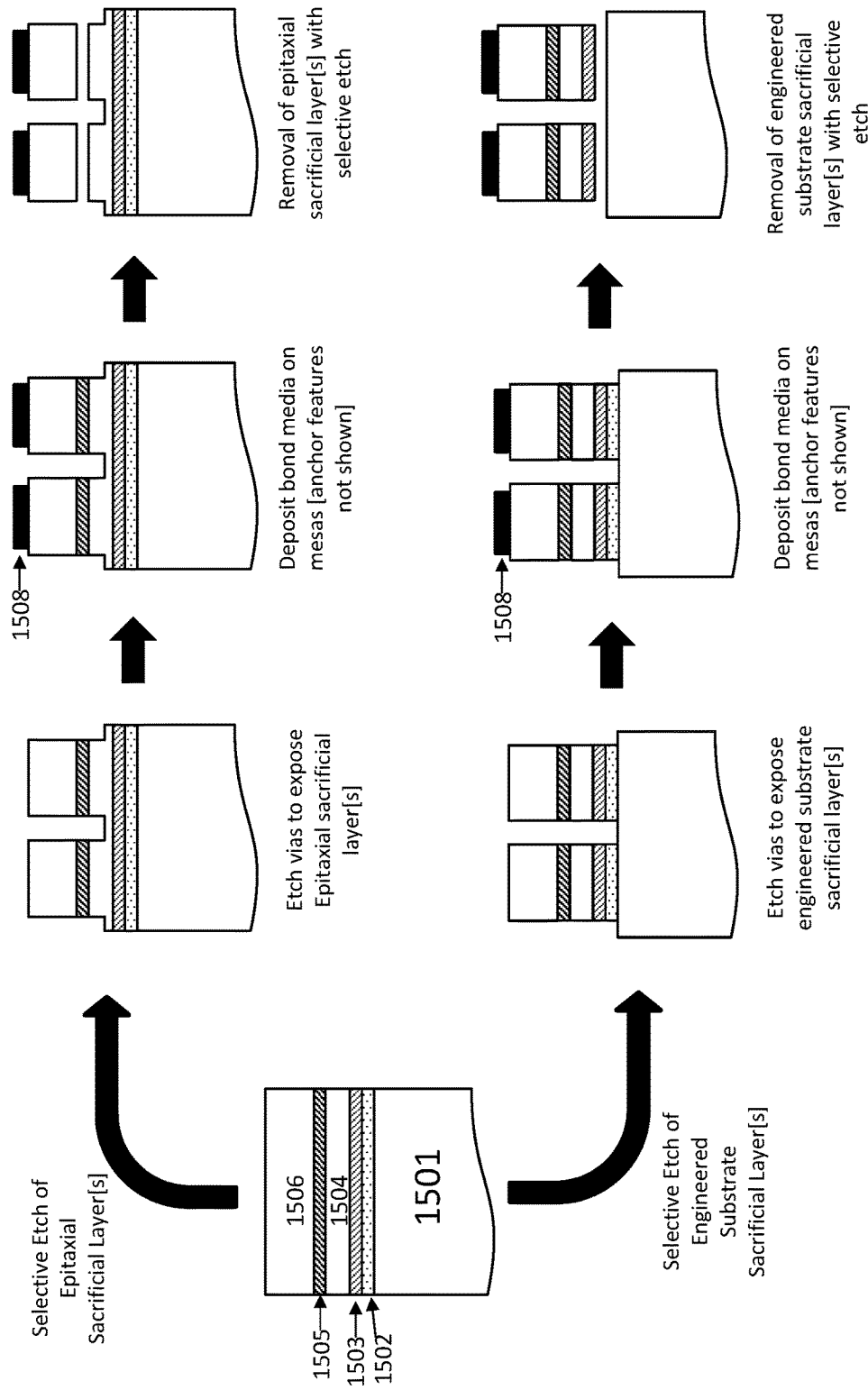
Figure 15: Epitaxy preparation process flows for epi transfer to carrier

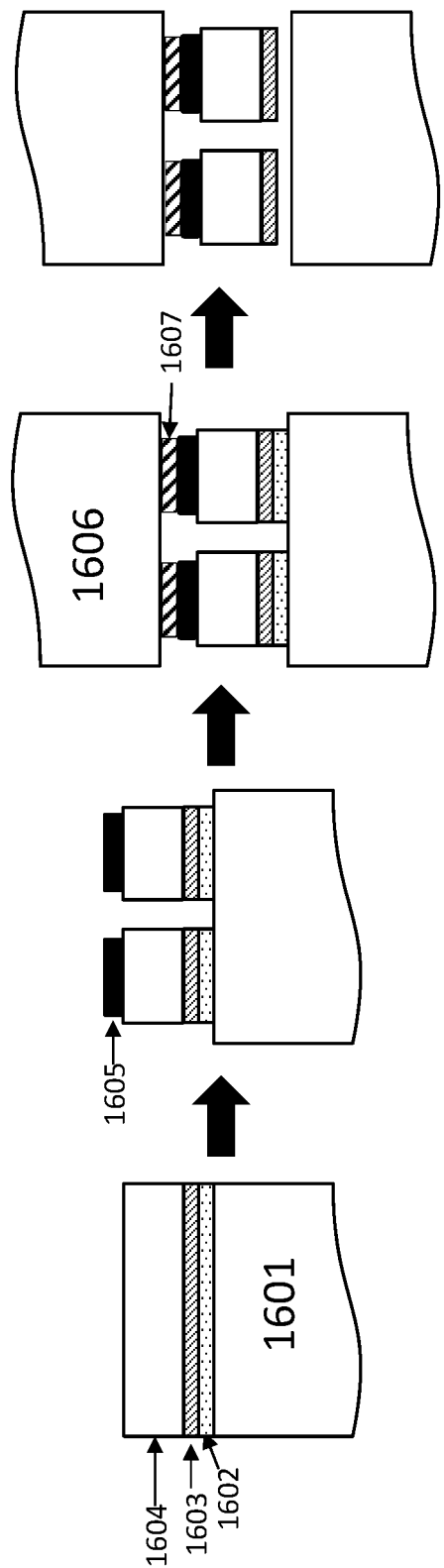
Figure 16: Bond then etch process flow for epi layer transfer to carrier

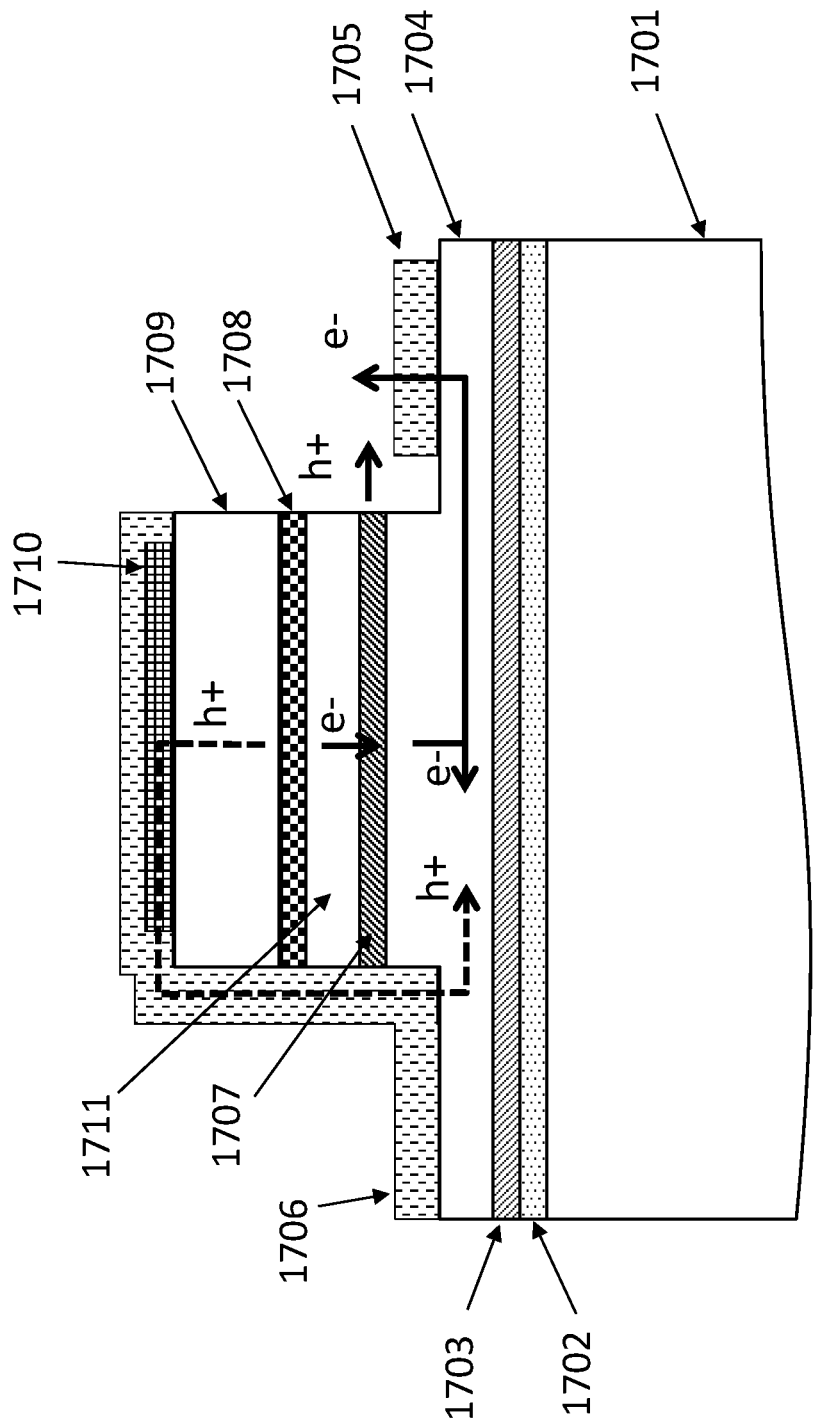
Figure 17: PEC etch configuration

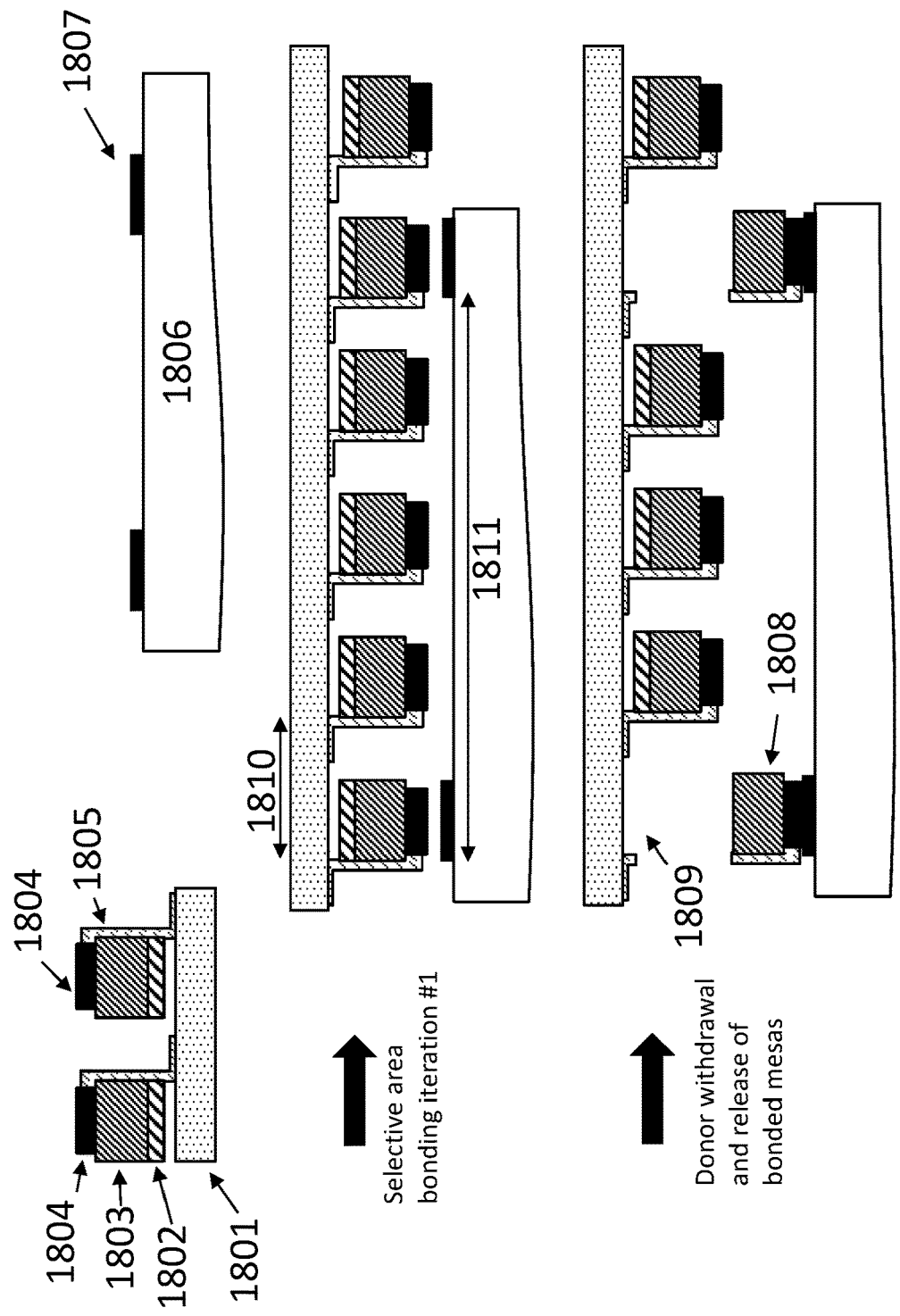
Figure 18 : Side view of die expansion with selective area bonding

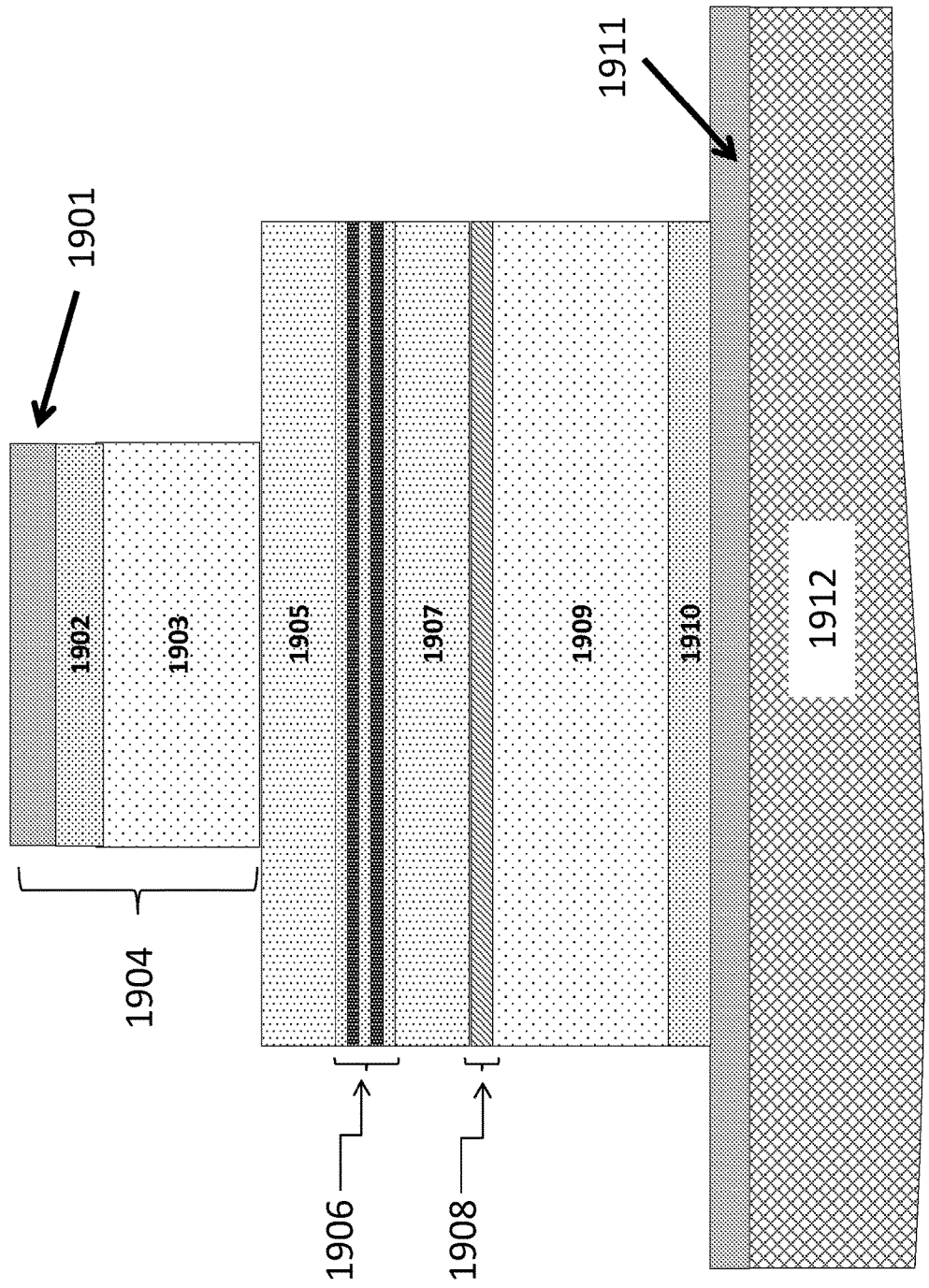
Figure 19: Example of LD device structure formed on carrier wafer from epitaxial structure in Figure Y4

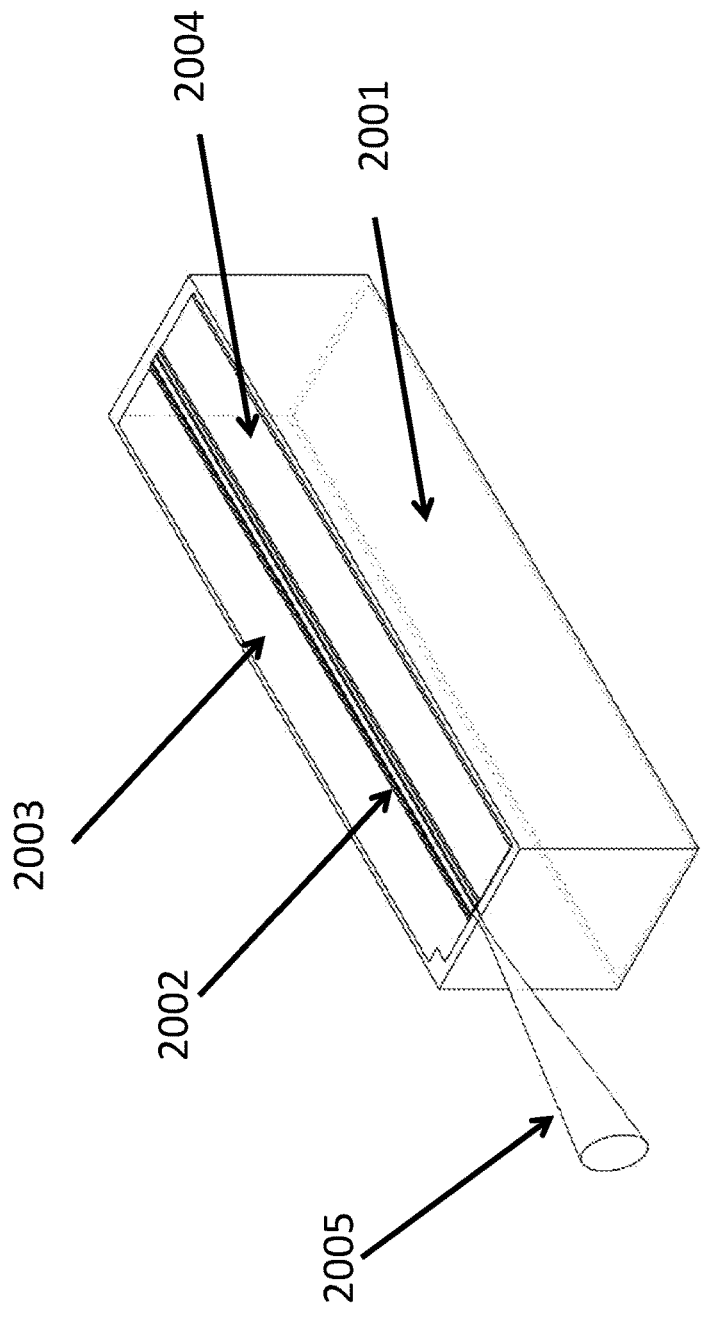
Figure 20: Laser device on integrated submount fabricated via wafer-level laser diode processing after transfer of gallium and nitrogen containing epitaxial layers

MANUFACTURABLE LASER DIODES ON A LARGE AREA GALLIUM AND NITROGEN CONTAINING SUBSTRATE

BACKGROUND

In the late 1800's, Thomas Edison invented the light bulb. The conventional light bulb, commonly called the "Edison bulb," has been used for over one hundred years for a variety of applications including lighting and displays. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light or displays. Unfortunately, drawbacks exist with the conventional light bulb:

The conventional light bulb dissipates more than 90% of the energy used as thermal energy.

The conventional light bulb routinely fails due to thermal expansion and contraction of the filament element.

The conventional light bulb emits light over a broad spectrum, much of which is not perceived by the human eye.

The conventional light bulb emits in all directions, which is undesirable for applications requiring strong directionality or focus, e.g. projection displays, optical data storage, etc.

To overcome some of the drawbacks of the conventional light bulb, several alternatives have been developed including fluorescent lamps, Mercury vapor lamps, sodium vapor lamps, other high-intensity discharge (HID) lamps, gas discharge lamps such as neon lamps, among others. These lamp technologies in general suffer from similar problems to Edison lamps as well as having their own unique drawbacks. For example, fluorescent lamps require high voltages to start, which can be in the range of a thousand volts for large lamps, and also emit highly non-ideal spectra that are dominated by spectral lines.

In the past decade, solid state lighting has risen in importance due to several key advantages it has over conventional lighting technology. Solid state lighting is lighting derived from semiconductor devices such as diodes which are designed and optimized to emit photons. Due to the high efficiency, long lifetimes, low cost, and non-toxicity offered by solid state lighting technology, light emitting diodes (LED) have rapidly emerged as the illumination technology of choice. An LED is a two-lead semiconductor light source typically based on a p-i-n junction diode, which emits electromagnetic radiation when activated. The emission from an LED is spontaneous and is typically in a Lambertian pattern. When a suitable voltage is applied to the leads, electrons and holes recombine within the device releasing energy in the form of photons. This effect is called electroluminescence, and the color of the light is determined by the energy band gap of the semiconductor.

Appearing as practical electronic components in 1962 the earliest LEDs emitted low-intensity infrared light. Infrared LEDs are still frequently used as transmitting elements in remote-control circuits, such as those in remote controls for a wide variety of consumer electronics. The first visible-light LEDs were also of low intensity, and limited to red. Modern LEDs are available across the visible, ultraviolet, and infrared wavelengths, with very high brightness.

The earliest blue and violet gallium nitride (GaN)-based LEDs were fabricated using a metal-insulator-semiconductor structure due to a lack of p-type GaN. The first p-n junction GaN LED was demonstrated by Amano et al. using the LEEBI treatment to obtain p-type GaN in 1989. They obtained the current-voltage (I-V) curve and electroluminescence of the LEDs, but did not record the output power or the efficiency of the LEDs. Nakamura et al. demonstrated the p-n junction GaN LED using the low-temperature GaN buffer and the LEEBI treatment in 1991 with an output power of 42 µW at 20 mA. The first p-GaN/n-InGaN/n-GaN DH blue LEDs were demonstrated by Nakamura et al. in 1993. The LED showed a strong band-edge emission of InGaN in a blue wavelength regime with an emission wavelength of 440 nm under a forward biased condition. The output power and the EQE were 125 µW and 0.22%, respectively, at a forward current of 20 mA. In 1994, Nakamura et al. demonstrated commercially available blue LEDs with an output power of 1.5 mW, an EQE of 2.7%, and the emission wavelength of 450 nm. On Oct. 7, 2014, the Nobel Prize in Physics was awarded to Isamu Akasaki, Hiroshi Amano and Shuji Nakamura for "the invention of efficient blue light-emitting diodes which has enabled bright and energy-saving white light sources" or, less formally, LED lamps.

By combining GaN-based LEDs with wavelength converting materials such as phosphors, solid-state white light sources were realized. This technology utilizing GaN-based LEDs and phosphor materials to produce white light is now illuminating the world around us as a result of the many advantages over incandescent light sources including lower energy consumption, longer lifetime, improved physical robustness, smaller size, and faster switching. LEDs are now used in applications as diverse as aviation lighting, automotive headlamps, advertising, general lighting, traffic signals, and camera flashes. LEDs have allowed new text, video displays, and sensors to be developed, while their high switching rates can be very useful in communications technology. LEDs, however, are not the only solid-state light source and may not be preferable light sources for certain lighting applications. Alternative solid state light sources utilizing stimulated emission, such as laser diodes (LDs) or super-luminescent light emitting diodes (SLEDs), provide many unique features advantageously over LEDs.

In 1960, the laser was demonstrated by Theodore H. Maiman at Hughes Research Laboratories in Malibu. This laser utilized a solid-state flash lamp-pumped synthetic ruby crystal to produce red laser light at 694 nm. Early visible laser technology comprised lamp pumped infrared solid state lasers with the output wavelength converted to the visible using specialty crystals with nonlinear optical properties. For example, a green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal, which lases at 1064 nm, 1064 nm goes into frequency conversion crystal which converts to visible 532 nm. As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging today.

Solid-state laser light sources, due to the narrowness of their spectra which enables efficient spectral filtering, high modulation rates, and short carrier lifetimes, smaller in size, and far greater surface brightness compared to LEDs, can be more preferable as visible light sources as a means of transmitting information with high bandwidth in many applications including lighting fixtures, lighting systems, displays, projectors and the like. Advancements of new GaN-based blue laser technology based on improved processes have substantially reduced manufacture cost and opened opportunities for utilizing the modulated laser signal and the light spot directly to measure and or interact with the surrounding environment, transmit data to other electronic systems, and respond dynamically to inputs from various sensors.

SUMMARY

The present invention provides a method and structure for producing large area gallium and nitrogen engineered substrate members configured for the epitaxial growth of layer structures suitable for the fabrication of high performance semiconductor devices. In a specific embodiment the engineered substrates are used to manufacture gallium and nitrogen containing devices based on an epitaxial transfer process wherein as-grown epitaxial layers are transferred from the engineered substrate to a carrier wafer for processing. In a preferred embodiment, the gallium and nitrogen containing devices are laser diode devices operating in the 390 nm to 425 nm range, the 425 nm to 485 nm range, the 485 nm to 550 nm range, or greater than 550 nm. Merely by examples, the invention provides a cost effective method and structure to manufacture laser diodes in applications such as display systems, laser based lighting systems including remote and integrated smart laser lighting devices and methods, spatially dynamic lighting devices and methods, LIDAR, LiFi, and visible light communication devices and methods, and various combinations of above in applications of general lighting, commercial lighting and display, automotive lighting and communication, defense and security, industrial processing such as welding, cutting, and 3D printing of various materials, and internet communications, and others.

This invention describes a novel approach and structure for the manufacture of large area gallium and nitrogen containing substrates using an engineered substrate wafer comprised of a tiled array of gallium and nitrogen containing crystalline seed regions. In a preferred embodiment the seed regions used for tiling can range in size from less than about 1 $cm^2$ to about 4 $cm^2$ to enable conventional size donor substrates such as 2" substrates. In this embodiment specialized substrate orientations only available in such small sizes with high quality such as nonpolar or semipolar GaN substrates can be scaled in size to realize cost effective semiconductor devices fabricated on these specialized orientations. Devices specifically formed from these specialized orientations can offer performance, reliability, and cost advantages over the available non-specialized orientations. Once the donor gallium and nitrogen substrates are formed using a critical tiling process, thin layers of the donor wafer is then exfoliated or lifted off from the donor substrate and transferred to handle wafers where they can be prepared as substrates suitable for high quality epitaxial growth and device fabrication. A key element to this invention is that the boundaries [i.e., seam regions] separating each of the tiled crystalline seed regions are precisely spatially positioned such that devices can be efficiently positioned with respect to the seam regions to avoid excessive yield losses or process variability that would result from seam position variation.

In an alternative embodiment, the seed wafers can be comprised of non-specialized orientations currently available in more conventional sizes substrates such as 2" to enable even larger donor substrates such as 4" or 6" substrates that could not otherwise be realized with the appropriate quality or cost. In one example of this embodiment, low defect density laser grade c-plane oriented GaN substrates that are currently only available in sizes up to 2" could be tiled to form low defect density laser grade c-plane oriented donor wafers of up to 4" or 6". Once the donor gallium and nitrogen substrates are formed using a critical tiling process, thin layers of the large area donor wafer are exfoliated or lifted from the donor substrates and transferred to handle wafers where they can be prepared as substrates suitable for epitaxial growth and device fabrication. A key element to this invention is that the boundaries [i.e. seam regions] separating each of the tile regions are precisely spatially positioned such that devices can be efficiently positioned with respect to the seam regions to avoid excessive yield losses or process variability that would result from seam position variation.

In brief, embodiments of the invention involve an optoelectronic device wafer composed of epitaxial device layers overlying the surface region of a substrate wafer. The epitaxial devices layers are deposited using an epitaxial process such as molecular beam epitaxy (MBE) or metal organic chemical vapor deposition (MOCVD). The substrate wafer on which the epitaxial layers are grown is an engineered substrate. The engineered substrate is comprised by two or more layers including at least a handle wafer, which is a thick layer with the function of providing mechanical support to the other significantly thinner layers of the engineered substrate such that they are sufficiently ridged and robust to survive the epitaxial deposition of the device layers. At least one layer of the engineered substrate acts as a crystalline surface for the epitaxial growth of the device layers and is called the seed layer. The seed layer can be quite thin, on the order of tens to hundreds of nanometers, though it could be as thick as 100 microns. The seed layer is attached to the handle wafer by some means other than epitaxial growth. In some embodiments, the engineered substrate includes one or both of a bonding layer and a selective release layer. The bonding layer is comprised by one or more layers of materials designed to provide a strong bond between the seed layer and the handle. The selective release layer is one or more layers that are selectively removable such that the seed layer and any epitaxial layers grown on the seed layer can be removed from the engineered substrate. In some embodiments one or more layers act as both bonding layer and selective release layers.

Seed layers are transferred to the engineered substrate from a donor crystal herein called the mother crystal. In some embodiments, mother crystals are low defect density bulk wafers such as bulk GaN, Si, SiC, sapphire, or the like which would be suitable for the growth of high-power laser diodes. In other embodiments, mother crystals are relatively high dislocation density epitaxial films grown epitaxially on foreign substrates such as Si, sapphire, SiC, and the like. In some embodiments, mother wafers are low defect density layers grown epitaxially on foreign substrates such as Si, sapphire, SiC, and the like, but which include defect reduction methods such as lateral epitaxial overgrowth and inclusion of dislocation blocking layers such as porous nitride layers, porous metal layers or the like.

In some embodiments, the seed layer is comprised of a plurality of crystalline film regions forming a tiled engineered substrate where the surface area of seed regions available for epitaxial growth is larger than that of an individual mother wafer. In some embodiments the plurality of crystalline film regions is transferred in a plurality of transfer steps from one or more mother crystals. In other embodiments, a plurality of mother wafers are themselves joined into a tiled mother wafer prior to simultaneous transfer of crystalline film regions to the engineered substrate. Tiled mother wafers are themselves a composite structure consisting of a plurality of mother crystals, a handle wafer to provide mechanical support, and one or more bonding layers that provide a strong bond between the mother crystals and the handle. As previously mentioned, a key element to this invention is that the boundaries [i.e. seam regions] separating each of the tile regions are precisely spatially positioned such that devices can be efficiently positioned with respect to the seam regions to avoid excessive yield losses or process variability that would result from seam position variation.

In some embodiments, an epitaxial growth process is used to deposit crystalline semiconductor device layers overlaying the seed layer of the engineered substrate. In some embodiments of the present invention, the engineered substrate technology is combined with a subsequent device fabrication process wherein the epitaxially formed gallium and nitrogen containing devices layers are transferred to a carrier wafer for the fabrication of the final semiconductor device structures. The method and material process for fabricating laser diodes or other gallium and nitrogen containing devices using this transfer technology is shown in U.S. Pat. Nos. 9,666,677 and 9,379,525, and is filed by one of inventors of this application.

BRIEF DESCRIPTION OF THE FIGURES

The following drawings are merely examples for illustrative purposes according to various disclosed embodiments and are not intended to limit the scope of the present invention.

FIG. 3 is a schematic representation of the process flow for growth of epitaxial layers on an engineered substrate containing a selective release layer. The engineered substrate consists of a carrier wafer 303 overlaid by one or more layers 302 comprising at least a bonding layer and overlaid by a gallium and nitrogen containing seed layer 301. The engineered substrate is loaded into the epitaxial growth chamber and growth of AlInGaN material is initiated. A buffer layer 304 is grown which separates the regrowth interface from the device layers. Finally, one or more device layers 305 are grown.

FIG. 4 is a schematic representation of the process for preparing an engineered substrate using a lateral overgrowth process.

FIG. 5 is a schematic representation of the process for preparing a device wafer for the die expansion process consisting of epitaxial layers grown on an engineered substrate prepared using lateral epitaxial overgrowth.

FIG. 6 is a schematic representation of the process for preparing a device wafer for the die expansion process consisting of epitaxial layers grown on an engineered substrate prepared using an included selective release layer.

FIG. 7 is a schematic representation of the process for preparing a tiled engineered substrate from one or more mother crystals.

FIG. 8 is a schematic representation of the process for preparing a tiled engineered substrate from multiple smaller area mother crystals.

FIG. 9 is a schematic representation of the process for preparing a tiled engineered substrate from a tiled mother crystal.

FIGS. 10a and 10b are schematic representations of example configurations of seed layer configurations for tiled engineered substrates according to embodiments of this invention.

FIG. 11 is a schematic representation of example laser diode structures in accordance with embodiments of this invention. A first epitaxial structure 1101 grown on an engineered substrate incorporating a selective release layer in the engineered substrate. A second epitaxial structure 1102 grown on an engineered substrate incorporating an epitaxially grown selective release layer in the epitaxial structure.

FIG. 13a is a cross-sectional view of a laser device formed on an electrically conductive engineered substrate according to an embodiment of the present invention.

FIG. 13b is a cross-sectional view of a laser device formed on a an engineered substrate using a top-side, n-type electrical contact according to an embodiment of the present invention.

FIG. 14 is a schematic diagram illustrating a chip on submount (CoS) based on a conventional laser diode formed on engineered substrate technology according to an embodiment of the present invention.

FIG. 15 is a simplified diagram illustrating a process of preparing an epitaxial wafer according to some embodiments of the present invention.

FIG. 16 is a schematic diagram illustrating a process comprised of first forming the bond between an epitaxial material formed on the gallium and nitrogen containing substrate and then subjecting a sacrificial release material to the PEC etch process to release the gallium and nitrogen containing substrate according to some embodiments of the present invention.

FIG. 17 is a schematic diagram illustrating the configuration of epitaxial layers on an engineered substrate to enable epitaxial release by photoelectrochemical etching of an epitaxial selective release layer.

FIG. 18 is a schematic representation of the die expansion process with selective area bonding according to some embodiments of the present invention.

FIG. 19 is an example of a processed laser diode cross-section according to an embodiment of the present invention.

FIG. 20 is a schematic diagram illustrating a chip on submount [CoS] laser device based on lifted off and transferred epitaxial gallium and nitrogen containing layers according to an embodiment of this present invention.

DETAILED DESCRIPTION

Figure 1:
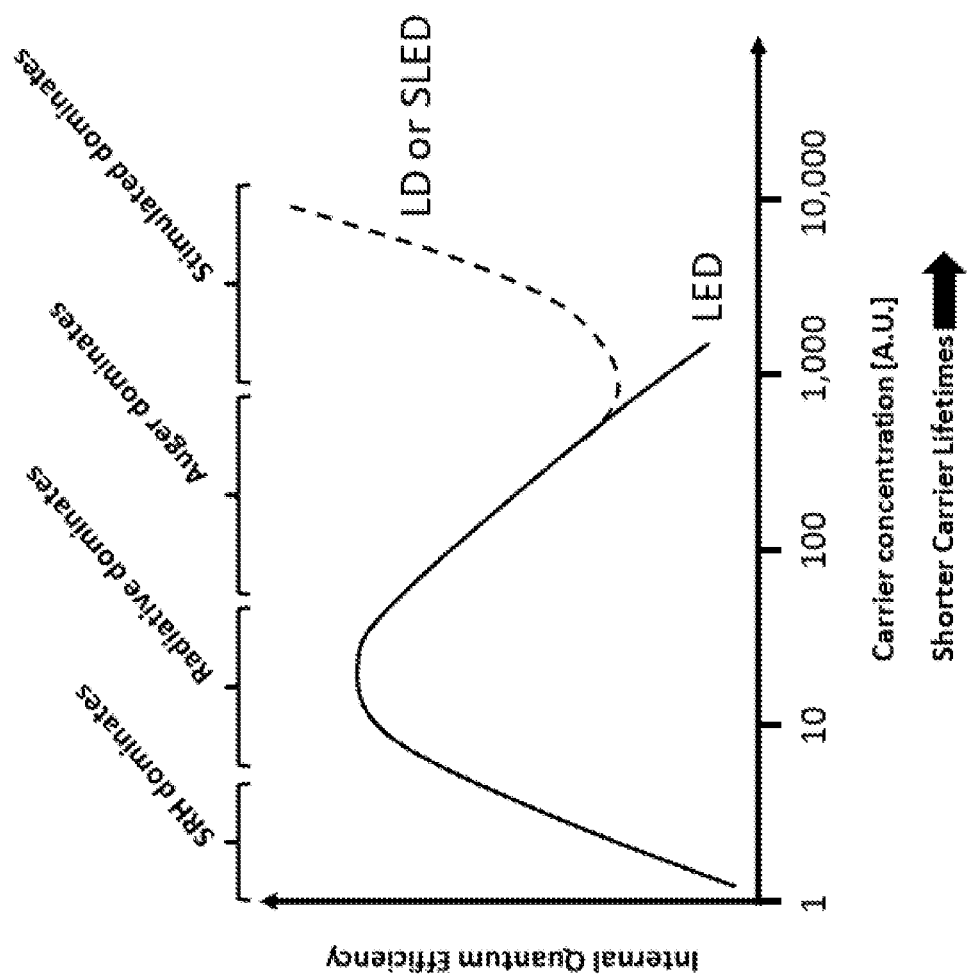
FIG. 1 is a schematic diagram showing dependence of internal quantum efficiency in a laser diode on carrier concentration in the light emitting layers of the device.
Figure 2:
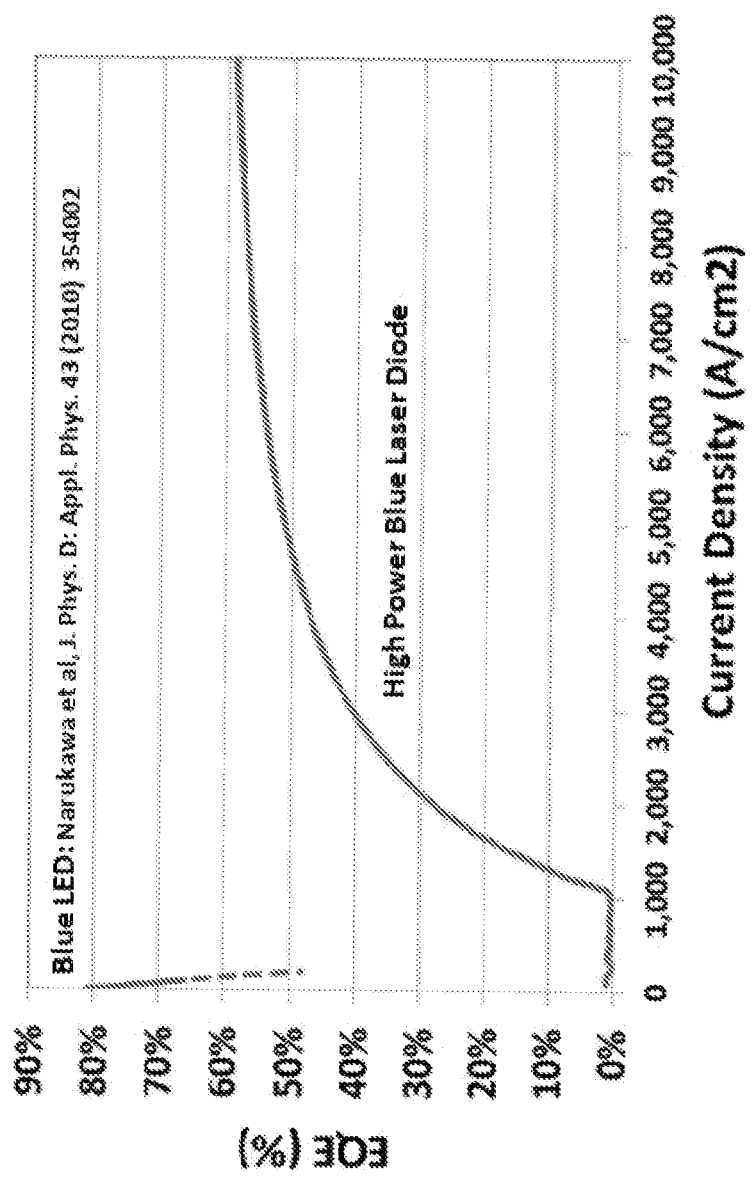
FIG. 2 is a plot of external quantum efficiency as a function of current density for a high-power blue laser diode compared to the high power blue light emitting diode.

The present invention provides a method and structure for producing large area gallium and nitrogen engineered substrate members configured for the epitaxial growth of layer structures suitable for the fabrication of high-performance semiconductor devices. In a specific embodiment the engineered substrates are used to manufacture gallium and nitrogen containing devices based on an epitaxial transfer process wherein as-grown epitaxial layers are transferred from the engineered substrate to a carrier wafer for processing. In a preferred embodiment, the gallium and nitrogen containing devices are laser diode devices operating in the 390 nm to 425 nm range, the 425 nm to 485 nm range, the 485 nm to 550 nm range, or greater than 550 nm. Merely by examples, the invention provides a cost effective method and structure to manufacture laser diodes in applications such as display systems, laser based lighting systems including remote and integrated smart laser lighting devices and methods, spatially dynamic lighting devices and methods, LIDAR, LiFi, and visible light communication devices and methods, and various combinations of above in applications of general lighting, commercial lighting and display, automotive lighting and communication, defense and security, industrial processing such as welding, cutting, and 3D printing of various materials, and internet communications, and others As background, while LED-based light sources offer great advantages over incandescent based sources, there are still challenges and limitations associated with LED device physics. The first limitation is the so called "droop" phenomenon that plagues GaN based LEDs. The droop effect leads to power rollover with increased current density, which forces LEDs to hit peak external quantum efficiency at very low current densities in the 10-200 A/cm$^2$ range. FIG. 1 shows a schematic diagram of the relationship between internal quantum efficiency [IQE] and carrier concentration in the light emitting layers of a light emitting diode [LED] and light-emitting devices where stimulated emission is significant such as laser diodes [LDs] or super-luminescent LEDs. IQE is defined as the ratio of the radiative recombination rate to the total recombination rate in the device. At low carrier concentrations Shockley-Reed-Hall recombination at crystal defects dominates recombination rates such that IQE is low. At moderate carrier concentrations, spontaneous radiative recombination dominates such that IQE is relatively high. At high carrier concentrations, non-radiative auger recombination dominates such that IQE is again relatively low. In devices such as LDs or SLEDs, stimulated emission at very high carrier densities leads to a fourth regime where IQE is relatively high. FIG. 2 shows a plot of the external quantum efficiency [EQE] for a typical blue LED and for a high-power blue laser diode. EQE is defined as the product of the IQE and the fraction of generated photons that are able to exit the device. While the blue LED achieves a very high EQE at very low current densities, it exhibits very low EQE at high current densities due to the dominance of auger recombination at high current densities. The LD, however, is dominated by stimulated emission at high current densities, and exhibits very high EQE. At low current densities, the LD has relatively poor EQE due to re-absorption of photons in the device. Thus, to maximize efficiency of the LED based light source, the current density must be limited to low values where the light output is also limited. The result is low output power per unit area of LED die [flux], which forces the use large LED die areas to meet the brightness requirements for most applications. For example, a typical LED based light bulb will require 3 mm$^2$ to 30 mm$^2$ of epi area.

A second limitation of LEDs is also related to their brightness, more specifically it is related to their spatial brightness. A conventional high brightness LED emits ~1 W per mm$^2$ of epi area. With some advances and breakthrough perhaps this can be increased up to 5-10× or 5-10 W per mm$^2$ of epi area. Finally, LEDs fabricated on conventional c-plane GaN suffer from strong internal polarization fields, which spatially separate the electron and hole wave functions and lead to poor radiative recombination efficiency. Since this phenomenon becomes more pronounced in InGaN layers with increased indium content for increased wavelength emission, extending the performance of UV or blue GaN-based LEDs to the blue-green or green regime has been difficult.

An exciting new class of solid-state lighting based on laser diodes is rapidly emerging. Like an LED, a laser diode is a two-lead semiconductor light source that that emits electromagnetic radiation. However, unlike the output from an LED that is primarily spontaneous emission, the output of a laser diode is comprised primarily of stimulated emission. The laser diode contains a gain medium that functions to provide emission through the recombination of electron-hole pairs and a cavity region that functions as a resonator for the emission from the gain medium. When a suitable voltage is applied to the leads to sufficiently pump the gain medium, the cavity losses are overcome by the gain and the laser diode reaches the so-called threshold condition, wherein a steep increase in the light output versus current input characteristic is observed. At the threshold condition, the carrier density clamps and stimulated emission dominates the emission. Since the droop phenomenon that plagues LEDs is dependent on carrier density, the clamped carrier density within laser diodes provides a solution to the droop challenge. Further, laser diodes emit highly directional and coherent light with orders of magnitude higher spatial brightness than LEDs. For example, a commercially available edge emitting GaN-based laser diode can reliably produce about 2 W of power in an aperture that is 15 µm wide by about 0.5 µm tall, which equates to over 250,000 W/mm$^2$. This spatial brightness is over 5 orders of magnitude higher than LEDs or put another way, 10,000 times brighter than an LED.

Based on essentially all the pioneering work on GaN LEDs, visible laser diodes based on GaN technology have rapidly emerged over the past 20 years. Currently the only viable direct blue and green laser diode structures are fabricated from the wurtzite AlGaInN material system. The manufacturing of light emitting diodes from GaN related materials is dominated by the heteroepitaxial growth of GaN on foreign substrates such as Si, SiC and sapphire. Laser diode devices operate at such high current densities that the crystalline defects associated with heteroepitaxial growth are not acceptable. Because of this, very low defect-density, free-standing GaN substrates have become the substrate of choice for GaN laser diode manufacturing. Unfortunately, such bulk GaN substrates are costly and not widely available in large diameters. For example, 2" diameter is the most common laser-quality bulk GaN c-plane substrate size today with recent progress enabling 4" diameter LED quality, which are still relatively small compared to the 6" and greater diameters that are commercially available for mature substrate technologies. Further details of the present invention can be found throughout the present specification and more particularly below.

Beyond the conventional c-plane bulk GaN substrate technology, a new class of substrate orientations are emerging based on the promise and demonstration of improved performance, improved reliability, and potential for lower cost manufacturing. Specifically, these new orientations described as nonpolar and semipolar offer fundamental physics benefits over c-plane that results from the eliminated or reduced piezo and spontaneous electric fields within the crystal that plagues conventional c-plane (i.e. polar) gallium nitride orientations. The reduced internal electric fields improves the electron-hole overlap and increases the radiative recombination efficiency in light emitting devices such as laser diodes and LEDs, which in turn, can improve the overall performance and efficiency of the device. Specifically, in laser diode devices, the improved radiative efficiency can increase the overall gain of the laser diode to enable lower threshold current densities for reduced operating current and voltage. Moreover, with the elimination or mitigation of these internal fields present on c-plane GaN, a greater design space is afforded for the epitaxial layer structure comprising the claddings, waveguide, and active regions of the laser diodes, which can further enable improved performance, reliability, and manufacturing throughput. Some example nonpolar and semipolar orientations include the nonpolar m-plane or a-plane, and semipolar orientations such as the {30-31}, {20-21}, {30-32}, {11-22}, {10-11}, {30-3-1}, {20-2-1}, {30-3-2}, or offcuts of any of these polar, nonpolar, and semipolar planes within +/−10 degrees towards a c-plane, and/or +/−10 degrees towards an a-plane, and/or +/−10 degrees towards an m-plane.

Although these specialized semipolar/nonpolar gallium nitride orientations can offer a strong improvements over conventional orientations with respect to performance, reliability, and throughput/cost, the widespread development and deployment is constrained by the availability of substrates with large area, high quality, and reasonable cost. Specifically, high quality nonpolar and semipolar bulk GaN substrates today are only available through the growth of large boules of c-direction oriented gallium nitride, which is then cross cut into the nonpolar or semipolar orientations. Bulk boule growth is typically achieved with hydride vapor phase epitaxy (HVPE) or variants of ammonothermal growth, which tend to perform better when growth is performed in the c-direction. Since high-quality boule growth is limited from about 2 mm to about 10 mm in the c-direction, the resulting cross-cut nonpolar or semipolar substrates will have a projection of c-direction size constraint of about 2 mm to about 10 mm. The net outcome are high quality nonpolar and semipolar substrates that are limited in size from about 1 cm2 to about 4 cm2, which is drastically less area than that of a 2" substrate with about 20 cm2 of area. High volume manufacturing of low cost semiconductor devices such as laser diodes and LEDs on small substrates is challenging and even prohibitive due to the high amount of edge/exclusion zone, the difficulty handling small pieces, the challenge associated with moving 10-20 more wafers through the fabrication process, the incompatibility of small wafers with high volume process equipment and tooling, and the generally high per area cost for the specialized substrates.

Although approaches to large area nonpolar and semipolar substrate growth are under development, they presently suffer from severe drawbacks that keep them from commercial availability and high demand. One such drawback is reduced quality in the form a high density of crystal defects such as basal plane stacking faults that can be harmful to device performance. In other approaches, bulk growth techniques are combined with the tiling of high-quality small-area-nonpolar or semipolar substrate components to create a large-area mosaic substrate. large area. This approach leads to boundary regions, or seams, between the high-quality, small-area tiled substrate regions. One drawback to this method is the often irregular spacing and placement of the seams. This poses difficulty with placement of devices during the fabrication process and can lead to excessive yield losses. Another challenge associated with this process is that the subsequent bulk growth on the large area mosaic substrate often leads to crystal defects such as basal plane stacking faults.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero). Of course, there can be other variations, modifications, and alternatives.

As used herein, the term engineered substrate and composite substrate are used interchangeably. In general, epitaxial substrates are monolithic wafers comprised by a single orientation and crystal structure of a single composition of a crystalline material. The substrate surface on which epitaxial growth is performed provides an exposed crystalline plane of the substrate material that acts as a template for determining the orientation and crystal structure of the epitaxially grown layers. In many cases for group III-Nitride crystal growth the substrate has a different composition and crystal structure from the III-Nitride epitaxial film, but similar crystal symmetry and lattice constants that enable growth of low defect density group III-Nitride epitaxial films. Even in the case of epitaxial growth on bulk group III-Nitride substrates, most of the substrate is not directly involved with epitaxial growth and only ensures the substrate is sufficiently stiff and strong enough to survive the epitaxial growth process. An engineered or composite substrate is composed of a plurality of layers characterized by difference in one or more of composition, crystal structure, and crystal orientation. Epitaxial growth on an engineered substrate is enabled by the inclusion of a high-quality, crystalline seed layer upon which epitaxial layers grow and from which they take their crystal structure and orientation. As used herein, the terms crystalline seed layer, epitaxial seed layer and seed layer are interchangeable. The remainder of the engineered substrate is comprised by one or more layers of materials with different composition or microstructure from the seed layer, and which can ensure the substrate is stiff and strong while providing some advantage over the seed layer material such as reduced cost, large available crystal sizes, improved electrical properties, and the like.

FIG. 3 shows a schematic representation of the process flow for growth of epitaxial layers on an engineered substrate containing a selective release layer. The engineered substrate consists of a carrier wafer 303 overlaid by one or more layers 302 overlaid by a gallium and nitrogen containing seed layer 301. The layers 302 comprise at least one layer that is a bonding layer but may contain other layers such as selective release layers. The engineered substrate is loaded into the epitaxial growth chamber and growth of AlInGaN material is initiated. A buffer layer 304 is grown which separates the regrowth interface from the device layers. Finally, one or more device layers 305 are grown.

In an embodiment, the seed layer of the engineered substrate is a thin GaN layer of thickness between 10 and 1000 nanometers. This GaN seed layer is comprised by a surface region oriented in either a polar, semipolar, or non-polar configuration. In some embodiments, the GaN seed layer is derived from a low defectivity, single crystal GaN crystal with a threading dislocation density below 5e-6 dislocations per square centimeter. In some embodiments, the seed layer is ≤10 microns thick. In other embodiments, the seed layer is ≤100 microns thick. In some embodiments, the seed layer is comprised by a plurality of crystalline film regions.

In another embodiment, the seed layer of the engineered substrate is a thin silicon layer of thickness between 10 and 1000 nanometers. This silicon layer is comprised by a surface region oriented in a {111} direction, potentially with some intentional misorientation away from {111} by an angle less than 10 degrees.

In another embodiment, the seed layer of the engineered substrate is a thin layer of a hexagonal polytype of SiC with of thickness between 10 and 1000 nanometers. This SiC layer is comprised by a surface region oriented in a {0001} direction, potentially with some intentional misorientation away from {0001} by an angle less than 10 degrees.

In another embodiment, the seed layer of the engineered substrate is a thin layer of a sapphire with a thickness between 10 and 1000 nanometers. This sapphire layer is comprised by a surface region oriented in a {0001} direction, potentially with some intentional misorientation away from {0001} by an angle less than 10 degrees.

In another embodiment, the seed layer of the engineered substrate is a thin layer of III-V semiconductor alloy with a composition of $Al_xIn_yGa_{(1-x-y)}As_zP_{(1-z)}$ where $0 \leq x+y \leq 1$ and $0 \leq z \leq 1$.

The seed layer is disposed on a handle wafer which is, herein, also called a handle substrate or mechanical handle wafer or substrate. The purpose of the handle substrate is to provide physical support for the crystalline seed layer, which is too thin to be ridged. The handle wafer material is chosen to provide a ridged support for the thin sacrificial and seed layers. It need not have the same composition nor crystal structure as the epitaxially grown device layers, nor does it need to be single crystalline nor even crystalline. Preferred properties of the handle wafer are that it is solid and ridged at temperatures associated with growth of the device layers. For MBE this would be up to 900° C. or more, and for MOCVD this would be up to 1200° C. or more. The handle wafer should have similar coefficient of thermal expansion as the sacrificial, seed and device layers to prevent excessive bowing or cracking during or after device layer growth. In embodiments of this invention the handle wafer material has a coefficient of thermal expansion of between 1E-6 and 1E-5. The handle wafer should neither significantly decompose in nor react with the growth environment. In MOCVD growth of GaN related alloys is frequently carried out in the presence of chemical species such as hydrogen, ammonia, hydrocarbons such as methane and ethane and with reactive metals among others.

In an embodiment of this invention, the engineered substrate handle wafer material is chosen from one of the preferred handle materials such as sapphire, AlN, polycrystalline AlN, boron nitride, SiC, polycrystalline SiC and sintered alumina. In another embodiment, the engineered substrate handle wafer material is chosen from one the less preferred handle materials such as quartz, silicon, polycrystalline silicon, molybdenum and tungsten among others.

In some embodiments, the engineered substrate contains a selectively removable selective release layer. The selective release layer, or selective release layer, is a layer comprised of a material that is selectively removable either by chemical etching or by exposure to an energy source such as optical radiation or heat. In some embodiments, the selectivity of the removal process for the selective release layer relative to the other layers in the engineered substrate and the epitaxial layers is very large such that only the selective release layer is significantly removed. In other embodiments, the layers of materials highly resistant to the removal process are disposed above and below the selective release layer or layers. Other layers in the structure with lower selectivity to the removal process are protected by passivating coatings.

In an embodiment, the selective release layer is composed of silicon oxide or silicon nitride and is selectively removable by chemical etching with acid mixtures containing HF acid. In another embodiment, the selective release layer is composed of semiconductor material such as germanium and is selectively removable using chemical etching with mixtures containing hydrogen peroxide. In another embodiment, the selective release layer is composed of a metal such as titanium which can be etched with chemical mixtures containing HF acid. Other combinations of selective release layers and removal chemistries are possible, with the key feature being that the selective release layer is removable with high selectivity relative to the overlaid epitaxial device layers. In a preferred embodiment the selectivity of removal of the selective release layer would also be high relative to the handle wafer material, but this is not necessary.

In an embodiment, the selective release layer is composed of silicon dioxide and has a thickness less than 10 micrometers. Most preferably, the oxide thickness is between 100 and 1000 nm. Thinner than 100 nm and lateral etch rates with acid solutions containing HF may require long times to fully etch the silicon oxide layer. Much thicker and residual stress in the oxide layer may result in wafer bowing during or after growth of the epitaxial device layers.

In some embodiments, the bonding and selective release layers of the engineered substrate are the same layer. For example, a selective release layer can be comprised of one or more silicon dioxide layers used to bond the seed layer to the handle wafer. The oxide bonding layers can be selectively removed, relative to the seed and handle layers, using acid solutions containing HF acid.

In some embodiments, the selective release layer may be removed using application of an energy source such as a laser. In this case, the selective release layer is chosen to be a material that absorbs the laser preferentially to both the handle wafer of the engineered substrate as well as the epitaxial device layers. By making the selective release layer sufficiently thick relative to the absorption length of the laser light in the selective release layer material, the majority of the laser light dose would be absorbed in the selective release layer and the device layers would not be exposed to damaging intensities of laser radiation. With proper laser power and focus the selective release layer could be ablated in a process similar to the laser lift-off (LLO) process used to detach heteroepitaxial GaN layers from sapphire wafers.

In an embodiment, there is a single layer that acts as both the sacrificial and seed layers and which is made from silicon that is highly absorbing at the wavelength of a laser used to ablate or melt the Si layer to selectively remove it. The absorption length for Si for wavelengths shorter than 400 nm is below 100 nm. At 350 nm the absorption length is on the order of 10 nm. Light with a wavelength of 351 nm emitted from a XeF laser would be substantially absorbed by a Si layer with a thickness of 100 nm. Other laser sources and Si thicknesses could be chosen, as should be obvious to one knowledgeable in the art. Other appropriate selective release layers would be Ge, transparent conductive oxides such as ITO or ZnO that absorb in the ultra-violet, silicon oxides or nitrides contaminated with metal species to make them absorbing, and the like. Such a laser lift-off process could be used to form anchor features by selectively ablating some regions of the selective release layer and not others.

In some embodiments, the engineered substrate contains a bond layer that joins the crystalline seed layer to the handle wafer. In some embodiments, the bond layer is comprised of two layers which are deposited separately on both the seed layer bonding surface and the handle wafer bonding surface prior to bonding. The crystal donating the seed layer is then brought into contact with the handle wafer such that the bond layers are in contact and the bond layers are fused together through the application of one or both of elevated temperature and elevated pressure. In some embodiments the bond is formed between layers of metal or oxide using thermocompression bonding. Metal which could be used for thermocompression bonding include Au, Al, and Cu among others. In some embodiments the thermocompression bonding is improved through the application of plasma treatments to clean or chemically activate the surfaces of the metal or oxide bonding media. In some embodiments, relatively low melting point oxides [e.g. borophosphorosilicate glass, etc.] are used as the bonding media.

Thermocompression bonding involves bonding of the epitaxial semiconductor layers to the carrier wafer at elevated temperatures and pressures using a bonding media disposed between the epitaxial layers and handle wafer. The bonding media may be comprised of a number of different layers, but typically contain at least one layer (the bonding layer) that is composed of a relatively ductile material with a high surface diffusion rate. In many cases this material is comprised of Au, Al or Cu. The bonding media may also include layers disposed between the bonding layer and the epitaxial materials or handle wafer that promote adhesion. For example an Au bonding layer on a Si wafer may result in diffusion of Si to the bonding interface, which would reduce the bonding strength. Inclusion of a diffusion barrier such as silicon oxide or nitride would limit this effect. Relatively thin layers of a second material may be applied on the top surface of the bonding layer in order to promote adhesion between the bonding layers disposed on the epitaxial material and handle. Some bonding layer materials of lower ductility than gold (e.g. Al, Cu etc.) or which are deposited in a way that results in a rough film (for example electrolytic deposition) may require planarization or reduction in roughness via chemical or mechanical polishing before bonding, and reactive metals may require special cleaning steps to remove oxides or organic materials that may interfere with bonding.

Thermocompression bonding can be achieved at relatively low temperatures, typically below 500° C. and above 200° C. Temperatures should be high enough to promote diffusivity between the bonding layers at the bonding interface, but not so high as to promote unintentional alloying of individual layers in each metal stack. Application of pressure enhances the bond rate, and leads to some elastic and plastic deformation of the metal stacks that brings them into better and more uniform contact. Optimal bond temperature, time and pressure will depend on the particular bond material, the roughness of the surfaces forming the bonding interface and the susceptibility to fracture of the handle wafer or damage to the device layers under load.

In some embodiments, thermocompression bond media is deposited on the handle and crystal donating the seed layer in a lithographically defined pattern rather than a blanket deposition. This can be advantageous because it enables the inclusion of alignment marks into the bond media layer as well as increases the bonding pressure achievable for any given applied force.

In some embodiments, the seed layer and the handle are joined with direct wafer bonding. For example, GaN and Si can be directly bonded under vacuum at room temperature and the bond solidified by long anneals at relatively low temperature. Such bonding may include plasma treatments of the seed layer and handle surfaces to remove contaminants and native oxides. In some embodiments, GaN seed layers are bonded directly to sapphire, silicon or SiC handle wafers.

In an embodiment, the engineered substrate is fabricated by deposition silicon oxide on a handle wafer and on a bulk GaN substrate followed by Chemical-Mechanical Polishing (CMP) to reduce the roughness of the oxide layers to below 10 nm RMS such that the oxide surfaces will be in intimate contact when brought together. This is followed by an ion implantation of atoms of one or more elements, such as hydrogen and helium among others, at a shallow depth of less than 1 micron into the bulk GaN substrate such that the implanted species are concentrated at a narrow range of depth in the GaN wafer. The oxide surfaces of the handle and GaN wafer are then brought into contact and bonded at elevated temperature and pressure to produce a stable bond. A second anneal at a further elevated temperature induces the implanted species to come out of solid solution in the GaN wafer, thereby initiating microfracture of the GaN at the depth of the implantation. This microfracture releases the layer of GaN above the implantation depth and results in the formation of an engineered substrate consisting of the released layer of GaN overlaying the bonding oxide, which overlays the handle wafer. In this embodiment, the GaN layer acts as the seed layer for growth of epitaxial device layers, while the bonding oxide may be used as a selective release layer, which can be selectively etched using solutions containing HF acid.

In another embodiment, the engineered substrate is fabricated by deposition of silicon oxide on a handle wafer and on a bulk seed wafer consisting of GaN, Si, SiC or sapphire, among other materials, and use of Chemical-Mechanical Polishing (CMP) to reduce the roughness of the oxide layers to below 10 nm RMS such that the oxide surfaces will be on the whole in intimate contact when brought together. The oxide surfaces of the handle and seed wafer are then brought into contact and bonded at elevated temperature and pressure to produce a stable bond. The seed wafer is then partially removed using an etch or lap and polish process such that only a thin seed layer of less than 10 microns and preferably less than 1 micron remains overlaying the bonding oxide. This method is less preferable, as it requires destructive removal of the bulk of the bulk seed wafer, which could be an expensive process in terms of time as well as lost seed wafer material should the seed layer be composed of an expensive material such as GaN or SiC.

In another embodiment, the engineered substrate is fabricated by deposition of a mask material on a bulk GaN wafer or a GaN template consisting of a GaN layer grown heteroepitaxially on a foreign substrate such as Si, SiC, sapphire, gallium oxide or the like as shown in FIG. 4. The engineered substrate consists of a first substrate wafer 401 which can be either a bulk GaN wafer, a heterogeneous substrate wafer [e.g. composed of some material other than group II nitrides], or one or more group III Nitride films grown heteroepitaxially on a substrate wafer. A discontinuous layer of mask material 402 is overlaid on the surface of the substrate. The mask material is selected to prevent nucleation of nitride material during subsequent growth. Group III nitride material 403 is then grown up through the apertures in the mask material layer. Growth conditions are then changed to encourage lateral growth such that a laterally grown member 404 of the second group III nitride layer overgrows the mask material. Extended defects, such as threading dislocations produced by lattice size mismatch between GaN film and substrate are isolated to the window region of the overgrowth mask. In this schematic the lateral members of adjacent group III nitride regions are shown joining at a so-called coalescence front 405 or interface to form a continuous film of nitride semiconductor. In some embodiments, the overgrown semiconductor regions do not coalesce.

The overgrowth mask could consist of any material on which GaN or related alloys do not readily nucleate during epitaxial growth. For example, silicon nitride and silicon oxide are frequently used as overgrowth masks because under specific growth conditions the nucleation of nitride alloys on these materials can be suppressed. Thus, new material is only deposited on exposed seed wafer material or on previously grown nitride material that is not overlaid with mask material. Other overgrowth mask materials used include metals such as Ti and W as well as metal containing ceramic films such as TiN. Overgrowth mask thicknesses are limited by a minimum value limited by that needed to ensure the mask layer is continuous upon deposition and remains continuous should the mask material decompose under typical growth conditions. The upper limit of mask thickness is set by practical aspects of growth, i.e. one would not want an excessively thick mask as it would add extra time the growth process associated with the initial vertical growth of nitride material in the non-masked regions.

The shape of the overgrowth mask regions could be adjusted to correspond to the regions needed to form the optoelectronic device. For example, a substrate intended for a multi-mode laser with stripe widths of 30 microns could have overgrowth mask regions in the shape of 40 micron wide stripes of many millimeters in length. The width of the regrowth mask in excess of the laser stripe width would be needed to accommodate errors in alignment of transfer and lithographic processes. In the example of a single mode laser, where ridge widths are on the order of 1 to 3 microns the width of the overgrowth mask region would be dominated by the excess area needed to accommodate alignment errors in transfer and lithographic processes. For example, combinations of overgrowth mask widths and laser ridge widths could respectively be 10 microns and less than 3 microns, 20 microns and less than 13 microns, 30 microns and less than 23 microns, 40 microns and less than 33 microns and so forth.

In order to produce die suitable for die expansion on such a substrate, device layers are then grown on the wafer and may be initiated with the growth of one or more so-called buffer layers that do not add functionality to the device but rather are grown under conditions or with compositions that promote growth of smooth, low defect density or otherwise higher quality device layers than would be achieved without the buffer layers. As shown in FIG. 5, the engineered substrate consists of a first substrate wafer 501, a mask material that defines the laterally overgrown regions and the overgrown group III Nitride film 504 which overlays the mask material. Buffer layers 505 which do not necessarily benefit the operation of the device but improve regrowth quality are grown epitaxially on the engineered substrate followed by device layers 506. The finished device wafer, consisting of the first substrate 501, the mask layer 502, the overgrown group III Nitride 504, the epitaxial buffer layers 505 and the epitaxially grown device layers 506, is patterned using a lithographically defined mask and an etch process to form vias 507 which expose the edges of the overgrown mask layer. Bond media 508 is deposited on the tops of the mesas. In some embodiments, the bond media is deposited before the mesas are formed. Finally, a selective removal process is used to remove the exposed mask material 502. Not shown are lithographically defined features designed to retain the mesas on the engineered substrate before bonding to a carrier wafer.

In an embodiment, the mask layer is composed of silicon oxide, silicon nitride or silicon oxynitride with a thickness between 10 and 10000 nm, though thicker masks would be functional if not ideal. The selective removal process includes one or more of etching in acidic solution containing HF acid, etching in HF vapor or a dry etching in a fluorine-based plasma.

In another embodiment, the mask layer is composed of titanium oxide with a thickness between 10 and 10000 nm, though thicker masks would be functional if not ideal, and the selective removal process includes etching in one or more of solutions containing phosphoric acid, sulfuric acid and HF acid.

In another embodiment, the mask layer is composed of aluminum oxide with a thickness between 10 and 10000 nm, though thicker masks would be functional if not ideal, and the selective removal process includes etching in one or more of solutions containing ammonium hydroxide and peroxide, bromine in alcohol and phosphoric acid.

In another embodiment, a multi-layer mask is used. For example, a mask may consist of a sacrificial germanium layer overlaid by a silicon oxide layer acting as a selective deposition mask. The silicon oxide provides a surface with a low tendency for GaN to nucleate on during MOCVD growth and which can be more easily overgrown with GaN. The Ge layer allows for the die to be undercut using a peroxide based etch that selectively removes the Ge. This would be a preferred embodiment in the case where the bond medium is also an oxide or contains an oxide, and selective etching of the oxide mask would also remove the bond medium. Other multi-layer mask combinations might include silicon nitride as the selective deposition mask and may contain sacrificial under-layers composed of titanium, gold, silicon, aluminum, chrome, tungsten, molybdenum, platinum, silver, copper and palladium among other materials. In general, the sacrificial under-layer would need to be sufficiently thick 10-1000 nm as to allow rapid removal of the selective release layer. At the same time, the sacrificial under-layer material may be one on which nitride materials nucleate easily, such that too thick an under-layer would lead to nucleation of a region of misoriented or highly defective nitride material on the sidewall of the under-layer.

In an embodiment, a Ge under-layer is overlaid with a silicon oxide overgrowth mask layer using a photoresist mask and a lift-off process. The Ge thickness is kept between 100 and 500 nm. In another embodiment, the Ge under-layer is deposited and then overlaid by the silicon oxide overgrowth mask layer using a photoresist mask and a lift-off process. The Ge underlayer is then selectively etched with hydrogen peroxide such that the edge of the Ge layer is recessed beneath the edge of the silicon oxide layer, thereby reducing the access of precursors to the Ge and encouraging nucleation on the exposed seed material only. In another embodiment, the Ge under-layer and the silicon oxide overgrowth mask layer are deposited as blanket layers without patterning. Photoresist is patterned on the surface and acts as an etch mask to first etch back the silicon oxide using a wet or dry etch process. The Ge underlayer is then selectively etched with hydrogen peroxide such that the edge of the Ge layer is recessed beneath the edge of the silicon oxide layer. Acceptable dry etches for silicon oxide include reactive ion etching [RIE], inductively couple plasma [ICP] etching, chemically assisted ion beam etching [CAIBE] and the like. Dry etch reactive species for silicon oxide include fluorine containing species such as CF4, CHF3, C4F8, SF6, and the like, and may include use of inert gasses such as Ar and He along with other reactive species such as oxygen containing species like O2 and NO2 among others.

In another embodiment a selective release layer and overlaying seed layer are deposited on GaN substrate using an epitaxial process or directly convert a portion of the seed wafer at or near the epitaxial surface into a selective release layer. A schematic representation of the process for producing such a substrate and fabricating parts on it is shown in FIG. 6. The engineered substrate consists of a first substrate wafer 601 which can be either a bulk GaN wafer or one or more group III Nitride films grown epitaxially on a heteroepitaxial substrate such as SiC, silicon, sapphire, etc. An included selective release layer 602 is produced such that it is overlaid by a non-selective release layer 603 which can act as a seed layer for deposition of buffer layers 604 and device layers 605 in a subsequent and separate growth operation. The device wafer is patterned using a lithographically defined mask and an etch process to form vias which expose the edges of the included selective release layer. Bond media 606 is deposited on the tops of the mesas. In some embodiments, the bond media is deposited before the mesas are formed. Finally, a selective removal process is used to remove the exposed selective release layer 602. Not shown are lithographically defined features designed to retain the mesas on the engineered substrate before bonding to a carrier wafer.

In another embodiment, a bulk GaN wafer or a GaN template comprised of a GaN layer grown epitaxially on a foreign substrate such as silicon, SiC, Sapphire or the like would be used as the mother wafer to form the engineered substrate. A first epitaxial process is used to grow a selective release layer overlaying the epitaxial surface of the seed wafer. The selective release layer is comprised of one or more sacrificial InGaN layers clad on both sides by layers of some composition of GaN, AlN, AlGaN, InAlN, or InAlGaN alloys with a wider bandgap than the composition of the sacrificial InGaN layers. A non-sacrificial seed layer of some composition of GaN, AlN, AlGaN, InAlN, or InAlGaN with a wider bandgap than the sacrificial InGaN layers is then grown overlaying the selective release layer. In an embodiment, the InGaN selective release layers are selectively etched using a photoelectrochemical etch process. In another embodiment, the InGaN layers are selectively ablated using a laser-lift-off process. In another embodiment, the InGaN selective release layers are selectively decomposed into their constituent elements by the application of heat either in the form of annealing in a furnace or rapid thermal annealer or by application of a laser operating at wavelengths absorbed by the sacrificial InGaN layers.

In another embodiment, a bulk GaN wafer is again used as a mother wafer. The selective release layer is produced via ion implantation. Ions are implanted into the GaN wafer at a shallow depth of 100-1000 nm at a high enough energy or density that the optical absorptivity of the GaN implanted layer is greatly increased. This layer then becomes susceptible to laser irradiation such that a laser lift-off process can be used to selectively remove the implanted layer prior to the die expansion process. The absorptivity of the GaN at a target laser wavelength should be increased above 1000 $cm^{-1}$, and ideally would be increased above 10000 $cm^{-1}$ to provide the strongest absorption of laser light.

It is desirable to fabricate an engineered substrate where the total area of seed layer on the engineered wafer is larger than the area of the mother wafer. This can be achieved by sequentially transferring seed layers to the same handle wafer using one or more mother wafers. Another method for achieving a larger area engineered substrate is to configure multiple mother wafers into a single, so-called tiled mother that can be used to simultaneously transfer the seed layers from the plurality of mothers.

In an embodiment, a tiled engineered substrate is fabricated using serial transfer from multiple donors. The process for this is shown in FIG. 7. The mother crystal 706 is prepared such that it comprises the non-transferred portion of the crystal 701, the transferred seed layer 702, and a layer of bonding media 703. The mother crystal 706 is positioned and brought into contact with the handle wafer 705 such that a strong bond is formed at the interface between the layers of bonding media 703 and 704. The non-transferred portion of the mother crystal 701 is then removed using a selective removal process. The second prepared mother crystal 707 is positioned and brought into contact with the handle wafer such that a strong bond is formed at the interface between the layers of bonding media. The non-transferred portion of the mother crystal is then removed using a selective removal process. A third prepared mother crystal 709 is positioned and brought into contact with the handle wafer such that a strong bond is formed at the interface between the layers of bonding media. The non-transferred portion of the mother crystal is then removed using a selective removal process. This process can be repeated for any number of mother crystals until the handle wafer is fully tiled with seed layers. After seed layers are transferred from the prepared mother crystals to the handle wafer, the mother crystals can be reclaimed and reused to transfer more seed layers to either the same handle wafer or different handle wafers.

In an embodiment, a tiled engineered substrate is fabricated using parallel transfer from multiple mother crystals. The process for this is shown in FIG. 8. A handle wafer 805 is coated with a layer of bonding media 804. The mother crystal 806 is prepared such that it comprises the non-transferred portion of the crystal 801, the transferred seed layer 802, and a layer of bonding media 803. The mother crystal 806 is positioned and brought into contact with the handle wafer such that a strong bond is formed at the interface between the layers of bonding media 803 and 804. The second prepared mother crystal 807 is positioned and brought into contact with the handle wafer such that a strong bond is formed at the interface between the layers of bonding media. A third prepared mother crystal 809 is positioned and brought into contact with the handle wafer such that a strong bond is formed at the interface between the layers of bonding media. The non-transferred portions 801 of the mother crystals are then removed simultaneously or in serial sequence using a selective removal process. After seed layers are transferred from the prepared mother crystals to the handle wafer, the mother crystals can be reclaimed and reused to transfer more seed layers to either the same handle wafer or different handle wafers.

A tiled mother wafer or crystal can be fabricated from a plurality of smaller mother crystals. This is achieved by bonding the mother crystals to a handle wafer using a bond that can survive the seed layer transfer processes. The bond can be formed either by direct wafer bonding between the mother crystal and the handle wafer at elevated temperature or pressure, or oxide-oxide bonding at elevated temperature and pressure by depositing oxide layers on the bonded surfaces of both the mother crystal and the handle wafer.

Another method for bonding mother crystals to a handle is to use thermocompression bonding of metal films deposited on the bonded surfaces of both the mother crystal and the handle wafer. Metals that can be used for thermocompression bonding include gold, silver, aluminum and copper among others. Thermocompression bonding is advantageous in that a strong bond can be formed using a material that melts at temperatures higher than the maximum process temperature of the seed layer transfer process. Indium, aluminum, silver, gold, and copper melt at approximately 157 degrees C., 660 degrees C., 961 degrees C., 1063 degrees C., and 1084 degrees C., respectively, allowing for a wide range of thermocompression bonding materials depending on the maximum temperature of the seed transfer process. Au is the preferred metal for thermo-compression bonding as it is ductile, has a high melting point, and is resistant to oxidation which can inhibit the bonding process. Bonding of mother crystals to a handle can also be achieved with the use of solders, however these are less preferable to thermocompression bonding due to the relatively low temperatures at which these materials melt. For example, Au—Sn eutectic solder widely used in the electronics industry melts at approximately 280 degrees C. Bonding of mother crystals to a handle can also be achieved with the use of nano-particle pastes. These pastes are advantageous for this application in that the melting point of many metals is dramatically reduced when the metal particle size is reduced below 100 nm diameter. This allows for a nano-particulate metal film to be melted or sintered at relatively low temperature while the melting point of the resulting quasi-bulk metal film is similar to that of a bulk metal film.

A tiled mother crystal should comprise individual mother crystals that are bonded to a handle such that their crystal structures are oriented similarly with respect to each other. Variation in the crystal orientation of the mother wafers will be translated to any engineered substrates fabricated by transferring seed material from the tiled mother crystal. Any properties of the epitaxial films grown on the engineered substrate which depend on the crystal orientation of the seed layer with therefore vary across the full area of the engineered substrate. It is preferred that the lattice vectors of the mother wafers be parallel to each other to a tolerance of 10 degrees or less. It is most preferred that the lattice vectors of the mother wafers be parallel to each other to a tolerance of 1 degree or less.

A tiled mother crystal should comprise individual mother crystals that are bonded to a handle such that the gap between the individual mother crystals is minimized. This is advantageous because in the resulting engineered substrate any gap between individual mother crystals will result in a discontinuity of the transferred seed layer. In epitaxial growth techniques such as MOCVD, where vapor-phase and surface mobilities of precursor compounds are high, gaps in the seed layer can lead to spatial variation in epitaxial layer growth rates and compositions as precursors landing on the no-seed-layer portion of the engineered substrate diffuse to the regions with seed layer leading to a local increase in precursor concentrations near the edges of the discontinuous seed layer regions.

The process for transfer of seed layers from a tiled mother wafer is shown in FIG. 9. A handle wafer 907 is coated with a layer of bonding media 906. The tiled mother crystal is prepared such that it comprises a handle wafer 901, one or more layers of bonding media 902, a plurality of prepared mother wafers 908 which comprise a non-transferred portion of the mother crystal 1503, the transferrable seed layer 904 and a layer of bonding media 905. The gap 910 between mother crystals on the tiled mother crystal is shown as having a finite size but can be of zero width. The tiled mother crystal is positioned and brought into contact with the handle wafer such that a strong bond is formed at the interface between the layers of bonding media 905 and 906. The non-transferred portions 911 of the tiled mother crystal are then removed using a selective removal process. The engineered substrate 909 now comprises the handle wafer 907, bond media layers 905 and 906, and the transferred seed layers 904.

A single transferred seed layer or plurality or transferred seed layers can be configured to have various shapes as well as to be positioned in various ways on the handle wafer. In embodiments, the transferred seed layers may have a variety of shapes such as square, rectangular, circular or round, shaped like various other polygons [triangles, hexagons, etc.], or be irregular in shape. It should also be understood that transferred seed layer regions may have substantial deviations from a nominal shape due to imperfect transfer of the seed layer. For example, a transferred seed layer may have irregular edges or may contain interior regions that are not transferred. A single transferred seed layer may be transferred at the center of a larger handle wafer or off-center, and it may be oriented in-plane in any way respective to the crystal structure or orienting features of the handle wafer. A plurality of seed layer regions may be transferred to a larger handle wafer with arbitrary positions and arbitrary in-plane orientations respective to the crystal structure or orienting features of the handle wafer. In an ideal embodiment, the plurality of seed layer regions are transferred to a larger handle wafer in a regular way that such that the seed layer locations and in-plane orientations are controlled to within some tolerance. Regular placement of transferred seed layers reduces the complexity of device fabrication after epitaxial growth.

As previously mentioned, a key element to this invention is that the boundaries [i.e., seam regions] separating each of the epitaxial seed layers in engineered substrates containing more than one crystalline seed regions are precisely spatially positioned relative to each other such that devices can be efficiently positioned with respect to the seam regions to avoid excessive yield losses or process variability that would result from seam position variation. In embodiments where more than one crystalline seed region is transferred to a handle wafer serially from one or more mother crystals the precise placement would be done during the seed transfer process steps. In embodiments where more than one crystalline seed region is transferred to a handle wafer in a single transfer process from a tiled mother crystal, the precise placement is achieved during fabrication of the tiled mother wafer.

Precision alignment of mother wafers to handle wafers can be achieved through several means. Firstly, die bonding tools can be used. Modern die bonding tools allow for micron and sub-micron scale alignment tolerances and can exert force and elevated temperatures on mother wafers and handles in the ranges needed for thermocompression bonding. After initial placement of the mother wafers, secondary bonding steps can be carried out using less precise but higher force and temperature bonding tools. For lower precision placements, precision jigs or alignment plates can be manufactured using precision machining or 3D printing. These jigs would overlay the handle wafer and constrain where mother wafers could be placed.

FIGS. 10a and 10b show several example configurations. In an embodiment, a handle wafer 1001 is populated with a plurality of transferred seed layer regions 1002 to form an engineered substrate 1000. The seed layer regions are rectangular and are arrayed in a rectangular grid with additional seed regions added at the top and bottom of the grid to increase the fill factor of the handle wafer surface. The gaps between the seed regions 1003 and 1004 are shown as having finite width, though in an ideal case these gaps would be reduced to zero width. In another embodiment, a handle wafer 1006 is populated with a plurality of transferred seed layer regions 1007 to form an engineered substrate 1005. The gaps between the seed regions 1008 and 1009 are shown as having finite width, though in an ideal case these gaps would be reduced to zero width. In this configuration, the seed layers are rectangular and are arrayed in a rectangular grid and are transferred from a tiled mother wafer with larger lateral extent than the carrier wafer 1006 such that the handle wafer is fully tiled with seed layers except for the gaps between seed regions and an exclusion region 1010 around the perimeter of the handle wafer. In another embodiment, a handle wafer 1012 is populated with a plurality of transferred seed layer regions 1013 that are round to form an engineered substrate 1005. In this configuration the seed layers are configured in a hexagonal grid, however a square or rectangular grid would also work.

In another embodiment, shown in FIG. 10b, a constellation of contiguous seed layers 1014 is shown. The seed layers have rectangular shape but vary in dimensions. A regular array of die shot regions 1016 are determined, which correspond to the area on the engineered substrate where devices will be fabricated using lithography. The gaps between die shot regions 1018 and 1019 have a finite width determined by the dimensions of the die shot regions and the first pitch 1020 and second pitch 1021 of the regular array. The seed layers are configured such that the edges of the seed layers are located within the exclusion zones outside of the die shot regions. This can also be characterized as being located within some predetermined distance of a regular rectangular grid corresponding to the centerlines of the exclusion areas. This configuration has the advantage of maximizing coverage of an engineered substrate with seed layer area while not overly constraining the size distribution of seed layers used in forming the substrate. In any two-dimensional tiling of mother wafers with a finite size distribution, there are likely to be regions not covered by seed layer 1017. In some embodiments, the mother crystals donating the seed layers are trimmed using precise methods such as dicing saws or laser scribe and break processes to narrow the distribution of mother crystal sizes. This will enable shrinking the exclusion widths 1018 and 1019 as well as reducing the total area of uncovered regions 1017.

In some embodiments, precise alignment is achieved by use of die bonding equipment to align mother wafers to either the engineered wafer handle or the tiled mother handle wafer. In some embodiments, jigs are used to locate mother wafers prior to bonding to either the engineered wafer or tiled mother wafer handles. In some embodiments, lithographically defined alignment marks are produced on both the mother wafers and the handle wafers to precise alignments, especially when used in combination with die attach tools, with tolerances of a few microns to ≤100 microns. In some embodiments, a self-aligned process is achieved by patterning the bonding layer on the handle wafer such that it has self-aligning features. Such self-alignment features include forming pockets in the bond layer of the handle wafer that are similar in size and shape to the mother crystals.

In an embodiment, the epitaxial seed regions of a tiled engineered substrate are configured in a pre-determined arrangement where the relative positions of the edges of the epitaxial seed regions as well as the gaps between epitaxial seed regions are controlled and known to within a tolerance of ≤±1 mm.

In some embodiments, the mother crystals are reclaimed and reused to transfer additional seed layers to additional handle wafers. The purpose of the reclaim is to planarize the mother wafer surface, restore the surface roughness to its original value, remove any non-transferred sections of the previously transferred seed layer, and remove any sub-surface defects that may have been introduced by the seed-layer transfer process. This reclaim may include lapping, polishing and chemical-mechanical polishing [CMP] of the mother crystal to restore the transferred surface to an atomically flat, low-defect state. This reclaim may include wet chemical cleans including solvent cleans with ethanol, methanol, isopropanol, acetone, and chlorinated solvents among others. This reclaim may include wet chemical etches such as with HCl, nitric acid, aqua regia, combinations of sulfuric acid and hydrogen peroxide, HF acid, buffered oxide etchant, and the like to remove foreign elements from the transferable surface of the mother crystal. In some embodiments, the reclaim may involve removal of tiled mother crystals from their handle and remounting to the same or a different handle.

Crystal polishing, such as with very small diameter diamond or SiC slurries car result in optically flat surfaces and can be effective as an intermediate step in reducing the roughness of a mother crystal surface after transfer of a seed layer. However, the relatively large particle size on the order of 1 micron or larger and hardness of these media can often result in the creation of scratches on the surface of a crystal and extended defects buried beneath the surface of a crystal. Should such a treated mother crystal be used for a second transfer of a seed layer, the scratches and sub-surface defects may be transferred along with the seed layer and be replicated in epitaxial films grown on the seed layer. To ensure scratches and sub-surface damage is minimized during reclaim of mother crystals, CMP should be used. CMP utilizes a chemical process, such as oxidation, to alter the composition of a crystal surface such that it is more easily removed by a soft polishing media. In an embodiment, the CMP GaN mother crystals are reclaimed using a CMP media comprised by colloidal silica with particle diameters less than or equal to 500 nm and preferably less than 100 nm. The CMP slurry has a pH value higher than 7, with optimal value typically being above 8 and optimal value depending on the orientation and composition of the crystal surface undergoing CMP. CMP polished reclaimed surfaces should have a root-mean-square [RMS] roughness less than 10 nm and preferably less than 2 nm. CMP polished reclaimed surfaces should in 100 nm of crystal thickness nearest the surface have $\leq 5E6$ $cm^{-3}$ dislocations introduced by the polishing process.

In an embodiment, semi-polar GaN mother crystals are cross-cut from a [0001] oriented GaN boule grown by hydride vapor phase epitaxy [HVPE] or ammonothermal growth. The resulting mother crystals have a first and second surfaces, which are substantially parallel to each other, and which are oriented as a non-polar or semi-polar plane among others. The first and second surfaces have lateral dimensions of <20 mm in a first in-plane direction parallel to the projection of the [0001] direction onto the surface of the mother crystal and <50 mm in a second in-plane direction perpendicular to the first direction. Preferably the tolerance of the lateral dimensions of the mother crystals is plus or minus ≤100 microns. More preferably, the tolerance is plus or minus ≤50 microns. Most preferably the tolerance is plus or minus ≤20 microns. The mother crystals have a thickness corresponding to the distance between the first and second surfaces of between 0.1 mm and 10 mm. The first and second surfaces are lapped and polished to achieve surface roughness of less than 50 nm RMS. The first surface of each mother crystal is patterned lithographically, and Au is deposited on the crystal surface in a pattern that includes alignment and fiducial marks. A handle wafer is provided which is also configured with a lithographically patterned Au bonding layer that includes corresponding alignment marks. A die attach tool capable of aligning the mother crystals and handle wafer using the lithographically defined marks is used to place the mother crystals on the handle wafer with alignment tolerances of ≤10 microns. The alignment marks on the handle wafer are positioned such that the mother crystals do not overlap when placed on the handle wafer and the nominal size of the gap between mother crystals is minimized. Preferably, the gap between mother crystals when mounted on the handle wafer is ≤500 microns. More preferably the gap between mother crystals when mounted on the handle wafer is ≤100 microns. Most preferably the gap between mother crystals when mounted on the handle wafer is ≤50 microns. When the mother crystals are placed on the handle wafer they are fixed in place by bonding of the Au bond-layers using thermocompression by application of force at elevated temperatures above 100 degrees C. Once all the mother crystals are mounted to the handle wafer a secondary bonding step can be performed using higher temperatures and pressures than achievable in the die attach tool to improve the strength of the Au—Au bond interface. The tiled mother crystal can then be chemical-mechanically polished [CMP] to ensure the second surface of the individual mother wafers are at the same height above the handle wafer. Silicon oxide is deposited on a second handle wafer and on the second surface of the tiled mother crystals a bulk GaN substrate. CMP is used to reduce the roughness of the oxide layers on both the handle and the tiled mother crystal to below 10 nm RMS such that the oxide surfaces will be in intimate contact when brought together. This is followed by an ion implantation of atoms of one or more elements, such as hydrogen and helium among others, at a shallow depth of less than 500 nm into the second surface of the tiled mother wafer such that the implanted species are concentrated at a narrow range of depth in the GaN crystals. The oxide surfaces of the handle and tiled mother crystal are then brought into contact and bonded at elevated temperature and pressure to produce a stable bond. A second anneal at elevated temperature induces the implanted species to come out of solid solution in the GaN wafer, thereby initiating microfracture of the GaN at the depth of the implantation. This microfracture releases the layer of GaN above the implantation depth and results in the formation of an engineered substrate consisting of the released layer of GaN overlaying the bonding oxide, which overlays the handle wafer. In this embodiment, the GaN layer acts as the seed layer for growth of epitaxial device layers, while the bonding oxide may be used as a selective release layer, which can be selectively etched using solutions containing HF acid.

The gallium and nitrogen containing laser diode devices can be fabricated on engineered substrates configured with a conventional orientation of a gallium and nitrogen containing film (e.g., GaN) such as the polar c-plane. In preferred embodiment the gallium and nitrogen containing laser diode devices are fabricated on engineered substrates configured with a specialized orientation of a gallium and nitrogen containing film (e.g., GaN) such as the nonpolar m-plane or a-plane orientation, or on a semipolar orientation such as the {30-31}, {20-21}, {30-32}, {11-22}, {10-11}, {30-3-1}, {20-2-1}, {30-3-2}, or offcuts of any of these polar, nonpolar, and semipolar planes within +/−10 degrees towards a c-plane, and/or +/−10 degrees towards an a-plane, and/or +/−10 degrees towards an m-plane. A gallium and nitrogen containing laser diode epitaxial layer structure is grown on a gallium and nitrogen containing engineered substrate with multiple tile regions. The substrate member may have a surface region on the polar {0001} plane (c-plane), nonpolar plane (m-plane, a-plane), and semipolar plain ({11-22}, {10-1-1}, {20-21}, {30-31}) or other planes of a gallium and nitrogen containing substrate. The laser device can be configured to emit a laser beam characterized by one or more wavelengths from about 390 nm to about 540 nm.

An example of an epitaxial structure for a laser diode device according to this invention is shown in epitaxial structure 1101 of FIG. 11. In this embodiment, an engineered substrate comprising a handle wafer, combined bonding and selective release layer composed of silicon oxide, and a crystalline seed layer composed of GaN is provided. An n-type GaN buffer layer is grown followed by an n-contact layer. In some embodiments, the n-contact layer and n-buffer are the same layer. The n-buffer layer's purpose is to initiate high-quality epitaxial growth, and therefore may be optimized for growth initiation rather than for material properties that are compatible with the device epitaxial layer structure. Overlaying the n-contact layer are n-cladding layers, an n-side separate confinement heterostructure (n-SCH) layer, an active region, a p-side separate confinement heterostructure (p-SCH) layer, a p-cladding layer, and a p-contact region. In one example of this embodiment an n-type GaN buffer layer is grown on a c-plane oriented, bulk-GaN wafer. In another example the engineered substrate is comprised of a semipolar or nonpolar orientation. Overlaying the buffer layer is an n-type contact layer consisting of GaN doped with silicon at a concentration of $5\times10^{18}$ $cm^{-3}$ but can be other doping levels in the range between $5\times10^{17}$ and $1\times10^{19}$ $cm^{-3}$. Overlaying the contact layer is an n-type cladding layer comprised of GaN or AlGaN layer with a thickness of 1 micron with an average composition of 4% AlN, though in other embodiments the thickness may range from 0.25 to 2 μm with an average composition of 0-8% AlN. Overlaying the n-cladding is an n-type wave-guiding or separate confinement heterostructure (SCH) layer that helps provide index contrast with the cladding to improve confinement of the optical modes. The nSCH is InGaN with a composition of 4% InN and has a thickness of 100 nm, though in other embodiments the InGaN nSCH may range from 20 to 300 nm in thickness and from 0-8% InN and may be composed of several layers of varying composition and thickness. Overlaying the n-SCH are light emitting quantum well layers consisting of two 3.5 nm thick $In_{0.15}Ga_{0.85}N$ quantum wells separated by 4 nm thick GaN barriers, though in other embodiments there may 1 to 7 light emitting quantum well layers consisting of 1 nm to 6 nm thick quantum wells separated by GaN or InGaN barriers of 1 nm to 25 nm thick. Overlaying the light emitting layers is an optional InGaN pSCH with a composition of 4% InN and has a thickness of 100 nm, though in other embodiments the nSCH may range from 20 to 300 nm in thickness and from 0-8% InN and may be composed of several layers of varying composition and thickness. Overlaying the pSCH is an optional AlGaN electron blocking layer (EBL) with a composition of 10% AlN, though in other embodiments the AlGaN EBL composition may range from 0% to 30% AlN. Overlaying the EBL a p-type cladding comprised of GaN or AlGaN layer with a thickness of 0.8 micron with an average composition of 4% AlN, though in other embodiments the thickness may range from 0.25 to 2 μm with an average composition of 0-8% AlN. The p-cladding is terminated at the free surface of the crystal with a highly doped p++ or p-contact layer that enables a high-quality electrical p-type contact to the device.

Another example of an epitaxial structure for a laser diode device according to this invention is shown in epitaxial structure 1102 of FIG. 11. In this embodiment, an engineered substrate comprising a handle wafer, bonding layer, and a crystalline seed layer composed of GaN is provided. In this example, a selective release layer is included in the epitaxial structure of the device layers. An n-type GaN buffer layer is grown followed by one or more selectively etchable layers. The n-buffer layer's purpose is to initiate high-quality epitaxial growth, and therefore may be optimized for growth initiation rather than for material properties that are compatible with the device epitaxial layer structure. Above the selectively removable selective release layer is an n-contact layer. Overlaying the n-contact layer are n-cladding layers, an n-side separate confinement heterostructure (n-SCH) layer, an active region, a p-side separate confinement heterostructure (p-SCH) layer, a p-cladding layer, and a p-contact region. In one example of this embodiment an n-type GaN buffer layer is grown on a c-plane oriented, bulk-GaN wafer. In another example the engineered substrate is comprised of a semipolar or nonpolar orientation. Overlaying the buffer layer is a selective release layer comprised by InGaN wells separated by GaN barriers with the well composition and thickness chosen to result in the wells absorbing light at wavelengths shorter than 450 nm, though in some embodiments the absorption edge would be as short as 400 nm and in other embodiments as long as 520 nm. Overlaying the buffer layer is an n-type contact layer consisting of GaN doped with silicon at a concentration of $5\times10^{18}$ cm$^{-3}$, but can be other doping levels in the range between $5\times10^{17}$ and $1\times10^{19}$ cm$^{-3}$. Overlaying the contact layer is an n-type cladding layer comprised of GaN or AlGaN layer with a thickness of 1 micron with an average composition of 4% AlN, though in other embodiments the thickness may range from 0.25 to 2 μm with an average composition of 0-8% AlN. Overlaying the n-cladding is an n-type wave-guiding or separate confinement heterostructure (SCH) layer that helps provide index contrast with the cladding to improve confinement of the optical modes. The nSCH is InGaN with a composition of 4% InN and has a thickness of 100 nm, though in other embodiments the InGaN nSCH may range from 20 to 300 nm in thickness and from 0-8% InN and may be composed of several layers of varying composition and thickness. Overlaying the n-SCH are light emitting quantum well layers consisting of two 3.5 nm thick $In_{0.15}Ga_{0.85}N$ quantum wells separated by 4 nm thick GaN barriers, though in other embodiments there may 1 to 7 light emitting quantum well layers consisting of 1 nm to 6 nm thick quantum wells separated by GaN or InGaN barriers of 1 nm to 25 nm thick. Overlaying the light emitting layers is an optional InGaN pSCH with a composition of 4% InN and has a thickness of 100 nm, though in other embodiments the nSCH may range from 20 to 300 nm in thickness and from 0-8% InN and may be composed of several layers of varying composition and thickness. Overlaying the pSCH is an optional AlGaN electron blocking layer (EBL) with a composition of 10% AlN, though in other embodiments the AlGaN EBL composition may range from 0% to 30% AlN. Overlaying the EBL a p-type cladding comprised of GaN or AlGaN layer with a thickness of 0.8 micron with an average composition of 4% AlN, though in other embodiments the thickness may range from 0.25 to 2 μm with an average composition of 0-8% AlN. The p-cladding is terminated at the free surface of the crystal with a highly doped p++ or p-contact layer that enables a high-quality electrical p-type contact to the device.

Figure 12:
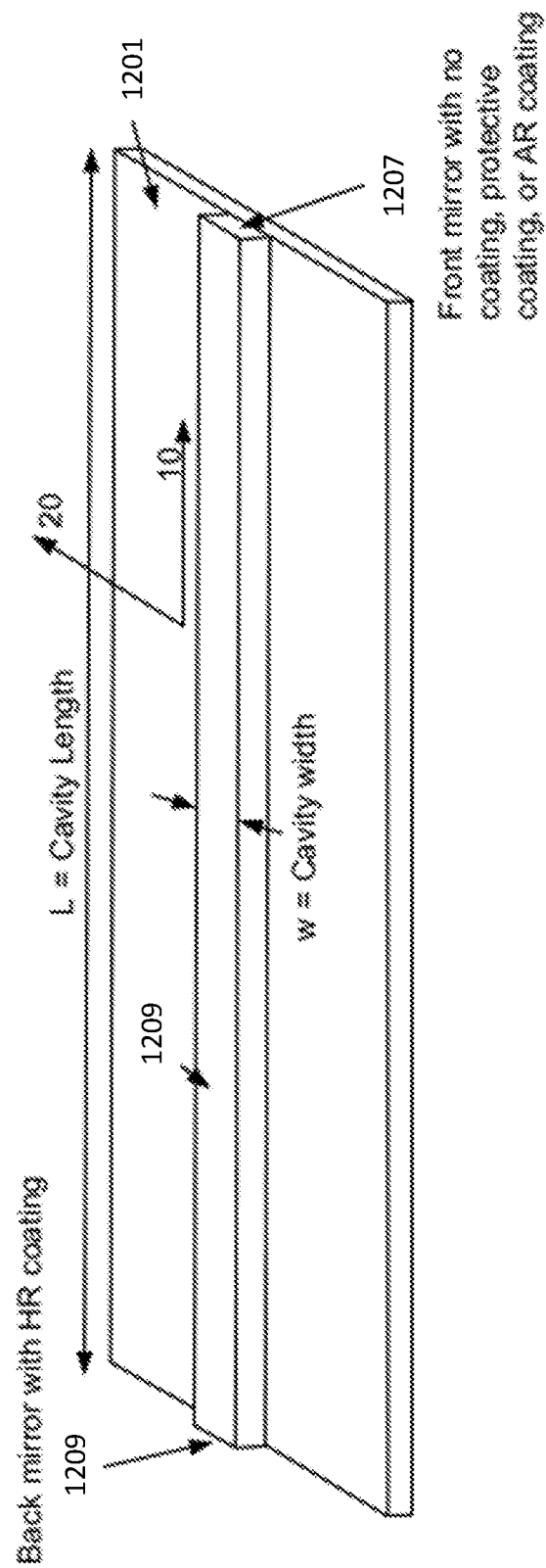
FIG. 12 is a simplified schematic diagram of a laser diode formed on an engineered substrate according to this invention with the cavity aligned in a direction ended with cleaved or etched mirrors according to some embodiments of the present invention.

FIG. 12 is a simplified schematic diagram of a laser diode formed on an engineered gallium and nitrogen containing substrate according to this invention with the cavity aligned in a direction ended with cleaved or etched mirrors according to some embodiments of the present invention. In an example, the engineered substrate surface 1201 is a polar c-plane of GaN and the laser stripe region 1210 is characterized by a cavity orientation substantially in an in-direction 10, which is substantially normal to an a-direction 20 but can be others such as cavity alignment substantially in the a-direction. The laser strip region 1210 has a first end 1207 and a second end 1209 and is formed on an m-direction on a {0001} gallium and nitrogen containing substrate having a pair of cleaved or etched mirror structures, which face each other. In another example, the engineered substrate surface 1201 is a semipolar plane of GaN and the laser stripe region 110 is characterized by a cavity orientation substantially in a projection of a c-direction 10, which is substantially normal to an a-direction 20 but can be others such as cavity alignment substantially in the a-direction. The laser strip region 1210 has a first end 1207 and a second end 1209 and is formed on a semipolar oriented engineered substrate such as a {40-41}, {30-31}, {20-21}, {40-4-1}, {30-3-1}, {20-2-1}, {20-21}, or an offcut of these planes within +/−5 degrees from the c-plane and a-plane gallium and nitrogen containing engineered substrate. Optionally, the gallium nitride substrate member is an engineered substrate characterized by having a nonpolar or semipolar crystalline surface region, but can be others. The engineered substrate may have a surface dislocation density below $10^5$ cm$^{-2}$ or $10^5$ to $10^7$ cm$^{-2}$. The nitride crystal or wafer may comprise $Al_xIn_yGa_{1-x-y}N$, where $0\le x$, $y$, $x+y\le1$. In one specific embodiment, the nitride crystal comprises GaN. In an embodiment, the GaN substrate has threading dislocations, at a concentration between about $10^5$ cm$^{-2}$ and about $10^8$ cm$^{-2}$, in a direction that is substantially orthogonal or oblique with respect to the surface.

The exemplary laser diode devices in FIG. 12 have a pair of cleaved or etched mirror structures 1209 and 1207, which face each other. The first cleaved or etched facet 1209 comprises a reflective coating and the second cleaved or etched facet 1207 comprises no coating, an antireflective coating, or exposes gallium and nitrogen containing material. The first cleaved or etched facet 1209 is substantially parallel with the second cleaved or etched facet 1207. The first and second cleaved facets 1209 and 1207 are provided by a scribing and breaking process according to an embodiment or alternatively by etching techniques using etching technologies such as reactive ion etching (ME), inductively coupled plasma etching (ICP), or chemical assisted ion beam etching (CAIBE), or other method. The reflective coating is selected from silicon dioxide, hafnia, and titania, tantalum pentoxide, zirconia, aluminum oxide, aluminum nitride, and aluminum oxynitride including combinations, and the like. Depending upon the design, the mirror surfaces can also comprise an anti-reflective coating.

In a specific embodiment, the method of facet formation includes subjecting the substrates to a laser for pattern formation. In a preferred embodiment, the pattern is configured for the formation of a pair of facets for a ridge lasers. In a preferred embodiment, the pair of facets face each other and are in parallel alignment with each other. In a preferred embodiment, the method uses a UV (355 nm) laser to scribe the laser bars. In a specific embodiment, the laser is configured on a system, which allows for accurate scribe lines configured in a different patterns and profiles. In a embodiments, the laser scribing can be performed on the back-side, front-side, or both depending upon the application. Of course, there can be other variations, modifications, and alternatives.

It is well known that etch techniques such as chemical assisted ion beam etching (CAIBE), inductively coupled plasma (ICP) etching, or reactive ion etching (RIE) can result in smooth and vertical etched sidewall regions, which could serve as facets in etched facet laser diodes. In the etched facet process a masking layer is deposited and patterned on the surface of the wafer. The etch mask layer could be comprised of dielectrics such as silicon dioxide (SiO$_2$), silicon nitride (Si$_x$N$_y$), a combination thereof or other dielectric materials. Further, the mask layer could be comprised of metal layers such as Ni or Cr, but could be comprised of metal combination stacks or stacks comprising metal and dielectrics. In another approach, photoresist masks can be used either alone or in combination with dielectrics and/or metals. The etch mask layer is patterned using conventional photolithography and etch steps. The alignment lithography could be performed with a contact aligner or stepper aligner. Such lithographically defined mirrors provide a high level of control to the design engineer. After patterning of the photoresist mask on top of the etch mask is complete, the patterns in then transferred to the etch mask using a wet etch or dry etch technique. Finally, the facet pattern is then etched into the wafer using a dry etching technique selected from CAIBE, ICP, RIE and/or other techniques. The etched facet surfaces must be highly vertical of between about 87 and about 93 degrees or between about 89 and about 91 degrees from the surface plane of the wafer. The etched facet surface region must be very smooth with root mean square roughness values of less than about 50 nm, 20 nm, 5 nm, or 1 nm. Lastly, the etched must be substantially free from damage, which could act as nonradiative recombination centers and hence reduce the catastrophic optical mirror damage (COMD) threshold. CAIBE is known to provide very smooth and low damage sidewalls due to the chemical nature of the etch, while it can provide highly vertical etches due to the ability to tilt the wafer stage to compensate for any inherent angle in etch.

The laser stripe 110, referring to FIG. 12, is characterized by a length and width. The length ranges from about 50 µm to about 3000 µm, but is preferably between about 10 µm and about 400 µm, between about 400 µm and about 800 µm, or about 800 µm and about 1600 µm, but could be others. The stripe also has a width ranging from about 0.5 µm to about 50 µm, but is preferably between about 0.8 µm and about 2.5 µm for single lateral mode operation or between about 2.5 µm and about 50 µm for multi-lateral mode operation, but can be other dimensions. In a specific embodiment, the present device has a width ranging from about 0.5 µm to about 1.5 µm, a width ranging from about 1.5 µm to about 3.0 µm, a width ranging from about 3.0 µm to about 50 µm, and others. In a specific embodiment, the width is substantially constant in dimension, although there may be slight variations. The width and length are often formed using a masking and etching process, which are commonly used in the art.

The laser stripe 110, referring to FIG. 12, is provided by an etching process selected from dry etching or wet etching. The device also has an overlying dielectric region, which exposes a p-type contact region. Overlying the contact region is a contact material, which may be metal or a conductive oxide or a combination thereof. The p-type electrical contact may be deposited by thermal evaporation, electron beam evaporation, electroplating, sputtering, or another suitable technique. Overlying the polished region of the substrate is a second contact material, which may be metal or a conductive oxide or a combination thereof and which comprises the n-type electrical contact. The n-type electrical contact may be deposited by thermal evaporation, electron beam evaporation, electroplating, sputtering, or another suitable technique. In an alternative embodiment the n-contact is deposited on the top side of the wafer by using an etching process to etch down to the n-type material and depositing a patterned n-contact metal.

In a specific embodiment, the laser device may emit red light with a center wavelength between 600 nm and 750 nm. Such a device may comprise layers of varying compositions of Al$_x$In$_y$Ga$_{1-x-y}$As$_z$P$_{1-z}$, where x+y≤1 and z≤1. The red laser device comprises at least an n-type and p-type cladding layer, an n-type SCH of higher refractive index than the n-type cladding, a p-type SCH of higher refractive index than the p-type cladding and an active region where light is emitted. In a specific embodiment, the laser stripe is provided by an etching process selected from dry etching or wet etching. In a preferred embodiment, the etching process is dry, but can be others. The device also has an overlying dielectric region, which exposes the contact region. In a specific embodiment, the dielectric region is an oxide such as silicon dioxide, but can be others. Of course, there can be other variations, modifications, and alternatives. The laser stripe is characterized by a length and width. The length ranges from about 50 µm to about 3000 µm, but is preferably between 10 µm and 400 µm, between about 400 µm and 800 µm, or about 800 and 1600 µm, but could be others such as greater than 1600 µm. The stripe also has a width ranging from about 0.5 µm to about 80 µm, but is preferably between 0.8 µm and 2.5 µm for single lateral mode operation or between 2.5 µm and 60 µm for multi-lateral mode operation, but can be other dimensions. The laser strip region has a first end and a second end having a pair of cleaved or etched mirror structures, which face each other. The first facet comprises a reflective coating and the second facet comprises no coating, an antireflective coating, or exposes gallium and nitrogen containing material. The first facet is substantially parallel with the second cleaved or etched facet.

Given the high gallium and nitrogen containing substrate costs, difficulty in scaling up gallium and nitrogen containing substrate size, the inefficiencies inherent in the processing of small wafers, and potential supply limitations it becomes extremely desirable to maximize utilization of available gallium and nitrogen containing substrate and overlying epitaxial material. In the fabrication of lateral cavity laser diodes, it is typically the case that minimum die size is determined by device components such as the wire bonding pads or mechanical handling considerations, rather than by laser cavity widths. Minimizing die size is critical to reducing manufacturing costs as smaller die sizes allow a greater number of devices to be fabricated on a single wafer in a single processing run. The current invention is a method of maximizing the number of devices which can be fabricated from a given gallium and nitrogen containing substrate and overlying epitaxial material by spreading out the epitaxial material onto a carrier wafer via a die expansion process.

Similar to an edge emitting laser diode, a SLED is typically configured as an edge-emitting device wherein the high brightness, highly directional optical emission exits a waveguide directed outward from the side of the semiconductor chip. SLEDs are designed to have high single pass gain or amplification for the spontaneous emission generated along the waveguide. However, unlike laser diodes, they are designed to provide insufficient feedback to in the cavity to achieve the lasing condition where the gain equals the total losses in the waveguide cavity. In a typical example, at least one of the waveguide ends or facets is designed to provide very low reflectivity back into the waveguide. Several methods can be used to achieve reduced reflectivity on the waveguide end or facet. In one approach an optical coating is applied to at least one of the facets, wherein the optical coating is designed for low reflectivity such as less than 1%, less than 0.1%, less than 0.001%, or less than 0.0001% reflectivity. In another approach for reduced reflectivity the waveguide ends are designed to be tilted or angled with respect to the direction of light propagation such that the light that is reflected back into the chip does not constructively interfere with the light in the cavity to provide feedback. The tilt angle must be carefully designed around a null in the reflectivity versus angle relationship for optimum performance. The tilted or angled facet approach can be achieved in a number of ways including providing an etched facet that is designed with an optimized angle lateral angle with respect to the direction of light propagation. The angle of the tilt is pre-determined by the lithographically defined etched facet patter. Alternatively, the angled output could be achieved by curving and/or angling the waveguide with respect to a cleaved facet that forms on a pre-determined crystallographic plane in the semiconductor chip. Another approach to reduce the reflectivity is to provide a roughened or patterned surface on the facet to reduce the feedback to the cavity. The roughening could be achieved using chemical etching and/or a dry etching, or with an alternative technique. Of course there may be other methods for reduced feedback to the cavity to form a SLED device. In many embodiments a number of techniques can be used in combination to reduce the facet reflectivity including using low reflectivity coatings in combination with angled or tilted output facets with respect to the light propagation.

In a specific embodiment, the present invention provides an alternative device structure capable of emitting 501 nm and greater light in a ridge laser embodiment. The device is provided with a of the following epitaxially grown elements:

- an n-GaN or n-AlGaN cladding layer with a thickness from 100 nm to 3000 nm with Si doping level of $5\times10^{17}$ $cm^{-3}$ to $3\times10^{18}$ $cm^{-3}$;
- an n-side SCH layer comprised of InGaN with molar fraction of indium of between 2% and 15% and thickness from 20 nm to 250 nm;
- a single quantum well or a multiple quantum well active region comprised of at least two 2.0 nm to 8.5 nm InGaN quantum wells separated by 1.5 nm and greater, and optionally up to about 12 nm, GaN or InGaN barriers;
- a p-side SCH layer comprised of InGaN with molar a fraction of indium of between 1% and 10% and a thickness from 15 nm to 250 nm or an upper GaN-guide layer;
- an electron blocking layer comprised of AlGaN with molar fraction of aluminum of between 0% and 22% and thickness from 5 nm to 20 nm and doped with Mg;
- a p-GaN or p-AlGaN cladding layer with a thickness from 400 nm to 1500 nm with Mg doping level of $2\times10^{17}$ $cm^{-3}$ to $2\times10^{19}$ cm-3; and
- a p++-GaN contact layer with a thickness from 20 nm to 40 nm with Mg doping level of $1\times10^{19}$ $cm^{-3}$ to $1\times10^{21}$ $cm^{-3}$.

A gallium and nitrogen containing laser diode laser device may also include other structures, such as a surface ridge architecture, a buried heterostructure architecture, and/or a plurality of metal electrodes for selectively exciting the active region. For example, the active region may comprise first and second gallium and nitrogen containing cladding layers and an indium and gallium containing emitting layer positioned between the first and second cladding layers. A laser device may further include an n-type gallium and nitrogen containing material and an n-type cladding material overlying the n-type gallium and nitrogen containing material. In a specific embodiment, the device also has an overlying n-type gallium nitride layer, an active region, and an overlying p-type gallium nitride layer structured as a laser stripe region. Additionally, the device may also include an n-side separate confinement hetereostructure (SCH), p-side guiding layer or SCH, p-AlGaN EBL, among other features. In a specific embodiment, the device also has a p++ type gallium nitride material to form a contact region. In a specific embodiment, the p++ type contact region has a suitable thickness and may range from about 10 nm 50 nm, or other thicknesses. In a specific embodiment, the doping level can be higher than the p-type cladding region and/or bulk region. In a specific embodiment, the p++ type region has doping concentration ranging from about $10^{19}$ to $10^{21}$ $Mg/cm^3$, and others. The p++ type region preferably causes tunneling between the semiconductor region and overlying metal contact region. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ $cm^{-3}$ and $10^{20}$ $cm^{-3}$.

FIG. 13a is a cross-sectional view of a laser device according to some embodiments of the present disclosure. As shown, the laser device includes a gallium and nitrogen [i.e. GaN] engineered substrate 1301 comprising a handle wafer 1302, a bond layer 1303, and a crystalline seed layer 1304. The device has an underlying metal back contact region 1305, which can also serve as a metal pad for soldering the device to a submount. For example, the substrate 1301 may be characterized by a semipolar or nonpolar orientation. The device also has an overlying epitaxially-grown n-type gallium nitride layer 1306, an active region 1307, and an overlying p-type gallium nitride layer structured as a laser stripe region 1310. Each of these regions is formed using at least an epitaxial deposition technique of metal organic chemical vapor deposition (MOCVD), molecular beam epitaxy (MBE), or other epitaxial growth techniques suitable for GaN growth. The epitaxial layer is a high-quality epitaxial layer overlying the n-type gallium nitride layer. In some embodiments the high-quality layer is doped, for example, with Si or O to form n-type material, with a dopant concentration between about $10^{16}$ cm$^{-3}$ and $10^{20}$ cm$^{-3}$. An electrically insulating passivation layer 1308 is deposited overlaying at least the sidewalls and surrounding etched field of the laser stripe region 1310. A p-type metal contact 1309 is deposited overlaying the p-type contact layer surface 1311 of the epitaxially grown layers. In this embodiment, the engineered substrate handle wafer 1302, bond layer 1303, and crystalline seed layer 1304 must be electrically conductive and able to make electrical contact to the epitaxially grown n-type GaN layer. Examples of handle wafer materials that could be used in this embodiment include conductive semiconductors (for example: SiC, GaAs, and silicon wafers) and metals (for example: tungsten, tantalum and molybdenum). Conductive bond layers compatible with this embodiment include metallic thermocompression bonds and metallic solder bonds.

An n-type $Al_uIn_vGa_{1-u-v}N$ layer, where $0 \leq u$, v, $u+v \leq 1$, is deposited on the substrate. The carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE).

FIG. 13b is a cross-sectional view of a laser device according to some embodiments of the present disclosure. As shown, the laser device includes a gallium and nitrogen [i.e. GaN] engineered substrate 1312 comprising a handle wafer 1313, a bond layer 1314, and a crystalline seed layer 1315. The device has an underlying metal region 1316, which serves as a metal pad for soldering the device to a submount. For example, the substrate 1312 may be characterized by a semipolar or nonpolar orientation. The device also has an overlying epitaxially-grown n-type gallium nitride layer 1317, an active region 1318, and an overlying p-type gallium nitride layer structured as a laser stripe region 1321. Each of these regions is formed using at least an epitaxial deposition technique of metal organic chemical vapor deposition (MOCVD), molecular beam epitaxy (MBE), or other epitaxial growth techniques suitable for GaN growth. The epitaxial layer is a high-quality epitaxial layer overlying the n-type gallium nitride layer. In some embodiments the high-quality layer is doped, for example, with Si or O to form n-type material, with a dopant concentration between about $10^{16}$ cm$^{-3}$ and $10^{20}$ cm$^{-3}$. An electrically insulating passivation layer 1319 is deposited overlaying at least the sidewalls and surrounding etched field of the laser stripe region 1321. A p-type metal contact 1320 is deposited overlaying the p-type contact layer surface 1322 of the epitaxially grown layers. A n-type metal contact 1323 is deposited overlaying a region of the n-type layer 1317 exposed by removal of a portion of the p-type layers, active region and n-type layer. In this embodiment, the engineered substrate handle wafer 1302, bond layer 1303, and crystalline seed layer 1304 may be electrically insulating as electrical current can pass freely from the n-contact 1323 to the p-contact 1320 metal stacks.

For example, the engineered GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. The susceptor is heated to approximately 900 to 1200 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 sccm and 10 sccm, is initiated.

In one embodiment, the laser stripe region 1321 is a p-type gallium nitride layer. The laser stripe is provided by a dry etching process, but wet etching can be used. The dry etching process is an inductively coupled process using chlorine bearing species or a reactive ion etching process using similar chemistries. The chlorine bearing species are commonly derived from chlorine gas or the like. The device also has an overlying dielectric region, which exposes a contact region 1322. The dielectric region is an oxide such as silicon dioxide or silicon nitride, and a contact region is coupled to an overlying metal layer 1320. The overlying metal layer is preferably a multilayered structure containing gold and platinum (Pt/Au), palladium and gold (Pd/Au), or nickel gold (Ni/Au), or a combination thereof. In some embodiments, barrier layers and more complex metal stacks are included.

Active region 1318 preferably includes one to ten quantum well regions or a double heterostructure region for light emission. Following deposition of the n-type $Al_uIn_vGa_{1-u-v}N$ layer to achieve a desired thickness, an active layer is deposited. The quantum wells are preferably InGaN with GaN, AlGaN, InAlGaN, or InGaN barrier layers separating them. In other embodiments, the well layers and barrier layers comprise $Al_wIn_xGa_{1-w-x}N$ and $Al_yIn_zGa_{1-y-z}N$, respectively, where $0 \leq w$, x, y, z, $w+x$, $y+z \leq 1$, where $w<u$, y and/or $x>v$, z so that the bandgap of the well layer(s) is less than that of the barrier layer(s) and the n-type layer. The well layers and barrier layers each have a thickness between about 1 nm and about 20 nm. The composition and structure of the active layer are chosen to provide light emission at a preselected wavelength. The active layer may be left undoped (or unintentionally doped) or may be doped n-type or p-type.

The active region can also include an electron blocking region, and a separate confinement heterostructure. The electron-blocking layer may comprise $Al_sIn_tGa_{1-s-t}N$, where $0 \leq s$, t, $s+t \leq 1$, with a higher bandgap than the active layer, and may be doped p-type. In one specific embodiment, the electron blocking layer includes AlGaN. In another embodiment, the electron blocking layer includes an AlGaN/GaN super-lattice structure, comprising alternating layers of AlGaN and GaN, each with a thickness between about 0.2 nm and about 5 nm.

As noted, the p-type gallium nitride or aluminum gallium nitride structure is deposited above the electron blocking layer and active layer(s). The p-type layer may be doped with Mg, to a level between about $10^{16}$ cm$^{-3}$ and $10^{22}$ cm$^{-3}$, with a thickness between about 5 nm and about 1000 nm. The outermost 1-50 nm of the p-type layer may be doped more heavily than the rest of the layer, so as to enable an improved electrical contact. The device also has an overlying dielectric region, for example, silicon dioxide, which exposes the contact region 1322.

The metal contact is made of suitable material such as silver, gold, aluminum, nickel, platinum, rhodium, palladium, chromium, or the like. The contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device. The laser devices illustrated in FIG. 12 and FIG. 13 and described above are typically suitable for relatively low-power applications.

In various embodiments, the present invention realizes high output power from a diode laser is by widening a portions of the laser cavity member from the single lateral mode regime of 1.0-3.0 μm to the multi-lateral mode range 5.0-20 μm. In some cases, laser diodes having cavities at a width of 50 μm or greater are employed.

The laser stripe length, or cavity length ranges from 100 to 3000 μm and employs growth and fabrication techniques such as those described in U.S. patent application Ser. No. 12/759,273, filed Apr. 13, 2010, which is incorporated by reference herein. As an example, laser diodes are fabricated on nonpolar or semipolar gallium containing substrates, where the internal electric fields are substantially eliminated or mitigated relative to polar c-plane oriented devices. It is to be appreciated that reduction in internal fields often enables more efficient radiative recombination. Further, the heavy hole mass is expected to be lighter on nonpolar and semipolar substrates, such that better gain properties from the lasers can be achieved.

Optionally, FIG. 13a illustrates an example cross-sectional diagram of a gallium and nitrogen-based laser diode device. The epitaxial device structure is formed on top of the gallium and nitrogen containing engineered substrate member 1304. The substrate member may be n-type doped with O and/or Si doping. The epitaxial structures will contain n-side layers 1306 such as an n-type buffer layer comprised of GaN, AlGaN, AlINGaN, or InGaN and n-type cladding layers comprised of GaN, AlGaN, or AlInGaN. The n-typed layers may have thickness in the range of 0.3 μm to about 3 μm or to about 5 μm and may be doped with an n-type carriers such as Si or O to concentrations between $1\times10^{16}$ cm$^{-3}$ to $1\times10^{19}$ cm$^{-3}$. Overlying the n-type layers is the active region and waveguide layers 1307. This region could contain an n-side waveguide layer or separate confinement heterostructure (SCH) such as InGaN to help with optical guiding of the mode. The InGaN layer be comprised of 1 to 15% molar fraction of InN with a thickness ranging from about 30 nm to about 250 nm and may be doped with an n-type species such as Si. Overlying the SCH layer is the light emitting regions which could be comprised of a double heterostructure or a quantum well active region. A quantum well active region could be comprised of 1 to 10 quantum wells ranging in thickness from 1 nm to 20 nm comprised of InGaN. Barrier layers comprised of GaN, InGaN, or AlGaN separate the quantum well light emitting layers. The barriers range in thickness from 1 nm to about 25 nm. Overlying the light emitting layers are optionally an AlGaN or InAlGaN electron blocking layer with 5% to about 35% AlN and optionally doped with a p-type species such as Mg. Also optional is a p-side waveguide layer or SCH such as InGaN to help with optical guiding of the mode. The InGaN layer be comprised of 1 to 15% molar fraction of InN with a thickness ranging from 30 nm to about 250 nm and may be doped with an p-type species such as Mg. Overlying the active region and optional electron blocking layer and p-side waveguide layers is a p-cladding region and a p++ contact layer. The p-type cladding region is comprised of GaN, AlGaN, AlINGaN, or a combination thereof. The thickness of the p-type cladding layers is in the range of 0.3 μm to about 2 μm and is doped with Mg to a concentration of between $1\times10^{16}$ cm$^{-3}$ to $1\times10^{19}$ cm$^{-3}$. A ridge is formed in the p-cladding region for lateral confinement in the waveguide using an etching process selected from a dry etching or a wet etching process. A dielectric material 1308 such as silicon dioxide or silicon nitride or deposited on the surface region of the device and an opening is created on top of the ridge to expose a portion of the p++ GaN layer. A p-contact 1309 is deposited on the top of the device to contact the exposed p++ contact region. The p-type contact may be comprised of a metal stack containing a of Au, Pd, Pt, Ni, Ti, or Ag as well as conductive oxides such as ZnO and indium tin oxide [ITO] and may be deposited with electron beam deposition, sputter deposition, or thermal evaporation. A n-contact 1305 is formed to the bottom of the substrate member. The n-type contact may be comprised of a metal stack containing Au, Al, Pd, Pt, Ni, Ti, or Ag and may be deposited with electron beam deposition, sputter deposition, or thermal evaporation.

Optionally, FIG. 13b illustrates an example cross-sectional diagram of a gallium and nitrogen-based laser diode device. The epitaxial device structure is formed on top of the gallium and nitrogen containing engineered substrate member 1315. The substrate member may be n-type doped with O and/or Si doping. The epitaxial structures will contain n-side layers 1317 such as an n-type buffer layer comprised of GaN, AlGaN, AlINGaN, or InGaN and n-type cladding layers comprised of GaN, AlGaN, or AlInGaN. The n-typed layers may have thickness in the range of 0.3 μm to about 3 μm or to about 5 μm and may be doped with an n-type carriers such as Si or O to concentrations between $1\times10^{16}$ cm$^{-3}$ to $1\times10^{19}$ cm$^{-3}$. Overlying the n-type layers is the active region and waveguide layers 1318. This region could contain an n-side waveguide layer or separate confinement heterostructure (SCH) such as InGaN to help with optical guiding of the mode. The InGaN layer be comprised of 1 to 15% molar fraction of InN with a thickness ranging from about 30 nm to about 250 nm and may be doped with an n-type species such as Si. Overlying the SCH layer is the light emitting regions which could be comprised of a double heterostructure or a quantum well active region. A quantum well active region could be comprised of 1 to 10 quantum wells ranging in thickness from 1 nm to 20 nm comprised of InGaN. Barrier layers comprised of GaN, InGaN, or AlGaN separate the quantum well light emitting layers. The barriers range in thickness from 1 nm to about 25 nm. Overlying the light emitting layers are optionally an AlGaN or InAlGaN electron blocking layer with 5% to about 35% AlN and optionally doped with a p-type species such as Mg. Also optional is a p-side waveguide layer or SCH such as InGaN to help with optical guiding of the mode. The InGaN layer be comprised of 1 to 15% molar fraction of InN with a thickness ranging from 30 nm to about 250 nm and may be doped with an p-type species such as Mg. Overlying the active region and optional electron blocking layer and p-side waveguide layers is a p-cladding region and a p++ contact layer. The p-type cladding region is comprised of GaN, AlGaN, AlInGaN, or a combination thereof. The thickness of the p-type cladding layers is in the range of 0.3 µm to about 2 µm and is doped with Mg to a concentration of between $1\times10^{16}$ cm$^{-3}$ to $1\times10^{19}$ cm$^{-3}$. A ridge is formed in the p-cladding region for lateral confinement in the waveguide using an etching process selected from a dry etching or a wet etching process. A dielectric material 1319 such as silicon dioxide or silicon nitride or deposited on the surface region of the device and an opening is created on top of the ridge to expose a portion of the p++ GaN layer. A p-contact 1320 is deposited on the top of the device to contact the exposed p++ contact region. The p-type contact may be comprised of a metal stack containing a of Au, Pd, Pt, Ni, Ti, or Ag as well as conductive oxides such as ZnO and indium tin oxide [ITO] and may be deposited with electron beam deposition, sputter deposition, or thermal evaporation. A via is produced using an etching process selected from a dry etching or a wet etching process. The via exposes a portion of the n-type cladding layers and an n-type contact 1323 is deposited overlaying the exposed portion of the n-type layer 1317. The n-type contact may be comprised of a metal stack containing Au, Al, Pd, Pt, Ni, Ti, or Ag and may be deposited with electron beam deposition, sputter deposition, or thermal evaporation.

In multiple embodiments according to the present invention, the device layers comprise a super-luminescent light emitting diode or SLED. In all applicable embodiments a SLED device can be interchanged with or combined with laser diode devices according to the methods and architectures described in this invention. A SLED is in many ways similar to an edge emitting laser diode; however the emitting facet of the device is designed so as to have a very low reflectivity. A SLED is similar to a laser diode as it is based on an electrically driven junction that when injected with current becomes optically active and generates amplified spontaneous emission (ASE) and gain over a wide range of wavelengths.

In an embodiment, the LD or SLED device is characterized by a ridge with non-uniform width. The ridge is comprised by a first section of uniform width and a second section of varying width. The first section has a length between 100 and 500 µm long, though it may be longer. The first section has a width of between 1 and 2.5 µm, with a width preferably between 1 and 1.5 µm. The second section of the ridge has a first end and a second end. The first end connects with the first section of the ridge and has the same width as the first section of the ridge. The second end of the second section of the ridge is wider than the first section of the ridge, with a width between 5 and 50 µm and more preferably with a width between 15 and 35 µm. The second section of the ridge waveguide varies in width between its first and second end smoothly. In some embodiments the second derivative of the ridge width versus length is zero such that the taper of the ridge is linear. In some embodiments, the second derivative is chosen to be positive or negative. In general the rate of width increase is chosen such that the ridge does not expand in width significantly faster than the optical mode. In specific embodiments, the electrically injected area is patterned such that only a part of the tapered portion of the waveguide is electrically injected.

In an embodiment, multiple laser dice emitting at different wavelengths are transferred to the same carrier wafer in close proximity to one another; preferably within one millimeter of each other, more preferably within about 200 micrometers of each other and most preferably within about 50 µm of each other. The laser die wavelengths are chosen to be separated in wavelength by at least twice the full width at half maximum of their spectra. For example, three dice, emitting at 440 nm, 450 nm and 460 nm, respectively, are transferred to a single carrier chip with a separation between die of less than 50 µm and die widths of less than 50 µm such that the total lateral separation, center to center, of the laser light emitted by the die is less than 200 µm. The closeness of the laser die allows for their emission to be easily coupled into the same optical train or fiber optic waveguide or projected in the far field into overlapping spots. In a sense, the lasers can be operated effectively as a single laser light source.

After the laser diode chip fabrication as described above, the laser diode can be mounted to a submount. In some examples the submount is comprised of AlN, SiC, BeO, diamond, or other materials such as metals, ceramics, or composites. The submount member may be characterized by a width, length, and thickness A schematic diagram illustrating a CoS based laser diode formed on an engineered gallium and nitrogen containing substrate technology according to this present invention is shown in FIG. 14. The CoS is comprised of submount material 1401 configured to act as an intermediate material between a laser diode chip 1402 and a final mounting surface. The submount is configured with electrodes 1403 and 1405 that may be formed with deposited metal layers such as Au. In one example, Ti/Pt/Au is used for the electrodes. Wirebonds 1404 are configured to couple the electrical power from the electrodes 1403 on the submount to the laser diode chip to generate a laser beam output 1406 from the laser diode. The electrode 1405 is connected to a laser diode chip via an electrically conductive solder or thermocompression bond. The electrodes 1403 and 1405 are configured for an electrical connection to an external power source such as a laser driver, a current source, or a voltage source. Wirebonds 1404 can be formed on the electrodes to couple electrical power to the laser diode device and activate the laser.

In an embodiment of the invention, the engineered substrate will contain one or more electrically insulating layers that prevent or limit electrical conduction through the engineered substrate. In this embodiment, multiple sets of wire bonds 1404 are used to couple the electrical power from the electrodes 1403 and 1405 on the submount to electrode pads on the laser diode chip to generate a laser beam output 1406 from the laser diode.

In another embodiment, the gallium and nitrogen containing laser diode fabrication includes an epitaxial release step from the engineered substrate to lift off the epitaxially grown gallium and nitrogen layers and prepare them for transferring to a carrier wafer which could comprise the submount after laser fabrication. The transfer step requires precise placement of the epitaxial layers on the carrier wafer to enable subsequent processing of the epitaxial layers into laser diode devices. The attachment process to the carrier wafer could include a wafer bonding step with a bond interface comprised of metal-metal, semiconductor-semiconductor, glass-glass, dielectric-dielectric, or a combination thereof.

In this embodiment, gallium and nitrogen containing epitaxial layers are grown on an engineered substrate with a gallium and nitrogen containing seed layer. The epitaxial layer stack comprises at least the laser diode device layers overlaying the seed layer. Following the growth of the epitaxial layers on the engineered gallium and nitrogen containing substrate, the semiconductor device layers are separated from the engineered substrate by a selective wet etching process such as by etching of one or more dielectric layers in engineered substrate with conventional acids such as BHF or by a PEC etch configured to selectively remove an epitaxially grown selective release layer and enable release of the device layers to a carrier wafer. In one embodiment, a bonding material is deposited on the surface overlying the semiconductor device layers. A bonding material is also deposited either as a blanket coating or patterned on the carrier wafer. Standard lithographic processes are used to selectively mask the semiconductor device layers. The wafer is then subjected to an etch process such as dry etch or wet etch processes to define via structures that expose the selective release layers on the sidewall of the mesa structure. As used herein, the term mesa region or mesa is used to describe the patterned epitaxial material on the gallium and nitrogen containing engineered substrate and prepared for transferring to the carrier wafer. The mesa region can be any shape or form including a rectangular shape, a square shape, a triangular shape, a circular shape, an elliptical shape, a polyhedron shape, or other shape. The term mesa shall not limit the scope of the present invention.

Following the definition of the mesa, a selective etch process is performed to fully or partially remove the selective release layers while leaving the semiconductor device layers intact. The resulting structure comprises undercut mesas comprised of epitaxial device layers. The undercut mesas correspond to dice from which semiconductor devices will be formed on. In some embodiments a protective passivation layer can be employed on the sidewall of the mesa regions to prevent the device layers from being exposed to the selective etch when the etch selectivity is not perfect. In other embodiments a protective passivation is not needed because the device layers are not sensitive to the selective etch or measures are taken to prevent etching of sensitive layers such as shorting the anode and cathode. The undercut mesas corresponding to device dice are then transferred to the carrier wafer using a bonding technique wherein the bonding material overlying the semiconductor device layers is joined with the bonding material on the carrier wafer. The resulting structure is a carrier wafer comprising gallium and nitrogen containing epitaxial device layers overlying the bonding region.

The preparation of the epitaxy wafer is shown in FIG. 15. An engineered substrate is comprised by a handle wafer 1501 a bonding and/or selective release layer 1502, and a crystalline seed layer 1503. One or more layers are deposited with an epitaxial process, including at least a buffer layer 1504, but which may also include an epitaxial selective release layer 1505 and various epitaxial device layers 1506. There are two process flows for preparing the epitaxial device layers for transfer to a carrier wafer. In the first, the detaching of epitaxial device layers from the engineered substrate is achieved by selectively etching the epitaxial selective release layers. The epitaxial sacrificial region is exposed by etching of vias that extend below the epitaxial selective release layer 1505 and segment the layers 1506 into mesas. A layer composed of bonding media 1508 is deposited overlaying the mesas. In some embodiments the bonding layer 1508 is deposited before the selective release layer 1505 is exposed. Finally, the selective release layer 1505 is removed via a selective process. In the second process flow, the epitaxial layers are detached from the engineered substrate by selectively etching a release layer included in the engineered substrate. The engineered substrate sacrificial region is exposed by etching of vias that extend below the engineered substrate seed layer 1503 and segment the layers 1506, 1505, 1504, and 1503 into mesas. A layer composed of bonding media 1508 is deposited overlaying the mesas. In some embodiments the bonding layer 1508 is deposited before the selective release layer 1505 is exposed. Finally, the engineered substrate selective release layer 1502 is removed via a selective process.

In some embodiments, the engineered substrates contain either oxide bond layers or oxide selective release layers. These layers are selectively etched using either wet or vapor etching with acidic solutions such as hydrofluoric acid or buffered oxide etchant, or they are selectively dry etched using fluorine containing plasmas.

In some embodiments, PEC etching is deployed as the selective etch to remove selective release layers included in the epitaxial device structure. PEC is a photo-assisted wet etch technique that can be used to etch GaN and its alloys. FIG. 17 shows a cross-sectional schematic representation of a PEC etch configuration used for releasing epitaxial layers from an engineered substrate. Epitaxial layers overlay an engineered substrate comprising a handle wafer 1701, a bonding layer 1702, and a crystalline seed layer 1703. The epitaxial layers comprise one or more n-type buffer layers 1704, a sacrificial PEC etch layer 1707, n-type cladding layers 1711, active region and waveguide layers 1708 and p-type cladding layers 1709. The process involves an above-band-gap excitation source and an electrochemical cell formed by the semiconductor and the electrolyte solution. In this case, the exposed (Al,In,Ga)N material surface acts as the anode, while a metal pad 1705 deposited on the semiconductor acts as the cathode. The above-band-gap light source generates electron-hole pairs in the semiconductor. Electrons are extracted from the semiconductor via the cathode while holes diffuse to the surface of material to form an oxide. Since the diffusion of holes to the surface requires the band bending at the surface to favor a collection of holes, PEC etching typically works only for n-type material although some methods have been developed for etching p-type material. The oxide is then dissolved by the electrolyte resulting in wet etching of the semiconductor. Different types of electrolyte including HCl, KOH, and HNO$_3$ have been shown to be effective in PEC etching of GaN and its alloys. The etch selectivity and etch rate can be optimized by selecting a favorable electrolyte. It is also possible to generate an external bias between the semiconductor and the cathode to assist with the PEC etching process. This process requires the inclusion of a buried sacrificial region 1707, which can be PEC etched selectively by bandgap. For GaN based semiconductor devices, InGaN layers such as quantum wells have been shown to be an effective sacrificial region during PEC etching. The first step is a top down etch to expose the selective release layers, followed by a bonding metal deposition. With the sacrificial region exposed a bandgap selective PEC etch is used to undercut the mesas. In one embodiment, the bandgaps of the sacrificial region and all other layers are chosen such that only the sacrificial region will absorb light, and therefore etch, during the PEC etch. Another embodiment of the invention involving light emitting devices uses a sacrificial region with a higher bandgap than the active region such that both layers are absorbing during the bandgap PEC etching process.

Epitaxial sacrificial layers for lift-off of the engineered substrate via photochemical etching would incorporate at a minimum a low-bandgap or doped layer that would absorb the pump light and have enhanced etch rate relative to the surrounding material. The epitaxial selective release layers 1707 can be deposited epitaxially and the alloy composition and doping of these can be selected such that hole carrier lifetime and diffusion lengths are high. Defects that reduce hole carrier lifetimes and diffusion length must can be avoided by growing the selective release layers under growth conditions that promote high material crystalline quality. An example of a epitaxial selective release layer would be InGaN layers that absorb at the wavelength of an external light source. An etch stop layer designed with very low etch rate to control the thickness of the adjacent material remaining after engineered substrate removal can also be incorporated to allow better control of the etch process. The etch properties of the etch stop layer can be controlled solely by or a combination of alloy composition and doping. A potential etch stop layer would an AlGaN or GaN layer with a bandgap higher than the external light source. Another potential etch stop layer is a highly doped n-type AlGaN or GaN layer with reduce minority carrier diffusion lengths and lifetime thereby dramatically reducing the etch rate of the etch stop material.

In some embodiments PEC etching is achieved without the use of an active region protecting layer by electrically shorting the p-side of the laser diode pn-junction to the n-side. Etching in the PEC process is achieved by the dissolution of AlInGaN materials at the wafer surface when holes are transferred to the etching solution. These holes are then recombined in the solution with electrons extracted at the cathode metal interface with the etching solution. Charge neutrality is therefore achieved. Selective etching is achieved by electrically shorting the anode to the cathode. Referring to FIG. 17, an electrical contact is made to the p-side of the active region junction using a p-contact metal 1710 optimized to provide good electrical contact to p-type GaN. A second metal layer 1706 electrically connects the p-contact metal to the n-type layers, thereby shorting the pn junction surrounding the active region. Electron hole pairs generated in the device light emitting layers are swept out of the light emitting layers by the electric field of the of the p-n junction. Since holes are swept out of the active region, there is little or no etching of the light emitting layer. The buildup of carriers produces a potential difference that drives carriers through the metal interconnects 1706 that short the anode and cathode where the carriers recombine. The flat band conditions in the sacrificial region result in a buildup of holes that result in rapid etching of the selective release layers at the edges of the selective release layer exposed to the etch solution. In one embodiment, the metal interconnects used to short the anode and cathode can be used as anchor regions to mechanically hold the gallium and nitrogen containing mesas in place prior to the bonding step.

The relative etch rates of the epitaxial sacrificial and active regions are determined by a number of factors, but primarily it is determined by the density of holes found in the active region at steady state. If the metal interconnects or anchors are very resistive, or if either the cathode or anode electrical contacts to the p-type and n-type, respectively, cladding regions are too resistive or have large Schottky barriers then it is possible for carriers to accumulate on either side of the p-n junction. These carriers will produce an electric field that acts against the field in the depletion region and will reduce the magnitude of the field in the depletion region until the rate of photo-generated carrier drift out of the active region is balanced by the recombination rate of carriers via the metal layers shorting the cathode and anode. Some recombination will take place via photochemical etching, and since this scales with the density of holes in the active region it is preferable to prevent the buildup of a photo-induced bias across the active region.

In one embodiment thermocompression bonding is used to transfer the gallium and nitrogen epitaxial semiconductor layers to the carrier wafer. In this embodiment thermocompression bonding involves bonding of the epitaxial semiconductor layers to the carrier wafer at elevated temperatures and pressures using a bonding media disposed between the epitaxial layers and handle wafer. The bonding media may be comprised of a number of different layers, but typically contain at least one layer (the bonding layer) that is composed of a relatively ductile material with a high surface diffusion rate. In many cases this material is comprised of Au, Al or Cu. The bonding media may also include layers disposed between the bonding layer and the epitaxial materials or handle wafer that promote adhesion. For example an Au bonding layer on a Si wafer may result in diffusion of Si to the bonding interface, which would reduce the bonding strength. Inclusion of a diffusion barrier such as silicon oxide or nitride would limit this effect. Relatively thin layers of a second material may be applied on the top surface of the bonding layer in order to promote adhesion between the bonding layers disposed on the epitaxial material and handle. Some bonding layer materials of lower ductility than gold (e.g. Al, Cu etc.) or which are deposited in a way that results in a rough film (for example electrolytic deposition) may require planarization or reduction in roughness via chemical or mechanical polishing before bonding, and reactive metals may require special cleaning steps to remove oxides or organic materials that may interfere with bonding.

Thermocompressive bonding can be achieved at relatively low temperatures, typically below 500° C. and above 200° C. Temperatures should be high enough to promote diffusivity between the bonding layers at the bonding interface, but not so high as to promote unintentional alloying of individual layers in each metal stack. Application of pressure enhances the bond rate, and leads to some elastic and plastic deformation of the metal stacks that brings them into better and more uniform contact. Optimal bond temperature, time and pressure will depend on the particular bond material, the roughness of the surfaces forming the bonding interface and the susceptibility to fracture of the handle wafer or damage to the device layers under load.

The bonding interface need not be composed of the totality of the wafer surface. For example, rather than a blanket deposition of bonding metal, a lithographic process could be used to deposit metal in discontinuous areas separated by regions with no bonding metal. This may be advantageous in instances where defined regions of weak or no bonding aid later processing steps, or where an air gap is needed. One example of this would be in removal of the GaN engineered substrate using wet etching of an epitaxially grown selective release layer. To access the selective release layer one must etch vias into either of the two surfaces of the epitaxial wafer, and preserving the wafer for re-use is most easily done if the vias are etched from the bonded side of the wafer. Once bonded, the etched vias result in channels that can conduct etching solution from the edges to the center of the bonded wafers, and therefore the areas of the engineered substrate comprising the vias are not in intimate contact with the handle wafer such that a bond would form.

The bonding media can also be an amorphous or glassy material bonded either in a reflow process or anodically. In anodic bonding the media is a glass with high ion content where mass transport of material is facilitated by the application of a large electric field. In reflow bonding the glass has a low melting point, and will form contact and a good bond under moderate pressures and temperatures. All glass bonds are relatively brittle, and require the coefficient of thermal expansion of the glass to be sufficiently close to the bonding partner wafers (i.e. the GaN wafer and the handle). Glasses in both cases could be deposited via vapor deposition or with a process involving spin on glass. In both cases the bonding areas could be limited in extent and with geometry defined by lithography or silk-screening process.

Gold-gold metallic bonding is used as an example in this work, although a wide variety of oxide bonds, polymer bonds, wax bonds, etc., are potentially suitable. Submicron alignment tolerances are possible using commercial available die bonding equipment. In another embodiment of the invention the bonding layers can be a variety of bonding pairs including metal-metal, oxide-oxide, soldering alloys, photoresists, polymers, wax, etc. Only epitaxial die which are in contact with a bond bad on the carrier wafer will bond. Sub-micron alignment tolerances are possible on commercially available die or flip chip bonders.

In an example, an oxide is overlaid on an exposed planar n-type or p-type gallium and nitrogen containing material or over an exposed planar n-type or p-type gallium and nitrogen containing material using direct wafer bonding of the surface of the gallium and nitrogen containing material to the surface of a carrier wafer comprised primarily of an oxide or a carrier wafer with oxide layers disposed on them. In both cases the oxide surface on the carrier wafer and the exposed gallium and nitrogen containing material are cleaned to reduce the amount of hydrocarbons, metal ions and other contaminants on the bonding surfaces. The bonding surfaces are then brought into contact and bonded at elevated temperature under applied pressure. In some cases the surfaces are treated chemically with acids, bases or plasma treatments to produce a surface that yields a weak bond when brought into contact with the oxide surface. For example the exposed surface of the gallium containing material may be treated to form a thin layer of gallium oxide, which being chemically similar to the oxide bonding surface will bond more readily. Furthermore the oxide and now gallium oxide terminated surface of the gallium and nitrogen containing material may be treated chemically to encourage the formation of dangling hydroxyl groups (among other chemical species) that will form temporary or weak chemical or van der Waals bonds when the surfaces are brought into contact, which are subsequently made permanent when treated at elevated temperatures and elevated pressures.

In an alternative example, an oxide material is deposited overlying the device layer mesa region to form a bond region. The carrier wafer is also prepared with an oxide layer to form a bond region. The oxide layer overlying the carrier wafer could be patterned or could be a blanket layer. The oxide surface on the carrier wafer and the oxide surface overlying the mesa device layer mesa regions are cleaned to reduce the amount of hydrocarbons, metal ions and other contaminants on the bonding surfaces. The bonding surfaces are then brought into contact and bonded at elevated temperature under applied pressure. In one embodiment, a chemical mechanical polish (CMP) process is used to planarize the oxide surface and make them smooth to improve the resulting bond. In some cases the surfaces are treated chemically with acids, bases or plasma treatments to produce a surface that yields a weak bond when brought into contact with the oxide surface. Bonding is performed at elevated temperatures and elevated pressures.

In another embodiment the bonding media could be a dielectric material such as silicon dioxide or silicon nitride. Such a bonding media may be desirable where low conductivity is desired at the bond interface to achieve properties such as reduced device capacitance to enable increased frequency operation. The bond media comprising the bond interface can be comprised of many other materials such as oxide-oxide pair, semiconductor-semiconductor pair, spin-on-glass, soldering alloys, polymers, photoresists, wax, or a combination thereof.

The carrier wafer can be chosen based on any number of criteria including but not limited to cost, thermal conductivity, thermal expansion coefficients, size, electrical conductivity, optical properties, and processing compatibility. The patterned epitaxy wafer, or donor, is prepared in such a way as to allow subsequent selective release of bonded epitaxy regions, here-in referred to as die. The patterned carrier wafer is prepared such that bond pads are arranged in order to enable the selective area bonding process. The bonding material can be a variety of media including but not limited to metals, polymers, waxes, and oxides. These wafers can be prepared by a variety of process flows, some embodiments of which are described below. In the first selective area bond step, the epitaxy wafer is aligned with the pre-patterned bonding pads on the carrier wafer and a combination of pressure, heat, and/or sonication is used to bond the mesas to the bonding pads.

In some embodiments of the invention the carrier wafer is another semiconductor material, a metallic material, or a ceramic material. Some potential candidates include silicon, gallium arsenide, sapphire, silicon carbide, diamond, gallium nitride, AlN, polycrystalline AlN, indium phosphide, germanium, quartz, copper, copper tungsten, gold, silver, aluminum, stainless steel, or steel.

In some embodiments, the carrier wafer is selected based on size and cost. For example, ingle crystal silicon wafers are available in diameters up to 300 mm or 12 inch, and are most cost effective. By transferring gallium and nitrogen epitaxial materials from 2" gallium and nitrogen containing engineered substrates to large silicon substrates of 150 mm, 200 mm, or 300 mm diameter the effective area of the semiconductor device wafer can be increases by factors of up to 36 or greater. This feature of this invention allows for high quality gallium and nitrogen containing semiconductor devices to be fabricated in mass volume leveraging the established infrastructure in silicon foundries.

In some embodiments of the invention, the carrier wafer material is chosen such that it has similar thermal expansion properties to group-III nitrides, high thermal conductivity, and is available as large area wafers compatible with standard semiconductor device fabrication processes. The carrier wafer is then processed with structures enabling it to also act as the submount for the semiconductor devices. Singulation of the carrier wafers into individual die can be accomplished either by sawing, cleaving, or a scribing and breaking process. By combining the functions of the carrier wafer and finished semiconductor device submount the number of components and operations needed to build a packaged device is reduced, thereby lowering the cost of the final semiconductor device significantly.

In an example, the carrier wafer is a solid material with thermal conductivity greater than 100 W/m-K. In an example, the common substrate is preferably a solid material with thermal conductivity greater than 200 W/m-K. In an example, the common substrate is preferably a solid material with thermal conductivity greater than 400 W/m-K. In an example, the common substrate is preferably a solid material with electrical insulator with electrical resistivity greater than $1 \times 10^6$ ohm-cm. In an example, the common substrate is preferably a solid material with thin film material providing electrical $1 \times 10^6$ ohm-cm. In an example, the common substrate selected from one or more of $Al_2O_3$, AlN, SiC, BeO and diamond. In an example, the common substrate is preferably comprised of crystalline SiC. In an example, the common substrate is preferably comprised of crystalline SiC with a thin film of $Si_3N_4$ deposited onto the top surface. In an example, the common substrate contains metal traces providing electrically conductive connections between the one or more low-cost laser diodes. In an example, the common substrate contains metal traces providing thermally conductive connections between the one or more low-cost laser diodes and the common substrate.

In one embodiment of this invention, the bonding of the semiconductor device epitaxial material to the carrier wafer process can be performed prior to the selective etching of the sacrificial region and subsequent release of the gallium and nitrogen containing engineered substrate. FIG. 16 is a schematic illustration of a process comprised of first forming the bond between the gallium and nitrogen containing epitaxial material formed on the gallium and nitrogen containing engineered substrate and then subjecting a sacrificial release material to a selective removal process to release the gallium and nitrogen containing engineered substrate. In this embodiment, one or more gallium and nitrogen containing epitaxial layers 1604 are deposited on the engineered substrate, through an epitaxial deposition process such as metal organic chemical vapor deposition (MOCVD), molecular beam epitaxy (MBE), or other. The epitaxial material includes at least device layers, but in some embodiments may include epitaxially grown selective release layers. Referring to FIG. 16, engineered substrate wafer 1600, comprising a handle wafer 1601, and bond layer 1602, and a crystalline seed layer 1603, is overlaid by epitaxial layers 1604. The epitaxial layers, seed layer, and engineered-substrate bond layer are patterned using wet or dry etch processes to form mesa structures that will be transferred to a carrier wafer 1606. Discontinuous regions of bond media 1605 are deposited on the mesas. In some embodiments, the bond media 1605 is deposited prior to forming the mesas. The bond layers 1605 on the engineered substrate are brought into intimate contact with regions of bond media 1607 on the carrier wafer surface and a bond is formed. The bond layer 1602 of the engineered substrate is then removed with a selective etch process.

In other embodiments, the engineered substrate contains a selectively removable selective release layer that is separate from the engineered substrate bond layer. In some embodiments, the crystalline seed layer is also the selective release layer of the engineered substrate. In some embodiments, there is no selective release layer in the engineered substrate and an epitaxially grown selective release layer composed of InGaN or GaN is selectively etched using a photoelectrochemical etch process.

In a preferred embodiment of this invention, the bonding process is performed after the selective etching of the sacrificial region. This embodiment offers several advantages. One advantage is easier access for the selective etchant to uniformly etch the sacrificial region across the semiconductor wafer comprising a gallium and nitrogen containing engineered substrate such as GaN and bulk gallium and nitrogen containing epitaxial device layers. A second advantage is the ability to perform multiple bond steps. In one example, the "etch-then-bond" process flow can be deployed where the mesas are retained on the engineered substrate by controlling the etch process such that not all parts of the selective release layer is removed. Referring to FIG. 15, an engineered substrate wafer is overlaid by a buffer layer 1504, a selective release layer 1505 and a collection of device layers 1506. A bond layer 1508 is deposited along with a cathode metal that will be used to facilitate the photoelectrochemical etch process for selectively removing the selective release layer 1505. The selective etch process is carried out to the point where only a small fraction of the selective release layer 1505 is remaining, such that multiple mesas or mesa regions are formed and retained on the engineered substrate, but the unetched portions of the selective release layer 1505 are easily broken during or after the mesas are bonded to a carrier wafer.

Other than typical GaN based laser devices, undercut AlInGaAsP based laser devices can be produced in a manner similar to GaN based laser diodes described in this invention. There are a number of wet etches that etch some AlInGaAsP alloys selectively. In one embodiment, an AlGaAs or AlGaP selective release layer could be grown clad with GaAs etch stop layers. When the composition of $Al_xGa_{1-x}As$ and $Al_xGa_{1-x}P$ is high (x>0.5) AlGaAs can be etched with almost complete selectivity (i.e. etch rate of AlGaAs>$10^6$ times that of GaAs) when etched with HF. InGaP and AlInP with high InP and AlP compositions can be etched with HCl selectively relative to GaAs. GaAs can be etched selectively relative to AlGaAs using $C_6H_8O_7$:$H_2O_2$:$H_2O$. There are a number of other combinations of selective release layer, etch-stop layer and etch chemistry which are widely known to those knowledgeable in the art of micromachining AlInGaAsP alloys.

In an embodiment, the AlInGaAsP device layers are exposed to the etch solution which is chosen along with the selective release layer composition such that only the selective release layers experience significant etching. The active region can be prevented from etching during the compositionally selective etch using an etch resistant protective layer, such as like silicon dioxide, silicon nitride, metals or photoresist among others, on the sidewall. This step is followed by the deposition of a protective insulating layer on the mesa sidewalls, which serves to block etching of the active region during the later sacrificial region undercut etching step. A second top down etch is then performed to expose the selective release layers and bonding metal is deposited. With the sacrificial region exposed a compositionally selective etch is used to undercut the mesas. At this point, the selective area bonding process is used to continue fabricating devices. The device layers should be separated from the selective release layers by a layer of material that is resistant to etching. This is to prevent etching into the device layers after partially removing the selective release layers.

A critical challenge of the etch-then-bond embodiment is mechanically supporting the undercut epitaxial device layer mesa region from spatially shifting prior to the bonding step. If the mesas shift the ability to accurately align and arrange them to the carrier wafer will be compromised, and hence the ability to manufacture with acceptable yields. Mechanically fixing the mesa regions in place prior to bonding can be achieved in several ways. In a preferred embodiment, anchor regions are used to mechanically support the mesas to the gallium and nitrogen containing engineered substrate prior to the bonding step wherein they are releases from the gallium and nitrogen containing engineered substrate and transferred to the carrier wafer.

Anchor regions are special features that can be designed into the photo masks which attach the undercut device layers to the engineered substrate and which prevent fully undercut regions of the device layers from prematurely detaching from the engineered substrate during the etch and transfer processes. In some embodiments, the anchors are formed as part of the mesa region, but which are designed to be too wide to themselves be undercut, or which due to the design of the mask contain regions where the selective release layers are not removed. In other embodiments, these features may be composed of metals or dielectrics that are resistant to the etch and which overlay part or all of each mesa and connect it to the engineered substrate. These features act as anchors, preventing the undercut device layers from detaching from the engineered substrate and prevent the device layers from spatially shifting. This anchor attachment to the engineered substrate can also be achieved by incompletely removing the selective release layer, such that there is a tenuous connection between the undercut device layers and the engineered substrate which can be broken during bonding. The surfaces of the bonding material on the carrier wafer and the device wafer are then brought into contact and a bond is formed which is stronger than the attachment of the undercut device layers to the material in the anchor regions of the selective release layers. After bonding, the separation of the carrier wafer and epitaxial device wafer breaks the anchors and results in transfer of the device layers to the carrier wafer.

In one embodiment the anchor region is formed by features that are wider than the device layer mesas such that the sacrificial region in these anchor regions is not fully removed during the undercut of the device layers. In one example the mesas are retained on the engineered substrate by deposition of an etch-resistant material acting as an anchor by connecting the mesas to the engineered substrate. In this example an engineered substrate wafer is overlaid by a buffer layer, a selective release layer and a collection of device layers. The bond layer is deposited along with a cathode metal that will be used to facilitate the photoelectrochemical etch process for selectively removing the selective release layer. A layer of etch resistant material, which may be composed of metal, ceramic, polymer or a glass, is deposited such that it connects to both the mesa and the engineered substrate. The selective etch process is carried out such that the selective release layer is fully removed and only the etch-resistant layer connects the mesa to the engineered substrate.

In another example of anchor techniques, the mesas are retained on the engineered substrate by use of an anchor composed of epitaxial material. In this example an engineered substrate wafer is overlaid by a buffer layer, a selective release layer and a collection of device layers. The bond layer is deposited along with a cathode metal that will be used to facilitate the photoelectrochemical etch process for selectively removing the selective release layer. The anchor is shaped such that during the etch, a small portion of the selective release layer remains unetched and creates a connection between the undercut mesa and the engineered substrate wafer. In some embodiments of this example a selective release layer in the engineered substrate is used to undercut the mesas. For example, an oxide bond layer in the engineered substrate could be etched selectively with a solution containing hydrofluoric acid.

In one embodiment the anchors are positioned either at the ends or sides of the undercut die such that they are connected by a narrow, undercut region of material. In this example the narrow connecting material is far from the bond metal and is design such that the undercut material cleaves at the connecting material rather than across the die. This has the advantage of keeping the entire width of the die undamaged, which would be advantageous. In another embodiment, geometric features are added to the connecting material to act as stress concentrators and the bond metal is extended onto the narrow connecting material. The bond metal reinforces the bulk of the connecting material. Adding these features increases the control over where the connection will cleave. These features can be triangles, circles, rectangles or any deviation that provides a narrowing of the connecting material or a concave profile to the edge of the connecting material.

In another embodiment the anchors are of small enough lateral extent that they may be undercut, however a protective coating is used to prevent etch solution from accessing the selective release layers in the anchors. This embodiment is advantageous in cases when the width of the die to be transferred is large. Unprotected anchors would need to be larger to prevent complete undercutting, which would reduce the density of die and reduce the utilization efficiency of epitaxial material.

In another embodiment, the anchors are located at the ends of the die and the anchors form a continuous strip of material that connects to all or a plurality of die. This configuration is advantageous since the anchors can be patterned into the material near the edge of wafers or lithographic masks where material utilization is otherwise poor. This allows for utilization of device material at the center of the pattern to remain high even when die sizes become large.

In a preferred embodiment the anchors are formed by depositing separate regions of an etch-resistant material that adheres well to the epitaxial and engineered substrate material. These regions overlay a portion of the semiconductor device layer mesa and some portion of the structure, such as the engineered substrate, that will not be undercut during the etch. These regions form a continuous connection, such that after the semiconductor device layer mesa is completely undercut they provide a mechanical support preventing the semiconductor device layer mesa from detaching from the engineered substrate. Metal layers are then deposited on the top of semiconductor device layer mesa, the sidewall of the semiconductor device layer mesa and the bottom of the etched region surrounding the mesa such that a continuous connection is formed. As an example, the metal layers could comprise about 20 nm of titanium to provide good adhesion and be capped with about 500 nm of gold, but of course the choice of metal and the thicknesses could be others. In an example, the length of the semiconductor device die sidewall coated in metal is about 1 nm to about 40 nm, with the upper thickness being less than the width of the semiconductor device die such that the selective release layer is etched completely in the region near the metal anchor where access to the selective release layer by etchant will be limited.

The mesa regions can be formed by dry or wet chemical etching, and in one example would include at least a p++ GaN contact layer, a p-type cladding layer comprised of GaN, AlGaN, or InAlGaN, light emitting layers such as quantum wells separated by barriers, waveguiding layers such as InGaN layers, and the a n-type cladding layers comprised of GaN, AlGaN, or InAlGaN, the selective release layer (504), and a portion of the n-type GaN epitaxial layer beneath the selective release layer. A p-contact metal is first deposited on the p++ GaN contact layer in order to form a high quality electrical contact with the p-type cladding. A second metal stack is then patterned and deposited on the mesa, overlaying the p-contact metal. The second metal stack consists of an n-contact metal, forming a good electrical contact with the n-type GaN layer beneath the selective release layer, as well as a relatively thick metal layer that acts as both the mesa bond pad 505 and the cathode metal stack 506. The bond/cathode metal also forms a thick layer overlaying the edge of the mesa and providing a continuous connection between the mesa top and the engineered substrate. After the selective release layer 504 is removed by selective photochemical etching the thick metal provides mechanical support to retain the mesa in position on the GaN wafer until the bonding to (the bond material 507 of) the carrier wafer 508 is carried out.

The use of metal anchors has several advantages over the use of anchors made from the epitaxial device material. The first is density of the transferrable mesas on the donor wafer containing the epitaxial semiconductor device layers and the gallium and nitrogen containing engineered substrate. Anchors made from the epitaxial material must be large enough to not be fully undercut by the selective etch, or they must be protected somehow with a passivation layer. The inclusion of a large feature that is not transferred will reduce the density of mesas in two dimensions on the epitaxial device wafer. The use of metal anchors is preferable because the anchors are made from a material that is resistant to etch and therefore can be made with small dimensions that do not impact mesa density. The second advantage is that it simplifies the processing of the mesas because a separate passivation layer is no longer needed to isolate the active region from the etch solution. Removing the active region protecting layer reduces the number of fabrication steps while also reducing the size of the mesa required.

Referring to FIG. 17, in a particular embodiment the cathode metal stack 1705 and 1706 also include metal layers intended to increase the strength of the metal anchors. For example the cathode metal stack might consist of 100 nm of Ti to promote adhesion of the cathode metal stack and provide a good electrical contact to the n-type cladding. The cathode metal stack 1705 and 1706 could then incorporate a layer of tungsten, which has an elastic modulus on the order of four times higher than gold. Incorporating the tungsten would reduce the thickness of gold required to provide enough mechanical support to retain the mesas after they are undercut by the selective etch.

In another embodiment of the invention the sacrificial region is completely removed by PEC etching and the mesa remains anchored in place by any remaining defect pillars. PEC etching is known to leave intact material around defects which act as recombination centers. Additional mechanisms by which a mesa could remain in place after a complete sacrificial etch include static forces or Van der Waals forces. In one embodiment the undercutting process is controlled such that the selective release layer is not fully removed.

In a preferred embodiment, the semiconductor device epitaxy material with the underlying sacrificial region is fabricated into a dense array of mesas on the gallium and nitrogen containing engineered substrate with the overlying semiconductor device layers. The mesas are formed using a patterning and a wet or dry etching process wherein the patterning comprises a lithography step to define the size and pitch of the mesa regions. Dry etching techniques such as reactive ion etching, inductively coupled plasma etching, or chemical assisted ion beam etching are candidate methods. Alternatively, a wet etch can be used. The etch is configured to terminate at or below a sacrificial region below the device layers. This is followed by a selective etch process such as PEC to fully or partially etch the exposed sacrificial region such that the mesas are undercut. This undercut mesa pattern pitch will be referred to as the 'first pitch'. The first pitch is often a design width that is suitable for fabricating each of the epitaxial regions on the engineered substrate, while not large enough for the desired completed semiconductor device design, which often desire larger non-active regions or regions for contacts and the like. For example, these mesas would have a first pitch ranging from about 5 μm to about 500 μm or to about 5000 μm. Each of these mesas is a 'die'.

In a preferred embodiment, these dice are transferred to a carrier wafer at a second pitch using a selective bonding process such that the second pitch on the carrier wafer is greater than the first pitch on the gallium and nitrogen containing engineered substrate. In this embodiment the dice are on an expanded pitch for so called "die expansion". In an example, the second pitch is configured with the dice to allow each die with a portion of the carrier wafer to be a semiconductor device, including contacts and other components. For example, the second pitch would be about 50 μm to about 1000 μm or to about 5000 μm, but could be as large at about 3-10 mm or greater in the case where a large semiconductor device chip is required for the application. The larger second pitch could enable easier mechanical handling without the expense of the costly gallium and nitrogen containing substrate and epitaxial material, allow the real estate for additional features to be added to the semiconductor device chip such as bond pads that do not require the costly gallium and nitrogen containing engineered substrate and epitaxial material, and/or allow a smaller gallium and nitrogen containing epitaxial wafer containing epitaxial layers to populate a much larger carrier wafer for subsequent processing for reduced processing cost. For example, a 4 to 1 die expansion ratio would reduce the density of the gallium and nitrogen containing material by a factor of 4, and hence populate an area on the carrier wafer 4 times larger than the gallium and nitrogen containing engineered substrate. This would be equivalent to turning a 2" gallium and nitrogen engineered substrate into a 4" carrier wafer. In particular, the present invention increases utilization of engineered substrate wafers and epitaxy material through a selective area bonding process to transfer individual die of epitaxy material to a carrier wafer in such a way that the die pitch is increased on the carrier wafer relative to the original epitaxy wafer. The arrangement of epitaxy material allows device components which do not require the presence of the expensive gallium and nitrogen containing engineered substrate and overlying epitaxy material often fabricated on a gallium and nitrogen containing engineered substrate to be fabricated on the lower cost carrier wafer, allowing for more efficient utilization of the gallium and nitrogen containing engineered substrate and overlying epitaxy material.

FIG. 18 is a schematic representation of the die expansion process with selective area bonding according to the present invention. A device wafer is prepared for bonding in accordance with an embodiment of this invention. The device wafer consists of an engineered substrate comprised of a handle wafer 1801, crystalline seed layer 1802, and epitaxial device layers 1803. The engineered substrate selective release layer is removed using a wet etch containing hydrofluoric acid. The mesa regions formed in the gallium and nitrogen containing epitaxial wafer form dice of epitaxial material and release layers defined through processing. Anchor features 1805 resistant to etching with HF acid are provided or each mesa to prevent premature detachment.

Individual epitaxial material dice are formed at a first pitch 1810. A carrier wafer is prepared consisting of the carrier wafer 1806 and bond pads 1807 at a second pitch 1811. The engineered substrate is aligned to the carrier wafer such that a subset of the mesa on the gallium and nitrogen containing engineered substrate with a first pitch aligns with a subset of bond pads on the carrier wafer at a second pitch. Since the first pitch is smaller than the second pitch and the mesas will comprise device die, the basis for die expansion is established. The bonding process is carried out and upon separation of the engineered substrate from the carrier wafer a subset of mesas 1809 on the engineered substrate is selectively transferred to the carrier wafer as transferred mesas 1808. The process is then repeated with a second set of mesas and bond pads on the carrier wafer until the carrier wafer is populated fully by epitaxial mesas. The gallium and nitrogen containing epitaxy engineered substrate can now optionally be prepared for reuse.

In the example depicted in FIG. 18, one quarter of the epitaxial dice on the engineered substrate are transferred in this first selective bond step, leaving three quarters on the engineered substrate. The selective area bonding step is then repeated to transfer the second quarter, third quarter, and fourth quarter of the epitaxial die to the patterned carrier wafer 1806. This selective area bond may be repeated any number of times and is not limited to the four steps depicted in FIG. 18. The result is an array of epitaxial die on the carrier wafer 1806 with a wider die pitch than the original die pitch on the engineered substrate. The die pitch on the engineered substrate will be referred to as pitch 1, and the die pitch on the carrier wafer will be referred to as pitch 2, where pitch 2 is greater than pitch 1.

In one embodiment the bonding between the carrier wafer and the gallium and nitrogen containing engineered substrate with epitaxial layers is performed between bonding layers that have been applied to the carrier and the gallium and nitrogen containing engineered substrate with epitaxial layers. The bonding layers can be a variety of bonding pairs including metal-metal, oxide-oxide, soldering alloys, photoresists, polymers, wax, etc. Only epitaxial dice which are in contact with a bond pad 1807 on the carrier wafer 1806 will bond. Sub-micron alignment tolerances are possible on commercial die bonders. The engineered substrate with epitaxial layers is then pulled away, breaking the epitaxy material at a weakened epitaxial release layer or anchor regions such that the desired epitaxial layers remain on the carrier wafer. Herein, a 'selective area bonding step' is defined as a single iteration of this process.

In one embodiment, the carrier wafer 1806 is patterned in such a way that only selected mesas come in contact with the metallic bond pads 1807 on the carrier wafer 1806. When the engineered substrate is pulled away the bonded mesas break off at the weakened sacrificial region or anchor regions, while the un-bonded mesas remain attached to the engineered substrate. This selective area bonding process can then be repeated to transfer the remaining mesas in the desired configuration. This process can be repeated through any number of iterations and is not limited to the two iterations depicted in FIG. 18. The carrier wafer can be of any size, including but not limited to about 2 inch, 3 inch, 4 inch, 6 inch, 8 inch, and 12 inch. After all desired mesas have been transferred, a second bandgap selective PEC etching can be optionally used to remove any remaining sacrificial region material to yield smooth surfaces. At this point standard semiconductor device processes can be carried out on the carrier wafer. Another embodiment of the invention incorporates the fabrication of device components on the dense epitaxy wafers before the selective area bonding steps.

In an example, the present invention provides a method for increasing the number of gallium and nitrogen containing semiconductor devices which can be fabricated from a given epitaxial surface area; where the gallium and nitrogen containing epitaxial layers overlay an engineered substrates. The gallium and nitrogen containing epitaxial material is patterned into die with a first die pitch; the die from the gallium and nitrogen containing epitaxial material with a first pitch is transferred to a carrier wafer to form a second die pitch on the carrier wafer; the second die pitch is larger than the first die pitch.

In an example, each epitaxial device die is an etched mesa with a pitch of between about 1 µm and about 100 µm wide or between about 100 µm and about 500 µm wide or between about 500 µm and about 3000 µm wide and between about 100 and about 3000 µm long. In an example, the second die pitch on the carrier wafer is between about 100 µm and about 200 µm or between about 200 µm and about 1000 µm or between about 1000 µm and about 3000 µm. In an example, the second die pitch on the carrier wafer is between about 2 times and about 50 times larger than the die pitch on the epitaxy wafer. In an example, semiconductor LED devices, laser devices, or electronic devices are fabricated on the carrier wafer after epitaxial transfer. In an example, the semiconductor devices contain GaN, AlN, InN, InGaN, AlGaN, InAlN, and/or InAlGaN. In an example, the gallium and nitrogen containing material are grown on a polar, nonpolar, or semipolar plane. In an example, one or multiple semiconductor devices are fabricated on each die of epitaxial material. In an example, device components which do not require epitaxy material are placed in the space between epitaxy die.

In one embodiment, device dice are transferred to a carrier wafer such that the distance between die is expanded in both the transverse as well as lateral directions. This can be achieved by spacing bond pads on the carrier wafer with larger pitches than the spacing of device die on the engineered substrate.

In another embodiment of the invention device dice from a plurality of epitaxial wafers are transferred to the carrier wafer such that each design width on the carrier wafer contains dice from a plurality of epitaxial wafers. When transferring dice at close spacing from multiple epitaxial wafers, it is important for the un-transferred dice on the epitaxial wafer to not inadvertently contact and bond to die already transferred to the carrier wafer. To achieve this, epitaxial dice from a first epitaxial wafer are transferred to a carrier wafer using the methods described above. A second set of bond pads are then deposited on the carrier wafer and are made with a thickness such that the bonding surface of the second pads is higher than the top surface of the first set of transferred die. This is done to provide adequate clearance for bonding of the dice from the second epitaxial wafer. A second epitaxial wafer transfers a second set of dice to the carrier wafer. Finally, the semiconductor devices are fabricated and passivation layers are deposited followed by electrical contact layers that allow each die to be individually driven. The dice transferred from the first and second engineered substrates are spaced at a pitch which is smaller than the second pitch of the carrier wafer. This process can be extended to transfer of dice from any number of epitaxial engineered substrates, and to transfer of any number of devices per dice from each epitaxial engineered substrate.

Once the laser diode epitaxial structure has been transferred to the carrier wafer as described in this invention, wafer level processing can be used to fabricate the dice into laser diode devices. The wafer process steps may be similar to those described in this specification for more conventional laser diodes. For example, in many embodiments the bonding media and dice will have a total thickness of less than about 7 µm, making it possible to use standard photoresist, photoresist dispensing technology and contact and projection lithography tools and techniques to pattern the wafers. The aspect ratios of the features are compatible with deposition of thin films, such as metal and dielectric layers, using evaporators, sputter and CVD deposition tools.

The laser diode device may have laser stripe region formed in the transferred gallium and nitrogen containing epitaxial layers. In the case where the laser is formed on a polar c-plane, the laser diode cavity can be aligned in the m-direction with cleaved or etched mirrors. Alternatively, in the case where the laser is formed on a semipolar plane, the laser diode cavity can be aligned in a projection of a c-direction. The laser strip region has a first end and a second end and is formed on a gallium and nitrogen containing engineered substrate having a pair of cleaved mirror structures, which face each other. The first cleaved facet comprises a reflective coating and the second cleaved facet comprises no coating, an antireflective coating, or exposes gallium and nitrogen containing material. The first cleaved facet is substantially parallel with the second cleaved facet. The first and second cleaved facets are provided by a scribing and breaking process according to an embodiment or alternatively by etching techniques using etching technologies such as reactive ion etching (ME), inductively coupled plasma etching (ICP), or chemical assisted ion beam etching (CAIBE), or other method. Typical gases used in the etching process may include Cl and/or $BCl_3$. The first and second mirror surfaces each comprise a reflective coating. The coating is selected from silicon dioxide, hafnia, and titania, tantalum pentoxide, zirconia, including combinations, and the like. Depending upon the design, the mirror surfaces can also comprise an anti-reflective coating.

In a specific embodiment, the method of facet formation includes subjecting the engineered substrates to a laser for pattern formation. In a preferred embodiment, the pattern is configured for the formation of a pair of facets for a ridge lasers. In a preferred embodiment, the pair of facets face each other and are in parallel alignment with each other. In a preferred embodiment, the method uses a UV (355 nm) laser to scribe the laser bars. In a specific embodiment, the laser is configured on a system, which allows for accurate scribe lines configured in a different patterns and profiles. In some embodiments, the laser scribing can be performed on the back-side, front-side, or both depending upon the application. Of course, there can be other variations, modifications, and alternatives.

By aligning the device dice such that the intended plane of the facet is coplanar with an easily cleaved plane of the single-crystal carrier wafer. Mechanical or laser scribes can then be used, as described above, to guide and initiate cleavage in the carrier wafer such that it is located properly with respect to the laser die and carrier wafer patterns. Zincblende, cubic and diamond-lattice crystals work well for cleaved carriers with several sets of orthogonal cleavage planes (e.g. [110], [001], etc.). Singulation of the carrier wafers into individual die can be accomplished either by sawing or cleaving. In the case of singulation using cleaving the same cleavage planes and techniques can be used as described for facet formation.

In a specific embodiment, the method uses backside laser scribing or the like. With backside laser scribing, the method preferably forms a continuous line laser scribe that is perpendicular to the laser bars on the backside of the GaN engineered substrate. In a specific embodiment, the laser scribe is generally about 15-20 µm deep or other suitable depth. Preferably, backside scribing can be advantageous. That is, the laser scribe process does not depend on the pitch of the laser bars or other like pattern. Accordingly, backside laser scribing can lead to a higher density of laser bars on each engineered substrate according to a preferred embodiment. In a specific embodiment, backside laser scribing, however, may lead to residue from the tape on the facets. In a specific embodiment, backside laser scribe often requires that the engineered substrates face down on the tape. With front-side laser scribing, the backside of the engineered substrate is in contact with the tape. Of course, there can be other variations, modifications, and alternatives.

It is well known that etch techniques such as chemical assisted ion beam etching (CAIBE), inductively coupled plasma (ICP) etching, or reactive ion etching (RIE) can result in smooth and vertical etched sidewall regions, which could serve as facets in etched facet laser diodes. In the etched facet process a masking layer is deposited and patterned on the surface of the wafer. The etch mask layer could be comprised of dielectrics such as silicon dioxide ($SiO_2$), silicon nitride ($Si_xN_y$), a combination thereof or other dielectric materials. Further, the mask layer could be comprised of metal layers such as Ni or Cr, but could be comprised of metal combination stacks or stacks comprising metal and dielectrics. In another approach, photoresist masks can be used either alone or in combination with dielectrics and/or metals. The etch mask layer is patterned using conventional photolithography and etch steps. The alignment lithography could be performed with a contact aligner or stepper aligner. Such lithographically defined mirrors provide a high level of control to the design engineer. After patterning of the photoresist mask on top of the etch mask is complete, the patterns in then transferred to the etch mask using a wet etch or dry etch technique. Finally, the facet pattern is then etched into the wafer using a dry etching technique selected from CAIBE, ICP, RIE and/or other techniques. The etched facet surfaces must be highly vertical of between about 87 and about 93 degrees or between about 89 and about 91 degrees from the surface plane of the wafer. The etched facet surface region must be very smooth with root mean square roughness values of less than about 50 nm, 20 nm, 5 nm, or 1 nm. Lastly, the etched must be substantially free from damage, which could act as non-radiative recombination centers and hence reduce the COMD threshold. CAIBE is known to provide very smooth and low damage sidewalls due to the chemical nature of the etch, while it can provide highly vertical etches due to the ability to tilt the wafer stage to compensate for any inherent angle in etch.

The laser stripe is characterized by a length and width. The length ranges from about 50 µm to about 3000 µm, but is preferably between about 10 µm and about 400 µm, between about 400 µm and about 800 µm, or about 800 µm and about 1600 µm, but could be others such as greater than 1600 µm. The stripe also has a width ranging from about 0.5 µm to about 50 µm, but is preferably between about 0.8 µm and about 2.5 µm for single lateral mode operation or between about 2.5 µm and about 80 µm for multi-lateral mode operation, but can be other dimensions. In a specific embodiment, the present device has a width ranging from about 0.5 µm to about 1.5 µm, a width ranging from about 1.5 µm to about 3.0 µm, a width ranging from about 3.0 µm to about 360 µm, and others. In a specific embodiment, the width is substantially constant in dimension, although there may be slight variations. The width and length are often formed using a masking and etching process, which are commonly used in the art.

The laser stripe is provided by an etching process selected from dry etching or wet etching. The device also has an overlying dielectric region, which exposes a p-type contact region. Overlying the contact region is a contact material, which may be metal or a conductive oxide or a combination thereof. The p-type electrical contact may be deposited by thermal evaporation, electron beam evaporation, electroplating, sputtering, or another suitable technique. Overlying the polished region of the engineered substrate is a second contact material, which may be metal or a conductive oxide or a combination thereof and which comprises the n-type electrical contact. The n-type electrical contact may be deposited by thermal evaporation, electron beam evaporation, electroplating, sputtering, or another suitable technique.

An example of a processed laser diode cross-section according to one embodiment of the present invention is shown in FIG. 19. In this example an n-contact 1901 is formed on top of n-type gallium and nitrogen contact layer 1902 and n-type cladding layer 1903 that have been etched to form a ridge waveguide 1904. The n-type cladding layer 1903 overlies an n-side waveguide layer or separate confinement heterostructure (SCH) layer 1905 and the n-side SCH overlies an active region 1906 that contains light emitting layers such as quantum wells. The active region overlies an optional p-side SCH layer 1907 and an electron blocking layer (EBL) 1908. The optional p-side SCH layer overlies the p-type cladding 1909 and a p-contact layer 1910. Underlying the p-contact layer 1910 is a metal stack 1911 that contains the p-type contact and bond metal used to attach the transferred gallium and nitrogen containing epitaxial layers to the carrier wafer 1912.

Once the laser diodes have been fully processed within the gallium and nitrogen containing layers that have been transferred to the carrier wafer, the carrier wafer must be diced. Several techniques can be used to dice the carrier wafer and the optimal process will depend on the material selection for the carrier wafer. As an example, for Si, InP, or GaAs carrier wafers that cleave very easily, a cleaving process can be used wherein a scribing and breaking process using conventional diamond scribe techniques may be most suitable. For harder materials such as GaN, AlN, SiC, sapphire, or others where cleaving becomes more difficult a laser scribing and breaking technique may be most suitable. In other embodiments a sawing process may be the most optimal way to dice the carrier wafer into individual laser chips. In a sawing process a rapidly rotating blade with hard cutting surfaces like diamond are used, typically in conjunction with spraying water to cool and lubricate the blade. Example saw tools used to commonly dice wafers include Disco saws and Accretech saws.

By choosing a carrier wafer material such as AlN, BeO, diamond, or SiC that is suitable as a submount between the laser chip and the mounting surface, the diced laser chip on the carrier wafer is in itself a chip on submount (CoS). This wafer level packaging features is a strong benefit of the lifted-off and transferred gallium and nitrogen containing epitaxial layer embodiment of this invention.

A schematic diagram illustrating a CoS based on lifted off and transferred epitaxial gallium and nitrogen containing layers according to this present invention is shown in FIG. 20. The CoS is comprised of submount material 2001 configured from the carrier wafer with the transferred epitaxial material with a laser diode configured within the epitaxy 2002. Electrodes 2003 and 2004 are electrically coupled to the n-side and the p-side of the laser diode device and configured to transmit power from an external source to the laser diode to generate a laser beam output 2005 from the laser diode. The electrodes are configured for an electrical connection to an external power source such as a laser driver, a current source, or a voltage source. Wirebonds can be formed on the electrodes to couple the power to the laser diode device. This integrated CoS device with transferred epitaxial material offers advantages over the conventional configuration such as size, cost, and performance due to the low thermal impedance.

Further process and device description for this embodiment describing laser diodes formed in gallium and nitrogen containing epitaxial layers that have been transferred from the native gallium and nitrogen containing engineered substrates are described in U.S. patent application Ser. No. 14/312,427 and U.S. Patent Publication No. 2015/0140710, which are incorporated by reference herein. As an example, this technology of GaN transfer can enable lower cost, higher performance, and a more highly manufacturable process flow.

While the above is a full description of the specific embodiments, various modifications, alternative constructions and equivalents may be used. As an example, the packaged device can include any combination of elements described above, as well as outside of the present specification. Although the embodiments above have been described in terms of a laser diode, the methods and device structures can also be applied to other stimulated light emitting devices. Therefore, the above description and illustrations should not be taken as limiting the scope of the present invention which is defined by the appended claims.

What is claimed is:

1. A method for manufacturing a semiconductor device, the method comprising:

providing a substrate comprising a crystalline seed region overlaying a bonding material overlaying a mechanical handle wafer, the crystalline seed region comprising a plurality of non-contiguous crystalline seed regions each having a rectangular shape;

forming a gallium and nitrogen containing epitaxial material overlying the crystalline seed region, the epitaxial material comprising at least an intrinsic-type or unintentionally doped region overlying the crystalline seed region, or at least an n-type region overlying the crystalline seed region, or at least a p-type region overlying the crystalline seed region, or at least a combination of one or more n-type regions, p-type regions, and unintentionally doped regions overlying the crystalline seed region;

providing a selective release layer either as a non-epitaxial material disposed between the mechanical handle wafer and the crystalline seed region or as a region of the epitaxial material that can be selectively removed relative to surrounding epitaxial layers;

patterning the epitaxial material and forming mesas to form a plurality of dice arranged in an array, each die corresponding to at least one semiconductor device and being arranged by a first pitch between adjacent die in the array;

forming an interface region overlying the epitaxial material, the interface region comprising a metal, a semiconductor, a dielectric, or an oxide;

subjecting the selective release layer to a chemical etch or energy source to fully or partially remove the selective release layer;

bonding the interface region to a carrier wafer to form a bonded structure, while maintaining the selective release layer completely or partially etched away from the bonded structure;

releasing the plurality of dice provided on the substrate to transfer the plurality of dice to the carrier wafer wherein each pair of the transferred dice is configured with a second pitch between each pair of the transferred dice on the carrier wafer, the second pitch being equal or greater than the first pitch; and processing at least one of the plurality of the transferred dice on the carrier wafer to form at least a semiconductor device.

2. The method of claim 1, wherein the crystalline seed region includes a plurality of single crystalline films each having a polar, non-polar, or semi-polar plane orientation and comprising at least one of GaN, AlN, InN, InGaN, AlGaN, InAlN, and InAlGaN.

3. The method of claim 1, wherein the selective release layer is included in the substrate and the selective release layer is selected from one or more of silicon oxide, silicon nitride, boron and or phosphorous containing glass, and the selective release layer is removed using an etch chemistry containing HF acid or a fluorine-containing plasma.

4. The method of claim 1, wherein the selective release layer is included in the epitaxially grown layers and the selective release layer is InGaN, and the selective release layer is removed using a photoelectrochemical etch.

5. The method of claim 1, wherein the mechanical handle wafer and the carrier wafer are selected from one or more of sapphire, silicon carbide, aluminum nitride, silicon, gallium arsenide, diamond, gallium nitride, indium phosphide comprising at least one of GaN, SiC, Si, Ge, Al2O3, gallium oxide, poly-crystalline aluminum nitride, poly-crystalline silicon, poly-crystalline silicon carbide, boron nitride, tungsten, molybdenum and quartz.

6. The method of claim 1, wherein each die is characterized by a first pitch between a pair of dice, the first pitch being less than a design width; wherein the transferring each of the plurality of dice to the carrier wafer such that each pair of the transferred dice is configured with a second pitch, the second pitch being larger than the first pitch and corresponding to the design width.

7. The method of claim 1, wherein each die is shaped as a mesa, and each pair of die having the first pitch ranging between 1 μm and 10 μm or between 10 micron and 50 microns wide or between 50 μm and 100 μm with a length of 50 μm to 3000 μm; and the patterning comprising an etching process.

8. The method of claim 1, further comprising processing each of the die to form at least one gallium and nitrogen containing violet, blue, or green emitting laser diode device on each die after the transferring or further comprising forming one or multiple laser diode cavities on each die of epitaxial material.

9. The method of claim 8, wherein each of the laser diode device comprising a pair of facets configured from a cleaving process or an etching process, the etching process being selected from inductively coupled plasma etching, chemical assisted ion beam etching, or reactive ion beam etching.

10. The method of claim 1, wherein the selective etching selectively removes substantially all the selective release layer while leaving intact a portion to provide structure before selectively bonding the one or more die and configured to separate after bonding the one or more die.

11. The method of claim 1, wherein the selective etching selectively removes the selective release layer while leaving an anchor region intact to support the die before the selective bonding of the one or more die, and the anchor region separates after the selective bonding of the one or more die.

12. The method of claim 1 further comprising forming a metal material overlying the one or more die before transferring, while leaving exposed one or more anchor regions, which are configured to selectively break and separate from each of the die after selectively bonding.

13. A method for manufacturing a semiconductor device, the method comprising:

providing a substrate comprising a plurality of crystalline seed regions overlaying a bonding material overlaying a mechanical handle wafer;

controlling the shape, sizes and relative positions of the plurality of crystalline seed regions such that a relative location and width of gaps between the plurality of crystalline seed regions are within a tolerance of less than or equal to 5 millimeters;

forming a gallium and nitrogen containing epitaxial material overlying the plurality of crystalline seed regions, the epitaxial material comprising at least an intrinsic-type or unintentionally doped region overlying the plurality of crystalline seed regions, or at least an n-type region overlying the plurality of crystalline seed regions, or at least a p-type region overlying the plurality of crystalline seed regions, or at least a combination of one or more n-type regions, p-type regions, and unintentionally doped regions overlying the plurality of crystalline seed regions;

providing a selective release layer either as a non-epitaxial material disposed between the handle wafer and the plurality of crystalline seed regions or as a region of the epitaxial material that can be selectively removed relative to surrounding epitaxial layers;

patterning the epitaxial material and forming mesas to form a plurality of dice arranged in an array, each die corresponding to at least one semiconductor device and being arranged by a first pitch between adjacent die in the array;

forming an interface region overlying the epitaxial material, the interface region comprising a metal, a semiconductor, a dielectric, or an oxide;

subjecting the selective release layer to a chemical etch or energy source to fully or partially remove the selective release layer;

bonding the interface region to a carrier wafer to form a bonded structure, while maintaining the selective release layer completely or partially etched away from the bonded structure;

releasing the plurality of dice provided on the substrate to transfer the plurality of dice to the carrier wafer wherein each pair of the transferred dice is configured with a second pitch between each pair of the transferred dice on the carrier wafer, the second pitch being equal or greater than the first pitch; and processing at least one of the plurality of the transferred dice on the carrier wafer to form at least a semiconductor device.

14. The method of claim 13, wherein the plurality of crystalline seed regions are each single crystalline films with a polar, non-polar, or semi-polar plane orientation and comprise at least one of GaN, AlN, InN, InGaN, AlGaN, InAlN, and InAlGaN.

15. The method of claim 13, wherein the selective release layer is included in the substrate and the selective release layer is selected from one or more of silicon oxide, silicon nitride, boron and or phosphorous containing glass, and the selective release layer is removed using an etch chemistry containing HF acid or a fluorine-containing plasma.

16. The method of claim 13, wherein the selective release layer is included in the epitaxially grown layers and the selective release layer is InGaN, and the selective release layer is removed using a photoelectrochemical etch.

17. The method of claim 13, wherein the mechanical handle wafer and the carrier wafer materials are selected from one or more of sapphire, silicon carbide, aluminum nitride, silicon, gallium arsenide, diamond, gallium nitride, indium phosphide, poly-crystalline aluminum nitride, poly-crystalline silicon, poly-crystalline silicon carbide, boron nitride, tungsten, molybdenum and quartz.

18. The method of claim 13, wherein the epitaxial material is patterned with a masking material and one or more plasma or ion-based etches containing one or more of chlorine, argon, and fluorine are used to etch one or more edges of the plurality of crystalline seed regions and the material between the plurality of crystalline seed regions.

19. The method of claim 13, wherein one or more edges of the plurality of crystalline seed regions and the material between the plurality of crystalline seed regions are removed or reduced in height using one or more of a laser scribing process and a sawing process.

20. The method of claim 13, wherein each of the plurality of crystalline seed regions are less than 4 square centimeters in area.

21. The method of claim 13, further comprising processing each of the die to form at least one gallium and nitrogen containing violet, blue, or green emitting laser diode device on each die after the transferring or further comprising forming one or multiple laser diode cavities on each die of epitaxial material.

22. A method for manufacturing a semiconductor device, the method comprising:
   providing a substrate comprising a plurality of crystalline seed regions overlaying a bonding material overlaying a mechanical handle wafer, wherein the plurality of crystalline seed regions are each single crystalline films with a non-polar or semi-polar plane orientation and comprise at least one of GaN, AlN, InN, InGaN, AlGaN, InAlN, and InAlGaN;
   controlling the shape, sizes and relative positions of the plurality of crystalline seed regions such that a relative location and width of gaps between the plurality of crystalline seed regions are within a tolerance of less than or equal to 5 millimeters;
   forming a gallium and nitrogen containing epitaxial material overlying the plurality of crystalline seed regions, the epitaxial material comprising at least an intrinsic-type or unintentionally doped region overlying the plurality of crystalline seed regions, or at least an n-type region overlying the plurality of crystalline seed regions, or at least a p-type region overlying the plurality of crystalline seed regions, or at least a combination of one or more n-type regions, p-type regions, and unintentionally doped regions overlying the plurality of crystalline seed regions; and
   processing the epitaxial material into a plurality of dice to form at least one gallium and nitrogen containing violet, blue, or green emitting laser diode device on each die or further comprising forming one or multiple laser diode cavities on each die.

23. A method for manufacturing a semiconductor device, the method comprising:
   providing a substrate comprising a plurality of crystalline seed regions overlaying a bonding material overlaying a mechanical handle wafer, wherein the plurality of crystalline seed regions are each single crystalline films with a non-polar or semi-polar plane orientation and comprise at least one of GaN, AlN, InN, InGaN, AlGaN, InAlN, and InAlGaN, and each of the plurality of crystalline seed regions characterized by an area equal to or less than 5 centimeters squared;
   controlling the shape, sizes and relative positions of the plurality of crystalline seed regions such that a relative location and width of gaps between the plurality of crystalline seed regions are within a tolerance of less than or equal to 5 millimeters;
   forming a gallium and nitrogen containing epitaxial material overlying the plurality of crystalline seed regions, the epitaxial material comprising at least an n-type gallium and nitrogen containing cladding region, a multiple quantum well active region, and a p-type gallium and nitrogen containing cladding region; and
   processing the epitaxial material to form a plurality of gallium and nitrogen containing violet, blue, or green emitting laser diode devices.

* * * * *